United States Patent [19]

Kaneda et al.

[11] Patent Number: 5,031,821
[45] Date of Patent: Jul. 16, 1991

[54] SEMICONDUCTOR INTEGRATED CIRCUIT DEVICE, METHOD FOR PRODUCING OR ASSEMBLING SAME, AND PRODUCING OR ASSEMBLING APPARATUS FOR USE IN THE METHOD

[75] Inventors: Tsuyoshi Kaneda, Tokyo; Susumu Okikawa, Ohme; Hiroshi Mikino, Tachikawa; Hiroshi Watanabe, Higashimurayama; Toshihiro Satou, Machida; Atsushi Onodera, Iruma; Michio Tanimoto, Kokubunji, all of Japan

[73] Assignees: Hitachi, Ltd.; Hitachi Microcomputer Engineering Ltd.; Hitachi Tokyo Electronics Co., Ltd., all of Tokyo, Japan

[21] Appl. No.: 395,088

[22] Filed: Aug. 16, 1989

[30] Foreign Application Priority Data

| Aug. 19, 1988 | [JP] | Japan | 63-205925 |
| Oct. 21, 1988 | [JP] | Japan | 63-265526 |
| Apr. 18, 1989 | [JP] | Japan | 1-98549 |
| Jun. 16, 1989 | [JP] | Japan | 1-152360 |

[51] Int. Cl.$^5$ ............ H01L 21/607; B23K 20/10
[52] U.S. Cl. ............ 228/110; 228/111; 228/219; 228/179
[58] Field of Search ........... 228/110, 111, 219, 1.1, 228/4.5, 42, 179; 219/56.21, 56.22, 85.18; 29/841, 856

[56] References Cited

U.S. PATENT DOCUMENTS

| 3,912,900 | 10/1975 | Arnett | 219/56.22 |
| 4,040,885 | 8/1977 | Hight et al. | 228/1.1 |
| 4,564,734 | 1/1986 | Okikawa | 219/56.22 |
| 4,580,713 | 4/1986 | Sekibata et al. | 228/110 |
| 4,597,522 | 7/1986 | Kobayashi | 219/56.22 |

FOREIGN PATENT DOCUMENTS

| 0276928 | 8/1988 | European Pat. Off. | 228/4.5 |
| 0286031 | 10/1988 | European Pat. Off. | 228/110 |
| 56425 | 3/1968 | Japan | 228/4.5 |
| 116877 | 9/1979 | Japan | 228/4.5 |
| 21134 | 2/1980 | Japan | 228/4.5 |
| 94757 | 7/1981 | Japan | 228/4.5 |
| 88742 | 6/1982 | Japan | 228/4.5 |
| 158637 | 8/1985 | Japan | 228/4.5 |
| 242629 | 12/1985 | Japan | 228/4.5 |
| 244034 | 12/1985 | Japan | 228/4.5 |
| 78131 | 4/1986 | Japan | 228/4.5 |
| 101043 | 5/1986 | Japan | 228/4.5 |
| 214530 | 9/1986 | Japan | 228/4.5 |
| 16537 | 1/1987 | Japan | 228/4.5 |
| 252435 | 10/1988 | Japan | 228/4.5 |
| 289825 | 11/1988 | Japan | 228/4.5 |
| 95528 | 4/1989 | Japan | 228/4.5 |
| 2086297 | 5/1982 | United Kingdom | 219/56.21 |

*Primary Examiner*—Sam Heinrich
*Attorney, Agent, or Firm*—Antonelli, Terry, Stout & Kraus

[57] ABSTRACT

The present invention is characterized in that, in a ball wedge bonding using a fine bonding wire precoated with a thin insulating layer, ultrasonic vibration is applied to a capillary to effect the delivery of the wire smoothly during movement of the capillary to a second bonding point while delivering the wire after ball bonding at a first bonding point.

19 Claims, 40 Drawing Sheets

SEMICONDUCTOR INTEGRATED CIRCUIT DEVICE, METHOD FOR PRODUCING OR ASSEMBLING SAME, AND PRODUCING OR ASSEMBLING APPARATUS FOR USE IN THE METHOD

BACKGROUND OF THE INVENTION

The present invention relates to a technique useful in the application to assembling of a semiconductor device having a high integrated and high function type semiconductor chip, particularly to a wire bonding process for making an inter-electrode connection.

This kind of technique is described, for example, in "Electronic Material Separate Volume, VLSI Producing/Testing Apparatus Guide Book," published by Kabushiki Kaisha KOGYO CHOSAKAI (Nov. 18, 1987), pp. 123–129.

In the above literature, bonding methods are classified and there are explained recent and future technical trends on wire bonding.

More particularly, in the semiconductor device assembling process there is generally adopted a so-called wire bonding technique wherein an electroconductive wire is stretched for electric conduction between an external terminal (electrode pad) of a semiconductor chip and an inner lead of a lead frame.

As described also in the above literature, in compliance with the demand for increase in memory capacity of a memory element there has been made promotion of high integration and multi-functioning in microcomputer and logic products. At the same time there is now a tendency to narrow the spacing of external terminals on a semiconductor chip and the pitch of the front ends of inner leads. Also, the wire pitch for bonding tends to become narrower. Where wire bonding is performed under such circumstances, bonding defects are apt to occur, such as short-circuiting of wires with each other (wire short-circuit), or short-circuiting of wire with a semiconductor chip or tab (chip short-circuit or tab short-circuit).

Further, when wire is reduced in diameter to cope with the above circumstances, the wire after bonding is no longer strong enough to maintain its loop shape, resulting in permanent strain of the wire, which causes the aforementioned short-circuits.

In view of the above problems there has been proposed a so-called coated wire comprising an electroconductive wire such as, for example, a gold (Au), aluminum (Al) or copper (Cu) wire and an insulating resin coated over the wire.

The following is a brief explanation about a wire bonding method using the above coated wire.

First, a coated wire drawn out from the front end of a bonding tool is subjected to a high-voltage discharge action to melt and remove the coating material at the wire front end and thereabouts, then the wire front end now in an exposed condition is melt-formed into a spherical shape and this spherical portion is pressed to an external terminal of a semiconductor chip under the application thereto of ultrasonic vibration. In this way a first bonding is performed.

Then, while the coated wire is drawn out from the front end of the bonding tool, the other end side of the coated wire is brought into contact with a predetermined position of an inner lead so that the coated wire describes a loop, and ultrasonic vibration is applied again to the bonding tool to destroy and remove the portion of the coating in contact with the surface of the inner lead by virtue of the ultrasonic energy, whereby both exposing and bonding of the wire are effected at a time.

BRIEF SUMMARY OF THE INVENTION

As a result of studies made by the present inventors it turned out that the above-mentioned wire bonding technique using a coated wire wa difficult to be practically applied because of the following problems remaining to be solved.

Firstly, according to the wire bonding technique using a coated wire, the coating portion around the wire in the section from a wire spool to the bonding tool bears static electricity, resulting in that the coated wire in question is attracted to mechanical portions of the wire bonding apparatus such as an air back tensioner, a sprocket and a clamper and so an extra resisting force is exerted on the bonding tool during downward movement of the same tool. Consequently, when the wire is stretched in the form of a loop while being drawn out from the end of the bonding tool, there occurs breaking of the wire or trouble in the loop shape. Moreover, since the wire is inserted into the bonding tool in a curlwise deformed state due to the above attraction, there occurs trouble in the loop shape of the stretched wire, which is very likely to cause a defective bonded condition of the wire. Further, there has been the danger of electrostatic breakdown of the semiconductor chip due to contact of the electrically charged wire with the pad of the semiconductor chip.

Secondly, small pieces of coating or foreign matters such as dust are attracted to the circumference of the coated wire due to electric charging of the wire, and it turned out that when in this state the wire was inserted into the bonding tool, there occurred clogging of the bonding tool, thus making it difficult for the wire to be drawn out or causing breaking of the wire.

Thirdly, it also turned out that even when the wire was not charged electrically, if the surface of a clamper for clamping the wire was electrically charged, there occurred the same phenomenon as that mentioned in connection with the above first problem. More particularly, since the wire is attracted to the electrically-charged clamper surface, an extra resisting force is exerted on the bonding tool during downward movement of the same tool, resulting in that when the wire is stretched while being drawn out from the front end of the bonding tool, there occurs breaking of the wire or loop trouble. Further, since the wire remains deformed curl-like due to the foregoing attraction when it is inserted into the bonding tool, there occurs trouble in the loop shape of the stretched wire, and thus it is very likely that the bonded state of the wire will be defective.

Because there still remain the above-mentioned problems, it is in effect difficult to effect connection using a coated wire, thus making it difficult to realize a highly integrated high function type semiconductor device.

It has been confirmed by the present inventors that the above first and second problems are peculiar to a coated wire, but the above third problem occurs with respect to not only a coated wire but also an ordinary uncoated wire.

It has also been made clear by the present inventors that in the foregoing technique using a coated wire the following problems remain to be solved.

In case of using a coated wire, how to remove the coating is important in deciding whether bonding is good or not. More particularly, according to the above prior art, the removal of coating in the second bonding is performed almost simultaneously with the bonding to the inside wire by the application of ultrasonic vibration to the bonding tool. In such technique, however, the destruction and removal of the coating are incomplete in many cases, so the remaining coating pieces causes deterioration of the bonding strength between the wire and the inner lead surface, resulting in increase of the contact resistance, and in the worst case it has been likely that there will occur a defect of the product such as breaking of the wire during resin molding.

In the foregoing prior art, moreover, in order to effect a more complete removal of the coating it is necessary to continue the application of ultrasonic vibration for a long time for the bonding tool on the inner lead surface, resulting in deterioration of the bonding efficiency.

According to a further study made by the present inventors it turned out that the ultrasonic energy to be used mainly for bonding did not always contribute to the improvement of the coating removal efficiency.

The present invention has been accomplished in view of the problems mentioned above and it is the first object thereof to prevent electrification of a coated wire in wire bonding using the coated wire.

It is the second object of the present invention to prevent electrification of various mechanisms of the apparatus which comes into contact with wire and realize a highly reliable semiconductor device assembling process.

It is the third object of the present invention to improve the reliability of bonding using a coated wire.

It is the fourth object of the present invention to improve the wire bonding efficiency.

It is the fifth object of the present invention to establish a wire bonding technique using a coated wire and thereby realize a highly integrated, high function type semiconductor device.

It is the sixth object of the present invention to provide a technique capable of enhancing the reliability of the second bonding in wire bonding using a coated wire.

It is the seventh object of the present invention to provide a resin sealed IC of high reliability.

It is the eight object of the present invention to provide a wire bonding technique using a coated wire free of pin holes or flaws caused by undesired discharge.

It is the ninth object of the present invention to improve the accuracy of wire bonding using a lead frame of a very large number of leads.

It is the tenth object of the present invention to improve the ultrasonic wave application efficiency in bonding.

It is the eleventh object of the present invention to facilitate controlling the wire loop shape.

The following is a brief summary of typical inventions disclosed herein.

Firstly, ultrasonic vibration is applied continuously to a bonding tool from which a coated wire is drawn out, during the period from the time when one end of the coated wire is bonded in an exposed condition to one electrode until when the other end of the coated wire is bonded to the other electrode.

Secondly, in a certain position of the path of a coated wire extending from a wire spool to a bonding tool, the coated wire is deelectrified at least once.

Thirdly, by spraying a deelectrifying fluid to a coated wire, both the application of tension to the coated wire and the deelectrification of the coated wire surface are effected simultaneously.

Fourthly, bonding is performed while spraying a deelectrifying fluid to the clamper chip surface of a clamper which holds a coated wire from a side face thereof.

Fifthly, in bonding the pad of a semiconductor chip formed with a microprocessor or a logic circuit with an internal electrode of a package, first a coated wire fed from a wire spool is inserted into a bonding tool while deelectrifying the coated wire, and the bonding tool bonds one end of the coated wire, at which one end the wire has been exposed by a coating removing means, to the pad while ultrasonic vibration is applied to the pad, then in a continued state of the said ultrasonic vibration the coated wire is stretched in a loop form while being drawn out from the bonding tool and brought into contact with and bonded to the surface of the internal electrode at the other end of the coated wire in an exposed state by the ultrasonic vibration being continued. Thereafter, the stretched area of the coated wire is sealed with resin to form a package.

Sixthly, on the path from a wire spool to a bonding tool there is disposed an air back tensioner having guide plates which define a wire passage of a predetermined certain spacing and also having a blow-off port. A deelectrifying fluid is fed to the wire passage from the blow-off port.

Seventhly, there is used an assembling apparatus provided with a deelectrifying means for the chip surface of a clamper.

Eighthly, there is used an assembling apparatus wherein the contacting portion with wire in the path from a wire spool to a bonding tool is formed by an electroconductive material connected to ground.

According to the above first means, by continuing the application of ultrasonic vibration to the bonding tool during wire bonding of both electrodes it becomes possible to remove any foreign matter in the bonding tool by the said ultrasonic vibration, whereby the clogging of the bonding tool can be prevented effectively. Further, by continuing the application of the ultrasonic vibration to the bonding tool, the deflection of the wire is prevented in the through hole of the bonding tool, so it is possible to prevent the occurrence of a curled state of the wire in the said through hole.

According to the above second to the fourth means, it becomes possible to ensure deelectrification of the coated wire, so it is possible to effectively prevent troubles caused by electrification of the coated wire such as loop trouble, wire breaking and clogging of the bonding tool.

According to the fifth means, it becomes possible to effect a complicated connection such as cross bonding using the coated wire, so it is possible to realize a highly integrated type or high function type semiconductor device, such as a microprocessor element or logical element.

According to the above sixth means, both the application of back tension to the wire and the deelectrification of the wire surface can be done simultaneously by using a deelectrifying fluid as the feed fluid in the air back tensioner. Thus, the wire can be prevented from being electrically charged without making the apparatus structure complicated.

According to the above seventh means, by deelectrifying the clamper chip surface it is possible to prevent the wire attraction caused by the electrification on the assembling apparatus side regardless of whether the wire is a coated wire or an uncoated wire, so wire loop trouble or breaking and the clogging of the bonding tool can be prevented effectively.

According to the above eighth means, by forming the contacting portion with wire using an electroconductive material connected to ground, it is possible to not only prevent the wire from being charged electrically but also ensure deelectrification of electrically-charged wire. Consequently, it is possible to effectively prevent wire loop trouble or breaking and the clogging of the bonding tool which are attributable to electrification either on the assembling apparatus side or on the wire side.

The following is a further brief summary of typical inventions disclosed herein.

Firstly, one end of a coated wire drawn out from the front end of a bonding tool is partially removed by heating to expose wire, then the thus-exposed one wire end is bonded to a first electrode under application of a first ultrasonic vibration to the bonding tool, then the coated wire is delivered from the front end of the bonding tool and stretched in the form of a loop, thereafter the other end of the coated wire is partially destroyed and removed under application of a second ultrasonic vibration at the surface of a second electrode, and the other wire end thus exposed is bonded to the second electrode by the application of a third ultrasonic vibration.

Secondly, in making connection between first and second electrodes using a coated wire, an uneven surface is formed in the vicinity of either the first or the second electrode, then the coating of the coated wire is partially destroyed and removed by the application of ultrasonic vibration on the said uneven surface, and thereafter the wire portion thus exposed is bonded to either the first or the second electrode.

Thirdly, there is provided a wire bonding apparatus provided with means for applying ultrasonic vibration to a bonding tool from which wire has been drawn out and also provided with an ultrasonic vibration control means which applies ultrasonic vibration of low energy to the bonding tool and then switches over to the application of a high energy ultrasonic vibration.

Fourthly, there is provided a semiconductor device wherein an electrode formed on a semiconductor chip and an inner end electrode constituting a part of a lead are connected together by a coated wire comprising wire and an insulating resin coating formed on the circumference of the wire, the lead surface being constituted by an uneven surface at least in the vicinity of the said inner end electrode.

According to the above first means, by making at least the second and the third ultrasonic vibration variable, there can be selected optimum conditions for the application of ultrasonic vibration such as ultrasonic energy or ultrasonic frequency to let the second ultrasonic vibration serve to destroy and remove the coating and the third ultrasonic vibration serve to effect bonding between wire and the second electrode surface, whereby it becomes possible to ensure the removal of the coating, so that the bonding strength between the wire and the second electrode surface is improved and the bonding reliability can be enhanced.

According to the above second means, by forming an uneven surface near the first or the second electrode it is possible to increase the destruction of the coating, and efficiency of removing the coating by the application of ultrasonic vibration, whereby not only the bonding work efficiency can be improved but also the removal of the coating is further ensured, thus leading to enhanced reliability of bonding.

According to the above third means by switching over between high and low energy level there can be obtained optimum conditions for the application of ultrasonic vibration in both the destroying and removal of the coating and the ultrasonic bonding, whereby the bonding reliability can be enhanced like the above first means.

According to the above fourth means, by forming the lead surface near the inner end electrode in the shape of an uneven surface there can be attained high bonding reliability using a coated wire, so it becomes substantially possible to realize a semiconductor device using a coated wire, whereby there can be provided a highly integrated, high function type semiconductor device of high reliability making the most of the advantages of a coated wire.

DETAILED DESCRIPTION OF THE INVENTION

Embodiments of the present invention will be described below in a suitably sectioned manner, which embodiments are not independent of one another, but correspond to one another partially or as modifications. Therefore, even where steps or components are replaced with those of other embodiments, it is a working example of the present invention of course. For example, bonding of leads using a diamond electrodeposited pressing member in the embodiment-5 is applicable to all the other embodiments.

(1) Embodiment 1

An embodiment 1-I of the present invention will be described hereinunder with reference to FIGS. 1 to 31.

Figure 3:
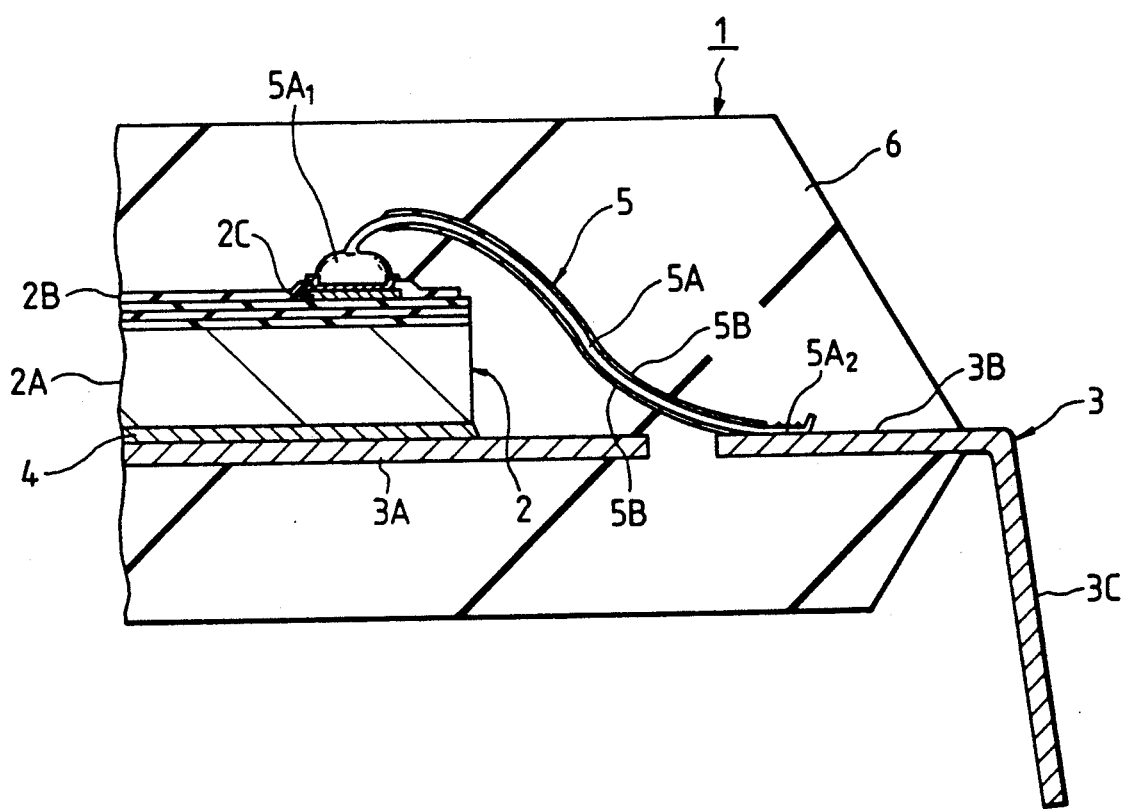
FIG. 3 is a half-sectional view of a resin-sealed semiconductor device obtained by the above embodiment.

A resin-sealed type semiconductor device assembled according to this embodiment is as shown in FIG. 3. A semiconductor chip 2 thereof includes semiconductor integrated circuit elements such as memory, gate array, microprocessor and MOS logic.

The semiconductor chip 2 has a substrate 2A formed of silicon (Si) for example, a passivation film 2B on top of the substrate, and an external terminal 2C (bonding pad) exposed from an opening of the passivation film 2B. The semiconductor chip 2 is bonded to a tab 3A of a lead 3 through a bonding material 4, e.g. silver (Ag) paste.

On the other hand, the external terminal 2C of the semiconductor chip 2 is connected to an inner lead 3B of the lead 3 electrically using an electroconductive wire, which is a coated wire 5 in this embodiment. The coated wire 5 comprises a wire 5A and an insulating coating 5B formed over the surface of the wire 5A.

As the material of the wire 5A of the coated wire 5 there may be used, for example, gold (Au), copper (Cu) or aluminum (Al).

The coating 5B of the coated wire 5 is formed by a heat-resistant polyurethane prepared by the reaction of a polyol component and an isocyanate and containing in its molecular skeleton a constituent unit derived from terephthalic acid.

Regarding the constituent material of the coating 5B, the present inventors have conducted an experiment for a resin-sealed type semiconductor device after sealing. The results of the experiment will be shown below as Run No. 1, in which parts indicate parts by weight.

Run No. 1

Such materials as shown in Table 1 (at the end of the specification) were mixed together in the respective proportions set forth in the same table, then the resulting mixture was placed in a 500 cc flask, to which were attached a thermometer and a vapor condenser, and reaction was allowed to take place to obtain three kinds of terephthalic polyols P-1, P-2 and P-3. The terephthalic acid - ethylene glycol ratio, reaction time, etc. are also set out in Table 1. An end point of the above synthesis reaction was determined on the basis of theoretical reaction water and an acid value not larger than 5. A reduced-pressure reaction was performed where required.

The three kinds of terephthalic polyols P-1, P-2 and P-3 prepared in the above manner and a commercially available polyol were each mixed with an isocyanate component in such proportions as shown in Table 2 to prepare coating compositions. The coating compositions thus prepared were diluted to a concentration of 10% using a solvent and each applied twice or more to the outer peripheral surface of a wire body, followed by heating at 175° C. for 21 minutes and after-cure at 170° C. for 2 hours, to obtain coated wires each having an insulating coating of a heat-resistant polyurethane. Compositions and coating characteristics are as set forth in Table 2 (at the end of the specification).

Figure 13:
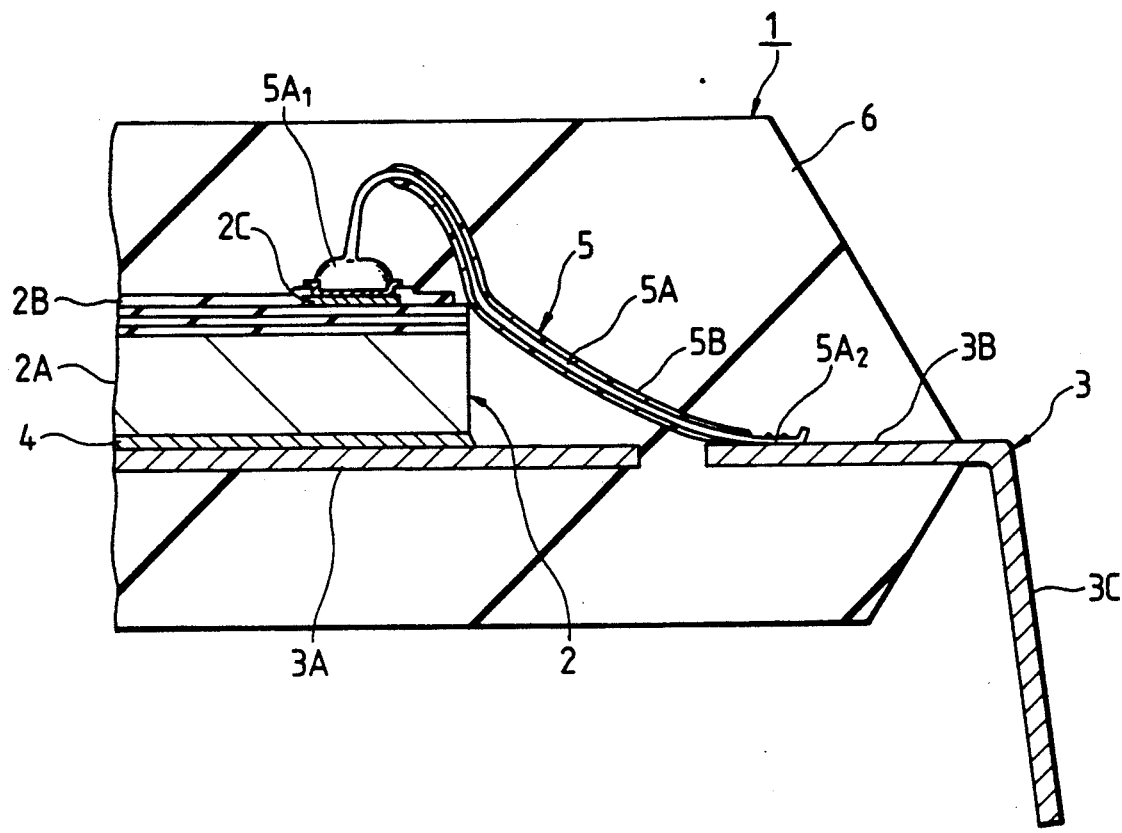
FIG. 13 is a partially sectional view showing a chip touch state of a coated wire in the embodiment 1-I.
Figure 15:
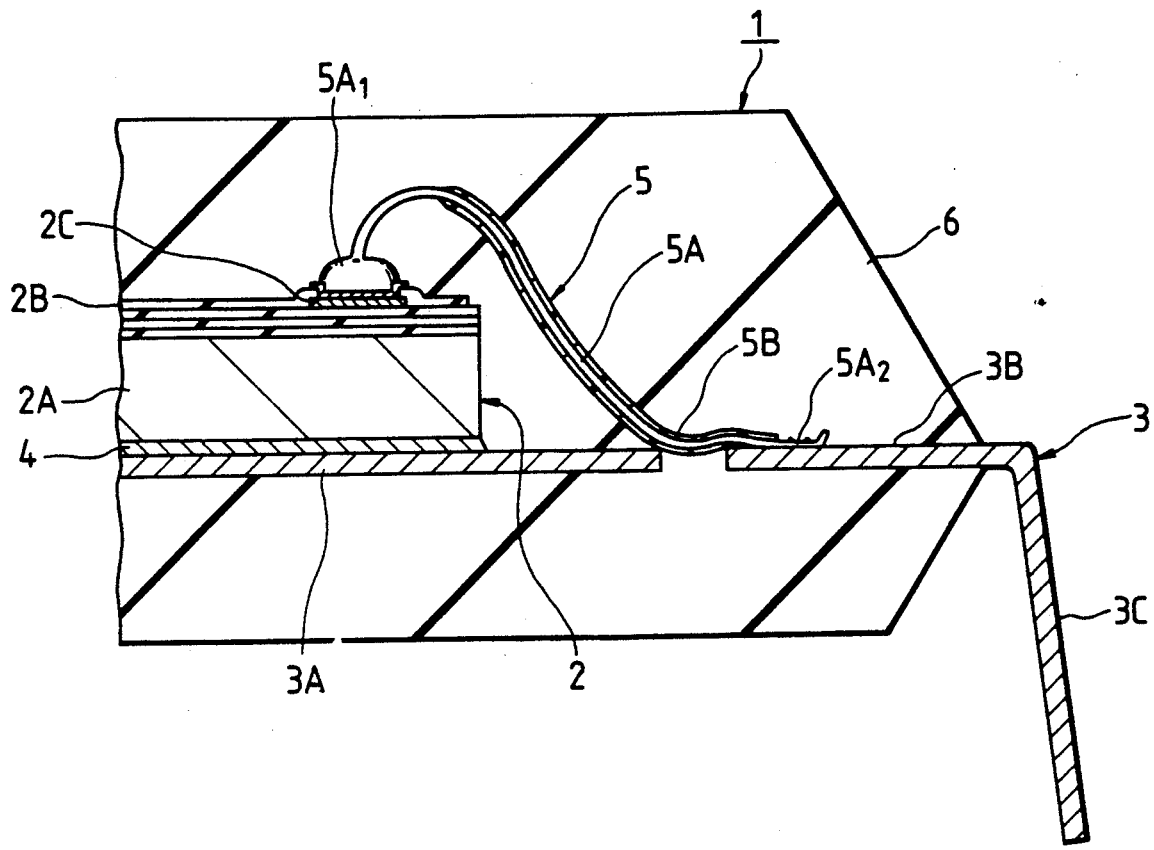
FIG. 15 is a partially sectional view showing a tab touch state of the coated wire.

Semiconductor chips 2 wire-bonded using the heat-resistant polyurethane-coated wires obtained as above were molded using a resin material 6 to fabricate semiconductor devices in touched states corresponding to those shown in FIG. 13 (chip touch state) and FIG. 15 (tab touch state). Then, a temperature cycle test was conducted according to MIL-883B and there was made comparison in short-circuit rate with the semiconductor device using the commercial polyurethane-coated wire to check to what extent the coated wires in this embodiment were improved.

Figure 17:
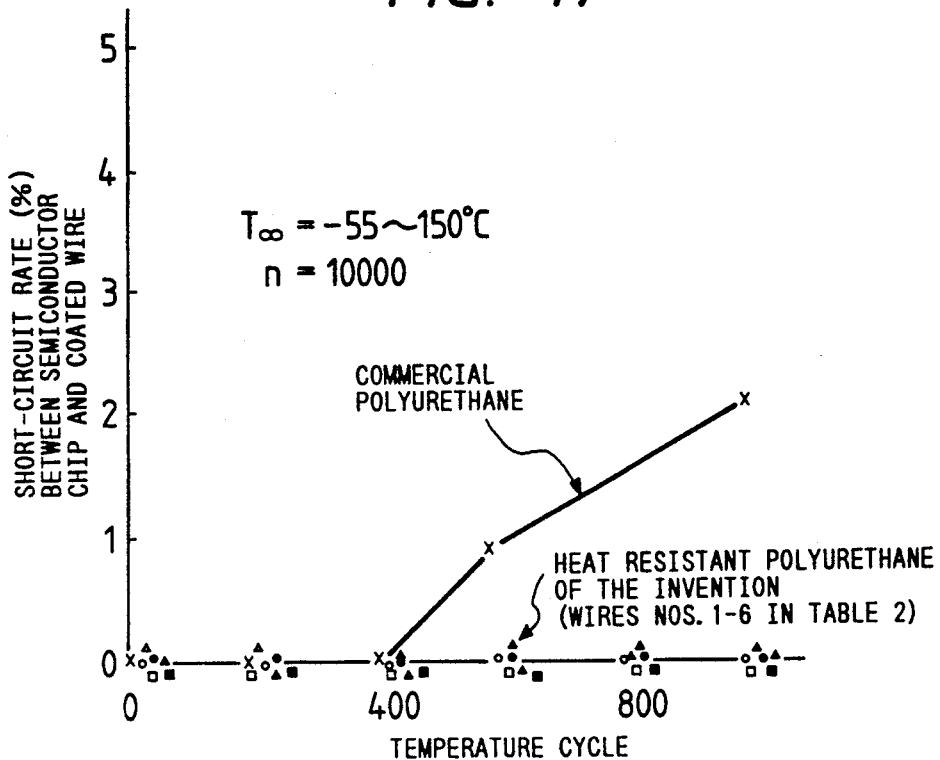
FIG. 17 is a graph showing a temperature cycle vs a short-circuit rate between a semiconductor chip and a coated wire in the embodiment 1-I.
Figure 18:
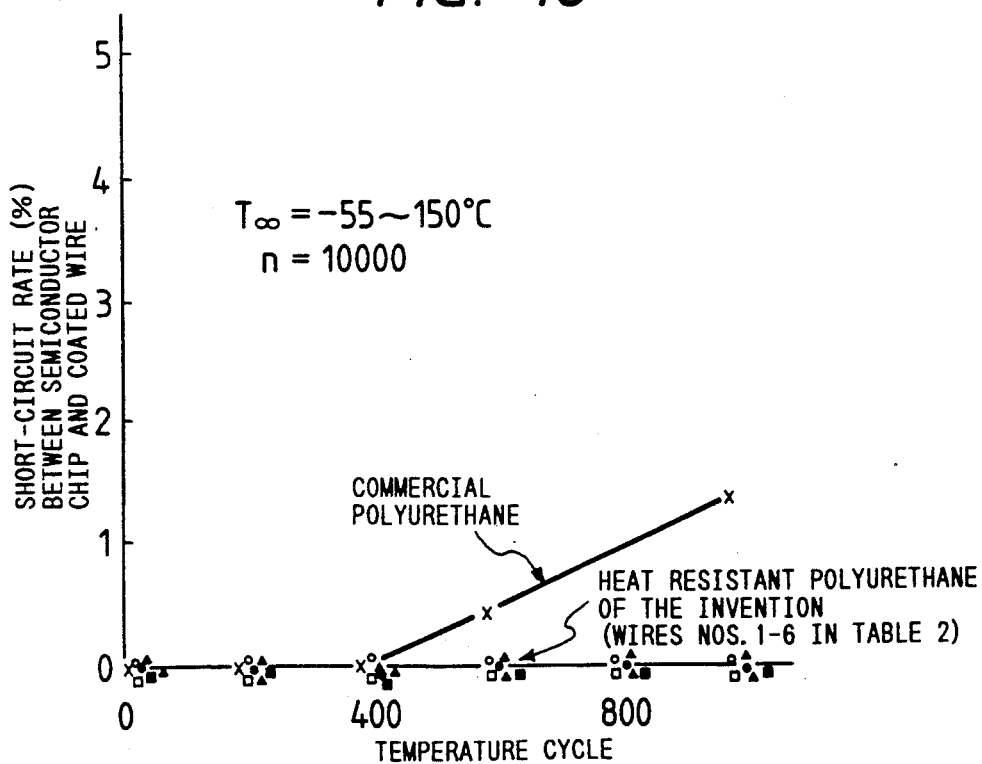
FIG. 18 is also a graph showing a temperature cycle vs a short-circuit rate between a tab and a coated wire in the embodiment 1-I.

The results of this comparative experiment are as shown in FIGS. 17 and 18. FIG. 17 shows short-circuit rates between the semiconductor chips and the coated wires in such a chip touch state as shown in FIG. 13. As is apparent from the same figure, the semiconductor devices using the heat-resistant polyurethane-coated wires according to this embodiment exhibited an outstanding short-circuit or chip short-circuit preventing effect as compared with the semiconductor device using the commercial polyurethane-coated wire.

FIG. 18 shows short-circuit rates between tabs and the coated wires. Also in this case it was confirmed that the semiconductor devices using the heat-resistant polyurethane-coated wires in this embodiment exhibited an outstanding short-circuit or tab short-circuit preventing effect The present inventors further conducted comparative experiments using the above heat-resistant polyurethane-coated wires and commercial polyurethane-coated wire in the wire state before resin sealing under the later-described conditions, to check the coatings for abrasion strength and degradation rate. The results of these experiments as well as the results of various other experiments will be described below as Run Nos. 2 to 5 in connection with FIGS. 19 to 25.

Run No. 2

Figure 19:
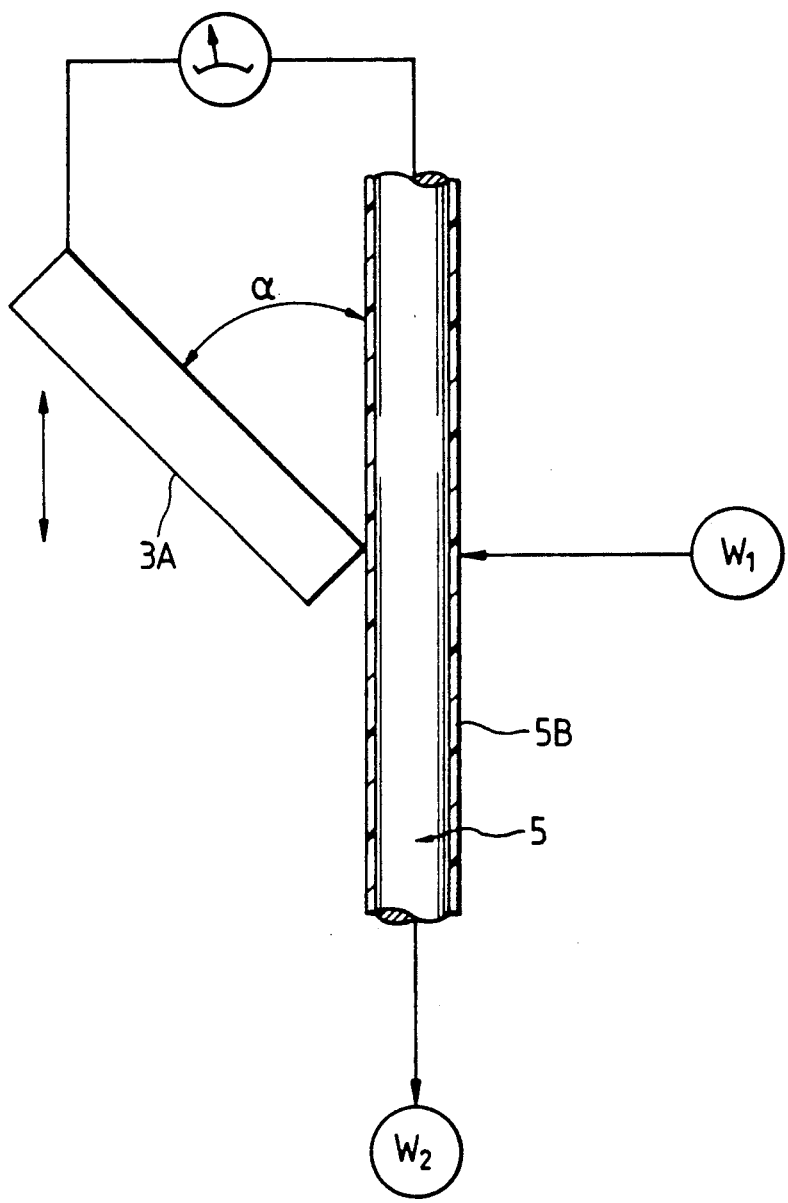
FIG. 19 is a model diagram showing experimental conditions for use in evaluating the coating of the coated wire used in the embodiment 1-I.

There were adopted such experimental conditions as shown in the model diagram of FIG. 19. As shown therein, a certain load (1 g) is suspended vertically from the lower end of a coated wire 5 whose outer surface is coated with an insulating coating (a heat-resistant polyurethane in this embodiment or a commercially available polyurethane) 5B, and a tab 3A of a lead frame is brought into contact at an edge thereof with the coated wire 5 at a contact angle $\alpha=45°$. Further, an urging force is exerted on the coated wire 5 at a load of $W_1$ (0.65 g) horizontally from the side opposite to the above tab edge contact portion and the tab 3A is oscillated 20 $\mu$m in vertical directions. In this way the coating 5B was evaluated for abrasion, etc.

The number of times of amplitudes (oscillations), Nf, until the coating 5B was worn and destroyed was defined as abrasion strength and evaluated.

The heat resistance of the coating 5B was evaluated by measuring Nf after standing at a high temperature (150°-200° C. for 0-1,000 hours).

As a result, it turned out that in case of polyurethane, by imidizing it, heat deterioration could be suppressed to a great extent and the life in temperature cycle, T ∞ could be greatly improved.

These experimental results will be described below more concretely.

Figure 20:
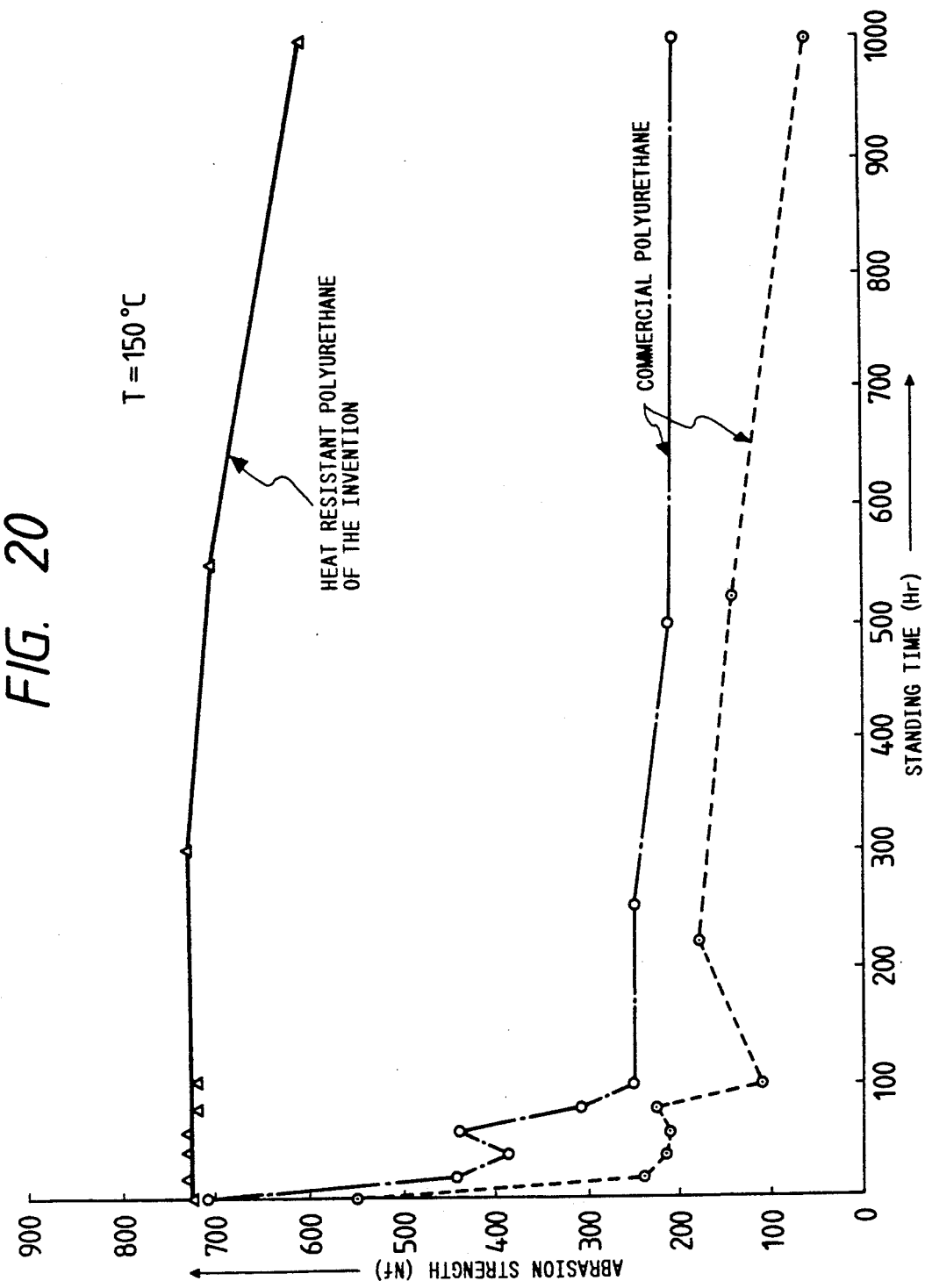
FIGS. 20 and 21 are explanatory views showing the results of comparative experiments on the abrasion strength of coatings in the embodiment 1-I.
Figure 21:
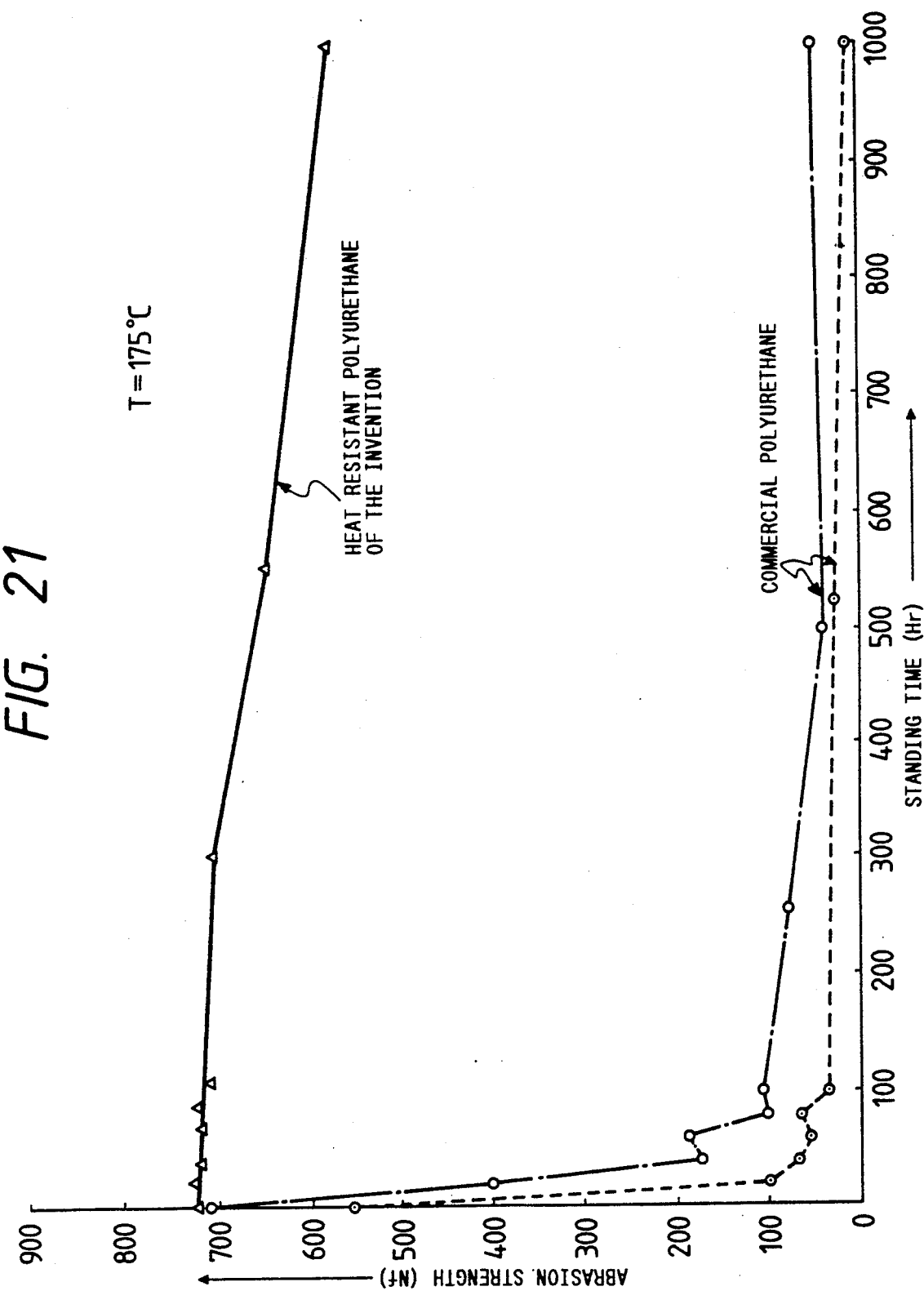

FIGS. 20 and 21 show heat deterioration of abrasion strength (reduction in the number of times of coating destruction after 100 hours) of the coating 5B at temperatures 150° C. and 175° C., respectively. Reference to these figures clearly shows that in case of the coating using the heat resistant polyurethane, of the present invention, the lowering in abrasion strength Nf is small even with the lapse of the standing time at high temperatures, and that there is little deterioration of the coating. Particularly, it turned out that the degradation rate within 20% at the reduction of the number of times of coating destruction after 100 hours at 150°-175° C. was very advantageous to the coated wires.

Run No. 3

Figure 22:
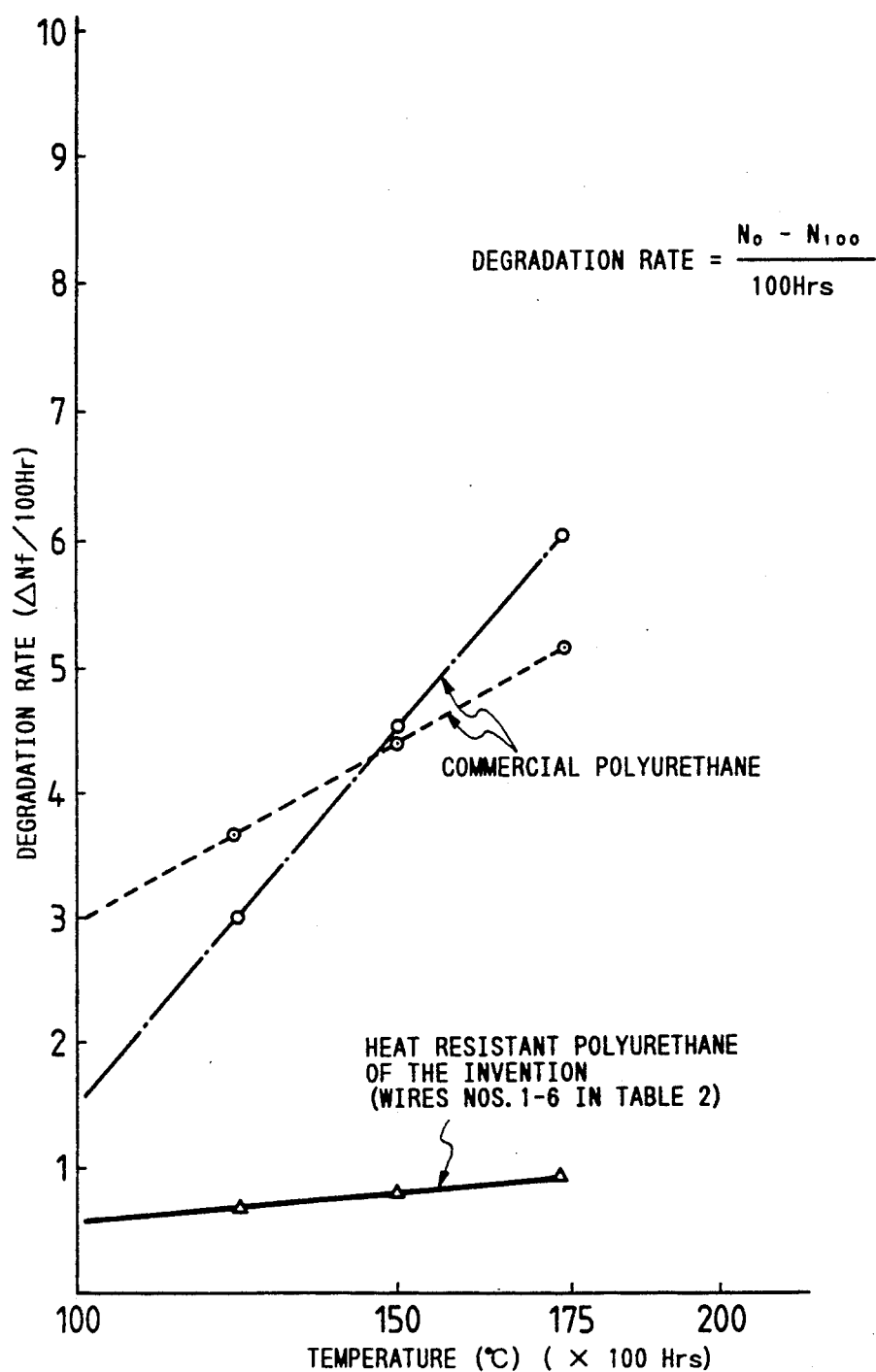
FIG. 22 is an explanatory view showing experimental results on the relation between changes in temperature and degradation rate with respect to the coated wires described in connection with the embodiment 1-I.

FIG. 22 shows the results of an experiment on the relation between temperature (axis of abscissa) and degradation rate [$\Delta Nf/100$ Hrs] ($=N_0-N_{100}/100$ Hrs) (axis of ordinate). Also from this figure it is seen that the heat-resistant polyurethane-coated wires of the present invention are very low in degradation rate as compared with commercial polyurethane-coated wires.

Run No. 4

Figure 23:
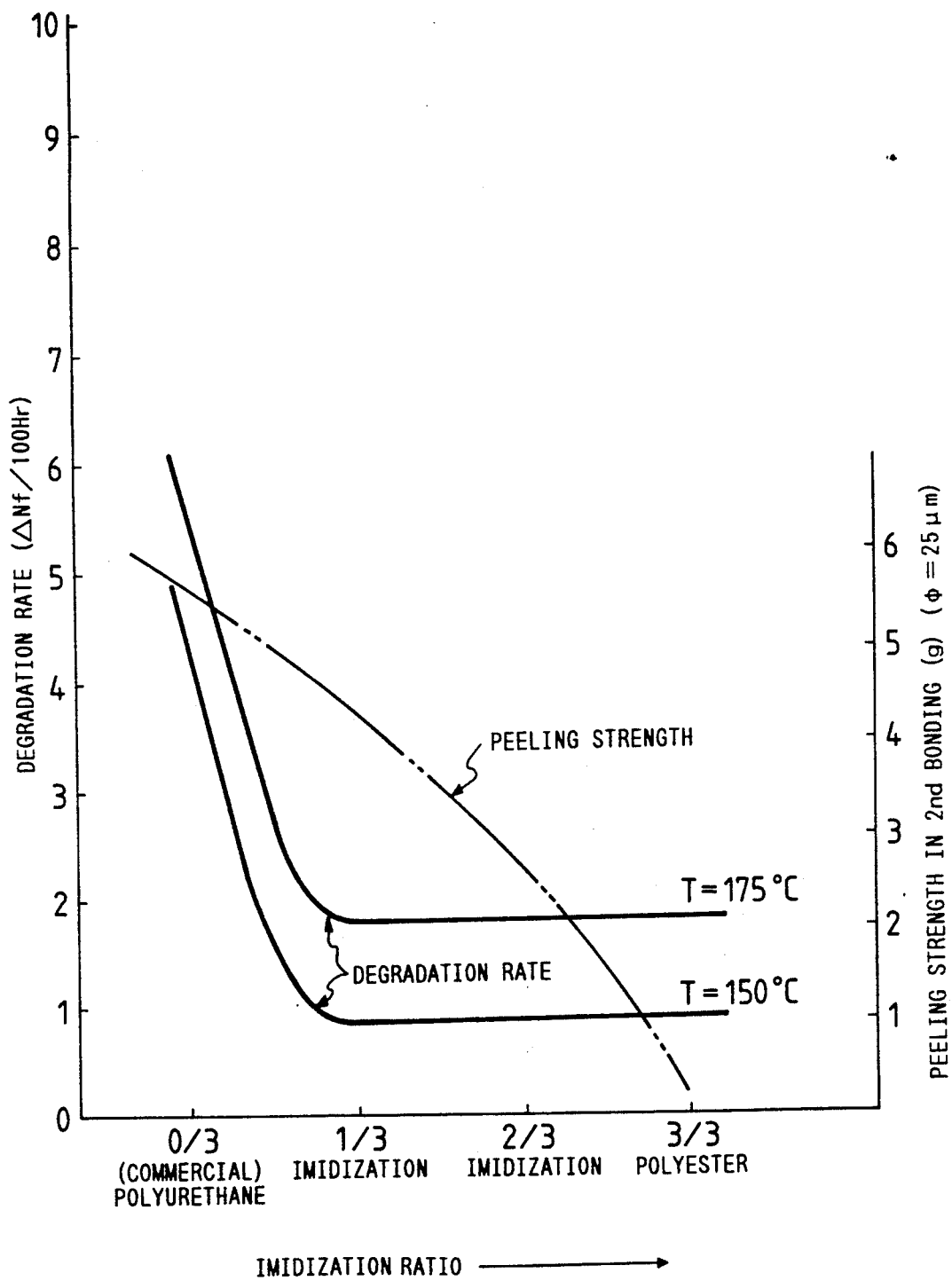
FIG. 23 is an explanatory view showing experimental results on the relation between imidization ratio of coatings (plotted along the axis of abscissa) and degradation rate (plotted along the left-hand axis of ordinate) as well as peeling strength in the second bonding of coated wires (the right-hand axis of ordinate)

FIG. 23 shows the results of an experiment on the relation between the imidization ratio of coating (axis of abscissa) and degradation rate (left-hand axis of ordinate) as well as peeling strength in the second bonding of coated wire (right-hand axis of ordinate).

The results on the peeling strength in the second bonding are of an experiment conducted by the present inventors using heat-resistant polyurethane-coated wires of 25 μm in diameter bonded to the inner lead 3B without pre-peeling the coating 5B as in FIG. 1.

As is apparent from FIG. 23, a coating imidization ratio of about $\frac{1}{3}$ is desirable with respect to both degradation rate and peeling strength.

Particularly, in case of the heat resistant polyurethane-coated wires of the present invention, the peeling strength in the second bonding is large, so there were attained high bonding reliability and extremely advantageous results.

Run No. 5

Figure 24:
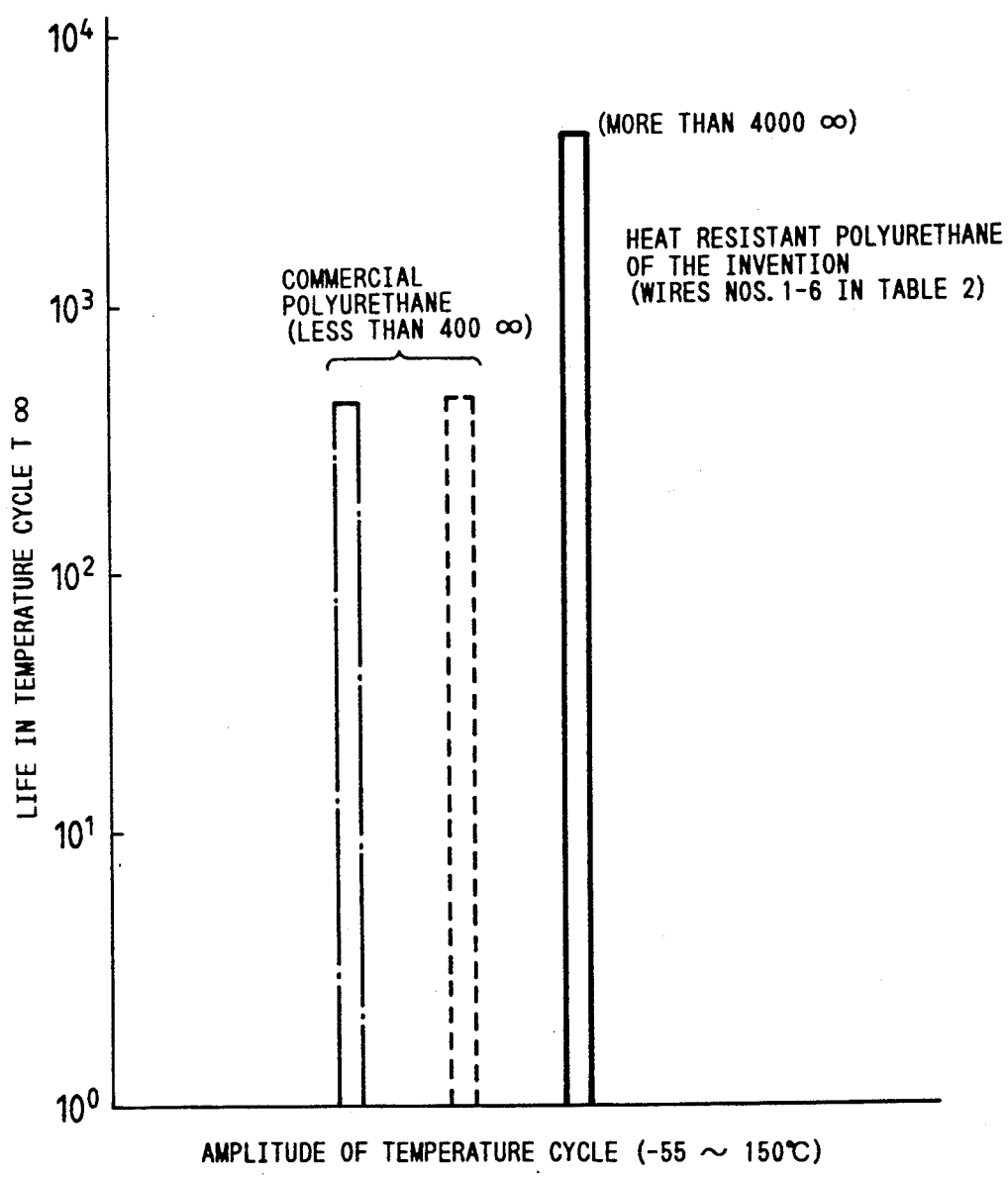
FIG. 24 is an explanatory view showing experimental results on the amplitude of temperature cycle of coated wires and the life in temperature cycle thereof.

Further, FIG. 24 shows the results of an experiment on the relation between the amplitude of temperature cycle (−55° C. to 150° C.) and the life in temperature cycle. A look at the same figure clearly shows that the life T ∞ of the commercial polyurethane coatings is about 400, while that of the heat-resistant polyurethane coatings of the present invention greatly improved to over 4,000.

Run No. 6

Figure 25:
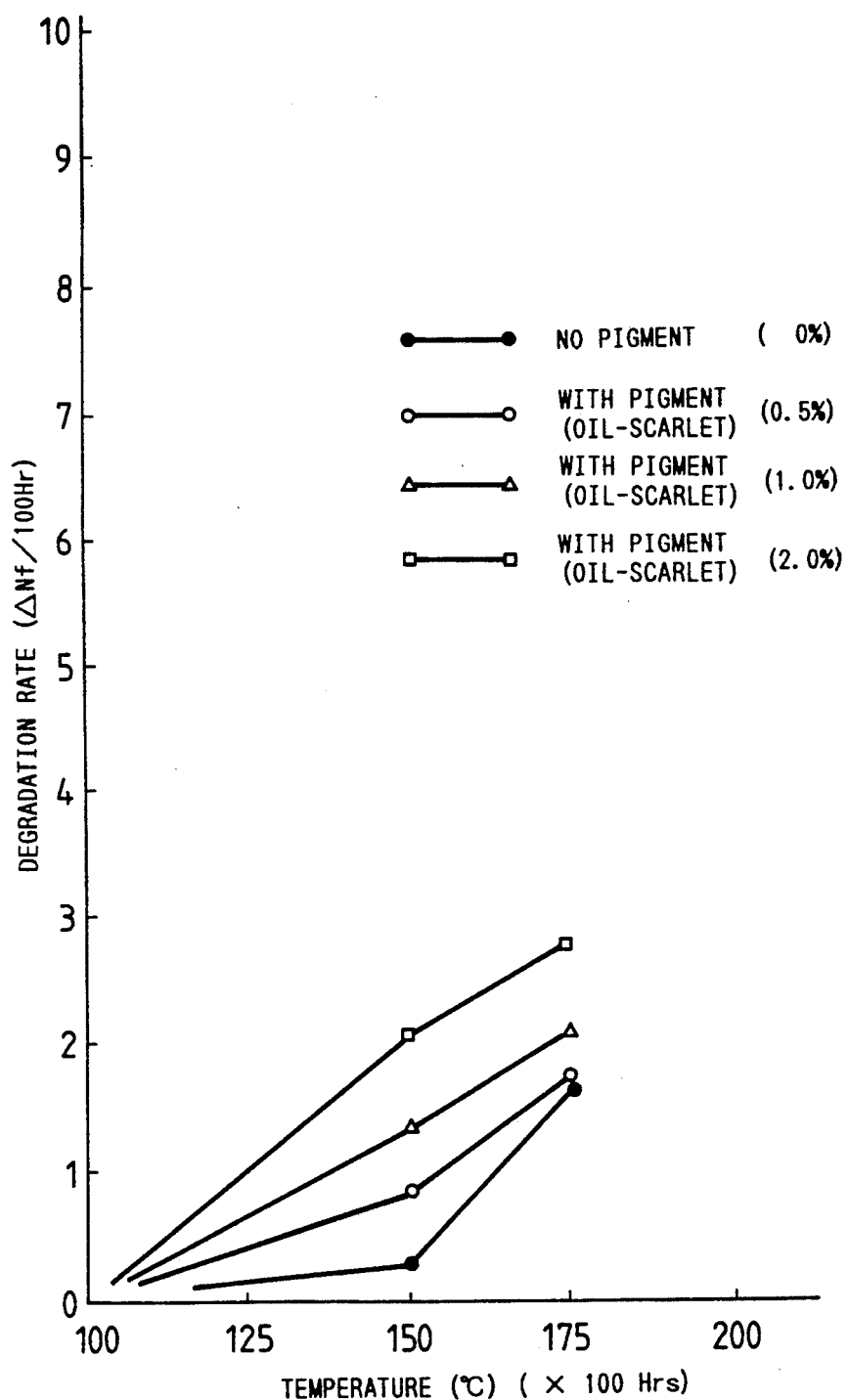
FIG. 25 is an explanatory view showing the influence of the addition of pigment to the coating of coated wire upon the degradation rate.

FIG. 25 shows the results of an experiment conducted t check the influence of the addition of pigment to the coating of coated wire upon degradation rate.

According to the finding of the present inventor, in bonding using the coated wire 5, for example, in forming a metallic ball, it is very difficult to confirm melting-up or peeling of the coating 5B or it may be impossible to do so at least with the naked eye because the coating 5B is very thin. In view of this point the present inventors found out that if a pigment, e.g. oil scarlet, was applied to the coating 5B, it was possible to visually confirm melting-up or peeling of the coating (for example, using an electron microscope) and thus the use of a pigment was very useful.

However, if the amount of a pigment used is too large, the degradation rate of the coating will be increased. In order to determine an appropriate amount thereof the present inventors have conducted various experiments, the results of which are as shown in FIG. 25.

As is apparent from the experimental results shown in FIG. 25, if the amount of a pigment used is too large, the degradation rate of the coating increases, while a small amount thereof results in loss of the foregoing advantage of the addition of a pigment. In view of these two contradictory demands the present inventors have made a study to find that an optimum amount of a pigment (oil scarlet in this embodiment 1) to be used is not more than 2.0 wt %, particularly in the range of 0.5 to 20 wt %. By adding a pigment to the coating in an amount falling under this range there can be attained the advantage of being able to visually confirm melting-up or peeling of the coating 5B from the coated wire 5 while preventing loss of the characteristics of the coating.

Through the above Run Nos. 1 to 6, various other experiments, researches, studies and confirmations the present inventors found out the following facts.

Using the heat-resistant polyurethanes of the foregoing compositions according to the present invention as the coating 5B of the coated wire 5 is very useful in suppressing heat deterioration of the coating and improving bonding property and peeling strength in bonding of the coating.

Further, according to temperature cycle tests for the coating 5B and abrasion tests under the experimental conditions shown in FIG. 19, as is apparent from, for example, Run No. 2, it is very important to use as a constituent material of the coating 5B a material which permits a degradation rate within 20% at a reduced number of times of coating destruction after 100 hours at 150°–175° C.

As a characteristic which the coating should possess, it is very important that the coating should not cause any inconvenience in the bonding property when a coated wire is practically used in the wire bonding work. Having made a study on this point, the present inventors found out that it was important to constitute the coating using a material which exhibits non-carbonizability at the time of forming a metallic ball in ball bonding or at the time of heat-removal of the coating.

This is for the following reason. At the time of forming a metallic ball or at the time of heat-removal of the coating, the coating melts up to just above the metallic ball, but if the coating is carbonizable, it will be carbonized without being decomposed by the heating temperature, e.g. a temperature as high as 1,060° C. As a result, the thus-carbonized coating 5B remains in a surrounding relation to the wire 5A just above a metallic ball 5A1, so that at the time of bonding using a bonding tool 16 the thus-adhered carbonized coating remains as an adhered foreign matter 5D which inhibits the coated wire 5 from being fed through the bonding tool 16. Although the foreign matter 5D can be removed from the surface of the coated wire 5 by the application thereto of such ultrasonic vibration as explained previously in connection with FIG. 1(b), it is of course desirable that such carbonized coating be not formed.

When the above facts are together taken into consideration, it is seen that the following two conditions are very important—one is that the degradation rate of the coating of a coated wire should be within 20% at a reduced number of times of coating destruction after 100 hours at 150°–175° C. and the other is that the coating should be constituted by a material which exhibits non-carbonizability at the time of forming a metallic ball or at the time of heat-removal of the coating. The use of a material meeting these two requirements afforded results quite satisfactory as the coated wire.

According to the results of studies made by the present inventors, the heat-resistant polyurethanes of the foregoing compositions according to the present invention satisfy the aforementioned two conditions.

As noted previously, each of the heat-resistant polyurethanes which constitutes the coating 5B is prepared by the reaction of a polyol component and an isocyanate component and contains in its molecular skeleton a constituent unit derived from a terephthalic acid.

The heat-resistant polyurethane coating 5B is suppressed its destruction caused by heat deterioration, so is suitable for the prevention of electrical short-circuits such as tab and chip short-circuits of the coated wire 5 and inter-wire short-circuit.

The heat-resistant polyurethane as the coating 5B will be decomposed in its urethane linkage at the bonding temperature in ordinary wire bonding or even with the ultrasonic vibration energy induced by the bonding tool 16 and become bondable, thus ensuring bonding in the combination of ordinary compression bonding by heating and ultrasonic vibration o by the latter alone. In this case, if there also is adopted a local heating for a bonding position using a heat source such as a heater 26, it will become possible to effect a more certain wire bonding.

Further, by using as the coating 5B of the coated wire 5 a material which exhibits a degradation rate within 20% at a reduced number of times of coating destruction after 100 hours at 150°–175° C. and also exhibits non-carbonizability at the time of formation of the metallic ball 5A1 or at the time of destruction and removal of the coating 5B it is possible to prevent heat deterioration of the coating 5B, so it becomes possible to prevent electrical short-circuits caused by destruction of the coating.

The heat-resistant polyurethane used for the coating 5B of the coated wire will now be described in more detail. The heat-resistant polyurethane is prepared by the reaction of a polyol component with an isocyanate and it contains in its molecular skeleton a constituent unit derived from terephthalic acid. More specifically, it is obtained using a polymer component which contains as a main component a terephthalic polyol containing active hydrogen, and isocyanate. It is to be understood that the above description "contains as a main component" includes the case where the whole is constituted by only the main component.

The above terephthalic polyol containing active hydrogen can be prepared by a conventional esterification reaction using terephthalic acid and a polyhydric alcohol at a reaction temperature of 70° to 250° C. and at an OH/COOH ratio in the range of 1.2 to 30. Generally used is one having an average molecular weight of 30 to 10,000, containing about 100 to about 500 hydroxyl groups and containing hydroxyl groups at both ends of the molecular chain.

Example of constituents of such terephthalic polyol include aliphatic polyols such as ethylene glycol, diethylene glycol, propylene glycol, dipropylene glycol, hexane glycol, butane glycol, glycerin, trimethylolpropane, hexane triol and pentaerythritol. Such a polyhydric alcohol as 1,4-dimethylolbenzene is also employable. Particularly, ethylene glycol, propylene glycol and glycerin are preferred.

As a dicarboxylic acid there is used terephthalic acid, but where required, an amic acid or an imic acid may be used together with terephthalic acid, which imic acid is of the following structural formula:

[structural formula of imic acid]

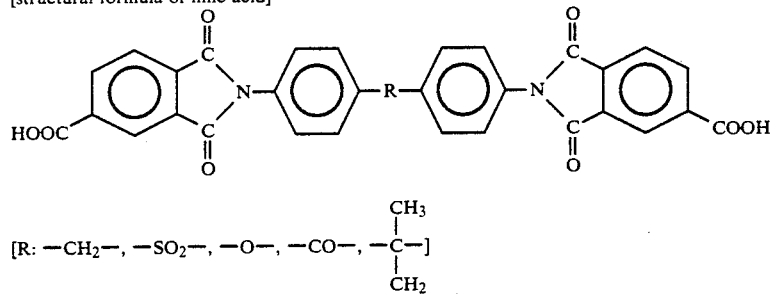

[R: $-CH_2-$, $-SO_2-$, $-O-$, $-CO-$, $-\underset{\underset{CH_2}{|}}{\overset{\overset{CH_3}{|}}{C}}-$]

There also may be used together with terephthalic acid a dibasic acid such as isophthalic acid, orthophthalic acid, succinic acid, adipic acid or sebacic acid, or a polybasic acid such as 1,2,3,4-butanetetracarboxylic acid, cyclopentanetetracarboxylic acid, ethylenetetracarboxylic acid, pyromellitic acid or trimellitic acid.

As examples of the isocyanate to be reacted with the terephthalic polyol exemplified above there are mentioned those obtained by blocking the isocyanate groups of polyvalent isocyanates having at least two isocyanate groups in one molecule such as toluylene diisocyanate and xylylene diisocyanate, with compounds having active hydrogen such as, for example, phenols, caprolactam and methyl ethyl ketone oxime. Such isocyanates are stable. Also employable are those obtained by reacting the above polyvalent isocyanate compounds with polyhydric alcohols such as trimethylolpropane, hexanetriol and butanediol and then blocking the reaction products with compounds having active hydrogen.

As examples of the above isocyanate compounds, mention may be made of the following compounds manufactured by Nippon Polyurethane Industry Co., Ltd.: Millionate MS-50, Coronate 2501, 2503, 2505, Coronate AP-St, Desmodur CT-St. And preferred examples of the above polyvalent isocyanates are those ranging in molecular weight from 300 to 10,000.

According to the present invention, a coating composition is prepared using the starting materials exemplified above and then it is applied to the wire 5A of the wire body to form a coating 5B of several μm thickness, thereby obtaining a coated wire 5 wherein the circumference of the wire 5A of the wire body is insulated.

The above coating composition can be prepared by adding 0.4 to 4.0, preferably 0.9 to 2.0, equivalents of isocyanate groups of a stabilized isocyanate per hydroxyl equivalent of the polyol component and a required amount of a hardening accelerating catalyst and further adding an appropriate amount of an organic solvent (e.g. phenol, glycol ether, or naphtha), while adjusting the solids content usually to 10–30 wt %. Where required, there may be added appropriate amounts of an appearance improver and an additive such as a dye.

The reason why 0.4 to 4.0 equivalents of isocyanate groups of a stabilized isocyanate are added per hydroxyl equivalent of the polyol component in the present invention is that if the amount thereof is smaller than 0.4 equivalent, the crazing characteristic of the resulting insulated wire will be deteriorated, while an amount thereof exceeding 4.0 equivalents will result in deteriorated abrasion resistance of the resulting coating. The amount of the hardening accelerating catalyst used in the preparation of the coating composition is preferably in the range of 0.1 to 10 parts by weight per 100 parts by weight of the polyol component. If it is smaller than 0.1 part by weight, the catalyst will be less effective in the acceleration of hardening and the coating forming ability will be deteriorated. Conversely, if it exceeds 10 parts by weight, the heat deterioration characteristic of the resulting heat-resistant urethane bonding wire will be deteriorated.

As examples of the above hardening accelerating catalyst, mention may be made of metal carboxylic acids, amino acids and phenols. More concrete examples are zinc, iron, copper, manganese, cobalt and tin salts of naphthenic acid, octenoic acid and versatic acid (trademark, Shell Chemical), as well as 1,8-diazabicyclo-(5,4,0)undecene-7,2,4,6-tris(dimethylaminomethyl)-phenol.

After the coating composition was applied onto the surface of the wire of the wire body, baking is performed using a conventional baking apparatus. Conditions for such application and baking differ according to the amounts of the polyol component, stabilized isocyanate, polymerization initiator and hardening accelerating catalyst used, but usually 4 to 100 seconds at 200°-300° C. In short, baking is performed at a temperature and for a period of time sufficient to substantially complete the hardening reaction of the coating composition, whereby there is obtained the coated wire 5 of this embodiment.

According to the results of studies made by the present inventors, commercially available polyurethanes and formal are unsuitable as materials for the coating because their degradation rates under the above conditions exceeds 20% at a reduced number of times of coating destruction after 100 hours at 150°-175° C.

It also turned out that polyimides, polyamides, nylons, polyesters, polyamide-imides and polyester imides were unsuitable for use as materials of the coated wire coating because they exhibit carbonizability in the formation of a metallic ball or at the time of heat-removal of the coating.

On the first bonding side of the coated wire 5 obtained through the above process, one end of the coated wire is electrically connected to the external terminal 2C of the semiconductor chip 2 by ball bonding involving the formation of the metallic ball 5A1, while on the second bonding side the inner lead 3B of the lead 3 and the other end of the coated wire 5 are electrically connected as a second bonding portion 5A2 without pre-removal of the coating 5B by a so-called thermonic bonding utilizing thermal compression bonding and ultrasonic vibration.

The thus wire-bonded semiconductor chip 2, tab 3A and inner lead 3B of the lead 3 and coated wire 5 are sealed with a resin material, e.g. epoxy resin, with only an outer lead 3C of the lead 3 projecting to the exterior from the resin material 6.

The construction and operation of the wire bonding apparatus for bonding the coated wire 5 in this embodiment will be described below with reference to mainly FIG. 2 and FIGS. 4 to 11.

Figure 2:
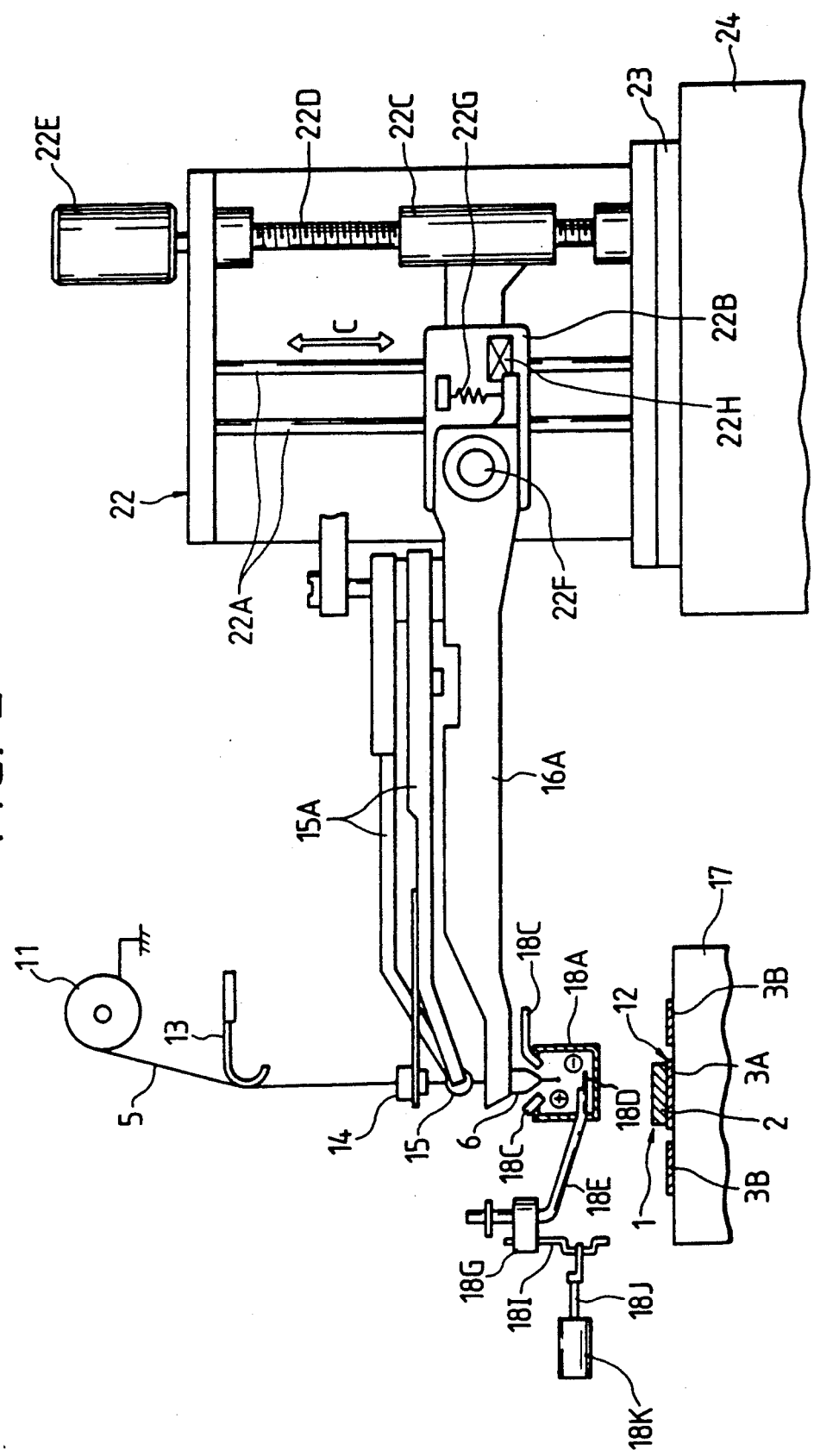
FIG. 2 is a schematic construction diagram of a wire bonding apparatus used in the above embodiment.

The wire bonding apparatus is constituted as a so-called ball bonding apparatus, which is constructed so that the coated wire 5 wound round a wire spool 11 is fed to a bonding portion 12, as shown in FIG. 2.

More specifically, the feed of the coated wire 5 from the wire spool 11 to the bonding portion 12 is performed through a tensioner 13, a sprocket 14, a clamper 15 and a bonding tool (capillary). In this embodiment the bonding tool 16 is obtained by cutting ruby into the shape shown in FIG. 1(b). In the interior thereof is formed an axially extending through hole 16B. As shown in FIG. 1(b), an electroconductive material 16C is adhered to the inner peripheral surface of the through hole 16B by means of plating or vapor deposition of, for example, aluminum (Al) or chromium (Cr). When the coated wire 5 passes through the bonding tool, its outer peripheral portion is contacted with the surface of the electroconductive material 16C, whereby the static electricity on the coating 5B of the coated wire 5 can be removed. As the material of the bonding tool 16, ruby is desirable from the standpoint of durability, but it goes without saying that there may be used a ceramic material as in the prior art.

Figure 4:
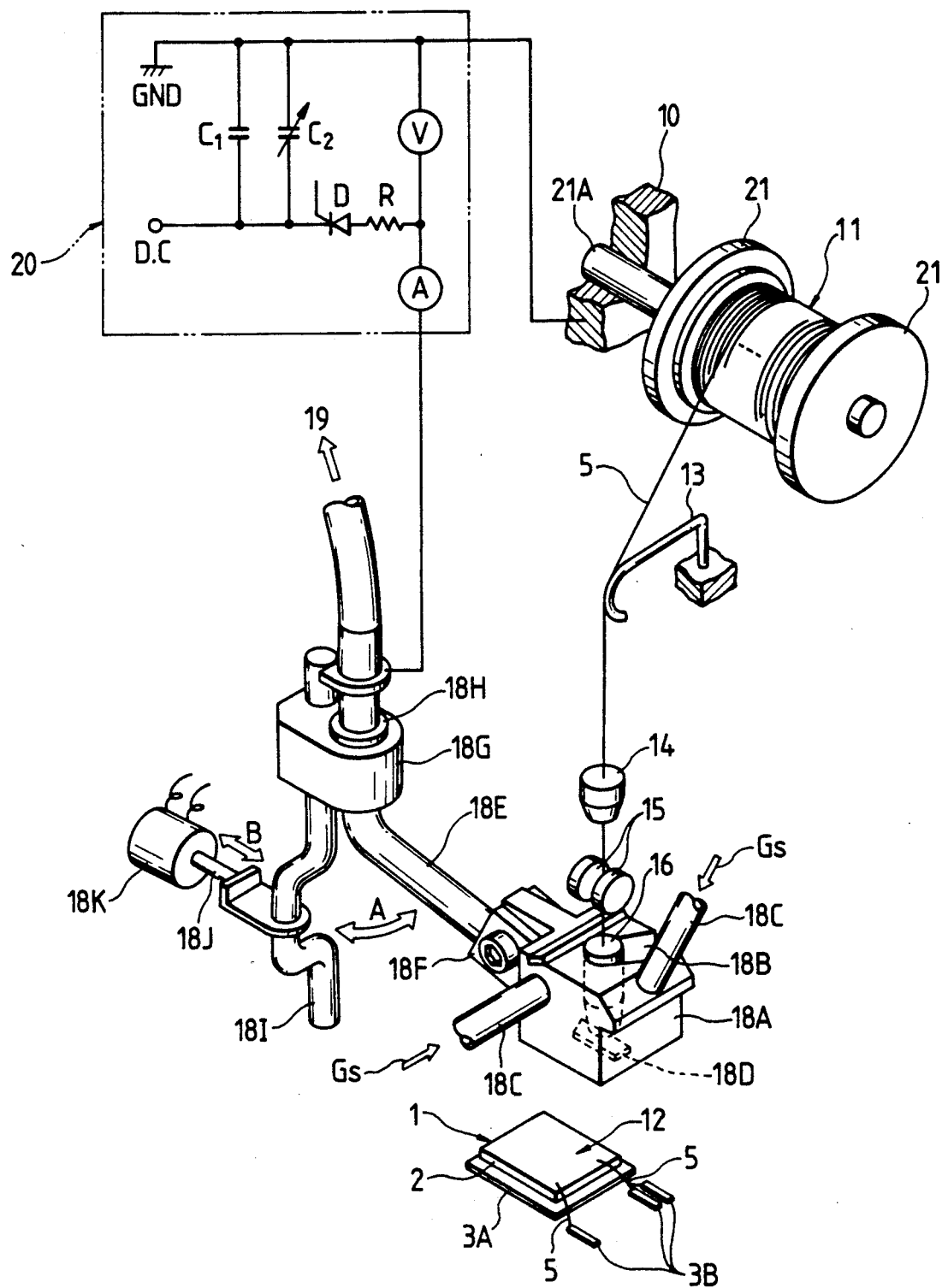
FIG. 4 is a perspective view of a principal portion of the wire bonding apparatus used in the above embodiment.

In the bonding portion 12 positioned below the bonding tool 16 there is disposed a resin sealed type semiconductor device 1 before resin sealing in such a positional as shown in FIGS. 2 and 4. The underside (the side where the semiconductor chip 2 is not mounted) of the semiconductor device 1 before resin sealing is supported on a bonding stage 17 of the bonding apparatus, as shown in FIG. 2.

To the external terminal 2C of the semiconductor chip 2 is bonded the metallic ball 5A1 formed by melting the front end of the wire 5A which end has been exposed by removing the coating 5B on one end side of the coated wire 5. The metallic ball 5A1 is formed so as to have a diameter two to three times as large as the diameter of the wire 5A. On the other hand, to the inner lead 3B of the lead 3 is bonded the wire 5A which has been exposed by destroying the coating 5B on the other end side of the coated wire 5 in the connection. That is, on the other end side of the coated wire 5, substantially only the coating 5B of the connection with the lead 3 is removed, allowing the other portion of the coating 5B to remain. The destruction of the coating 5B on the other end side of the coated wire 5 can be done by the ultrasonic vibration induced by the bonding tool 16 as well as the application of moderate pressure and heating (energy).

Thus, in the resin-sealed type semiconductor device 1 of this embodiment using the coated wire 5, the metallic ball 5A1 formed by the wire on one end side of the coated wire 5 is connected to the external terminal 2C of the semiconductor chip 1, while the wire 5A on the other end side of the coated wire 5 which has been exposed by destroying the coating 5B in the connection is connected to the inner lead 3B of the lead 3. Since the metallic ball 5A1 is of a large shape, the area of contact between the external terminal 2C of the semiconductor chip 2 and the wire 5A of the coated wire 5 increases and the bondability between the two is improved. Further, by covering the other end side of the coated wire 5 other than its portion connected to the inner lead 3B of the lead 3 with the coating 5B, it is possible to decrease the short-circuit between the other end side of the coated wire and that of another coated wire 5 adjacent thereto, thus making it possible to reduce the spacing of leads 3 and attain a multi-terminal (so-called multi-pin) construction of the resin-sealed type semiconductor device 1.

The front end portion (metallic ball 5A1 forming portion) in the feeding direction of the bonding tool 16 and coated wire 5 is covered with a cover member 18A at the time of forming of the metallic ball 5A1, as shown in FIGS. 2 and 4. The cover member 18A can turn in the direction of arrow A in FIG. 4. More specifically, the cover member 18A is constructed so as to insert the bonding tool 16 from a tool insertion opening 18B by its turning motion in the direction of arrow A and cover it at the time of formation of the metallic ball 5A1.

Figure 5:
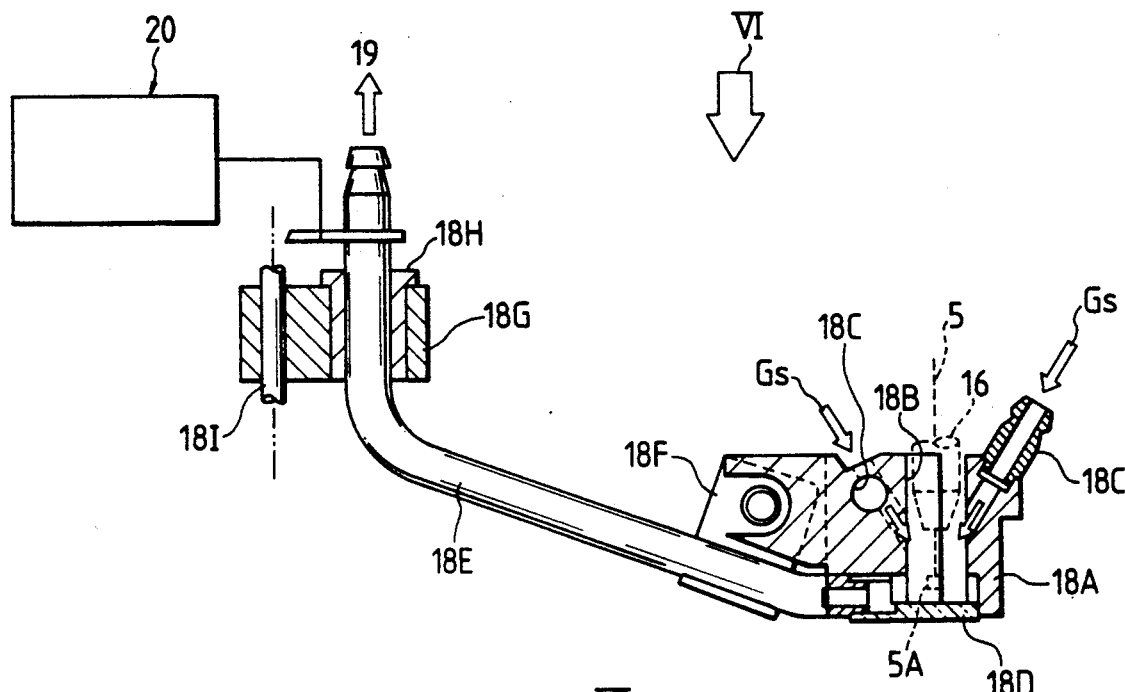
FIG. 5 is a partially sectional view showing a concrete construction of the principal portion.
Figure 6:
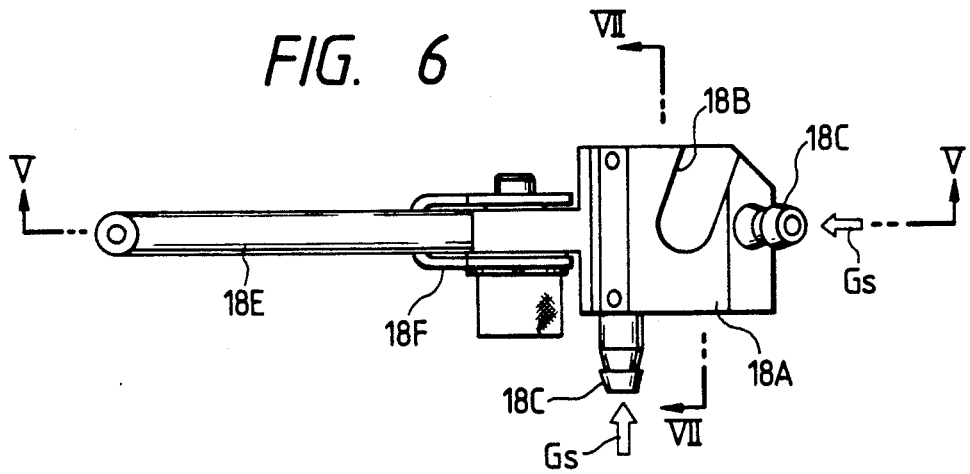
FIG. 6 is a plan view as seen in the direction of arrow VI in FIG. 5.
Figure 7:
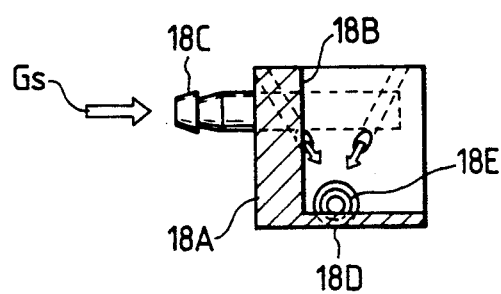
FIG. 7 is a sectional view taken on line VII—VII of FIG. 6.

The cover member 18A is constructed as shown in FIG. 5 (a partially sectional view showing a concrete construction, corresponding to a section taken on line V—V of FIG. 6), FIG. 6 (a plan view as seen in the direction of arrow VI in FIG. 5) and FIG. 7 (a sectional view taken on line VII—VII of FIG. 6). As will be described later, the cover member 18A is constructed so that a part of the coating 5B may not be scattered to the bonding portion 12 by blowing-off of the coating 5B being melted up at the time of formation of the metallic ball 5A1. Moreover the cover member 18A is constructed so as to facilitate maintaining of an anti-oxidizing gas atmosphere (shielding gas atmosphere) in the case where the wire 5A of the coated wire 5 is formed using an easily oxidizable material such as Cu or Al. For example, the cover member 18A is formed using stainless steel. It may be formed using a transparent glass material so that the worker can check in what condition the metallic ball 5A1 of the coated wire 5 is formed.

In the bottom of the cover member 18A is provided an electric torch (arc electrode) 18D as shown in FIGS. 2, 4 and 5. The electric torch 18D is brought into close proximity to the wire 5A on the front feed end side of the coated wire 5 to generate arc Ac between the two to thereby form a metallic ball 5A1. The electric torch 18D is formed using, for example, tungsten (W) which withstands high temperatures.

The electric torch 18D is connected to an arc generation device 20 through a suction pipe 18E to a suction device 19 formed of a electroconductive material. The suction pipe 18E, formed using stainless steel for example, fixes the electric torch 18D through a bonding metal layer such as Ag-Cu solder material. The suction pipe 18E is fixed to the cover member 18A through a holder member 18F. That is, the electric torch 18D and the suction pipe 18E are constructed integrally with the cover member 18A.

The electric torch 18D is constructed so as to be movable in the direction of arrow A in FIG. 4 so that it can approach the front feed end side of the coated wire 5 at the time of forming the metallic ball 5A1 in the manner described above and can move away from the feed path of the coated wire 5 during bonding. The device for moving the electric torch 18D is composed principally of a support member 18G which supports the electric torch 18D through the suction pipe 18E and an insulating material 18H, a crank shaft 18I for rotating the support member 18G in the direction of arrow A, and a drive source 18K for rotating the crank shaft 18I. The rotation of the crank shaft 18I is effected by movement in the direction of arrow B of a shaft 18J of the drive source 18K connected to the crank shaft 18I. The drive source 18K is constituted, for example, by a solenoid. The crank shaft 18I is supported rotatably by the bonding apparatus body though not shown. The movement of the electric torch 18D and the cover member 18A is done in synchronism with each other because both are constituted integrally with each other.

The arc generation device 20, as shown in FIG. 4, comprises a charging capacitor C1, a capacitor C2, an arc generating thyristor D which is operated with trigger, and a resistor R. A DC power source D.C is constituted so as to supply a voltage of a negative polarity in the range of $-1,000$ to $-3,000$V. The DC power source D.C is connected to the electric torch 18D through the thyristor D, resistor R, etc. A reference potential GND is, for example, an earth potential ($=0$ [V]). The reference marks V and A in the same figure represent a voltmeter and an ammeter, respectively.

Figure 8:
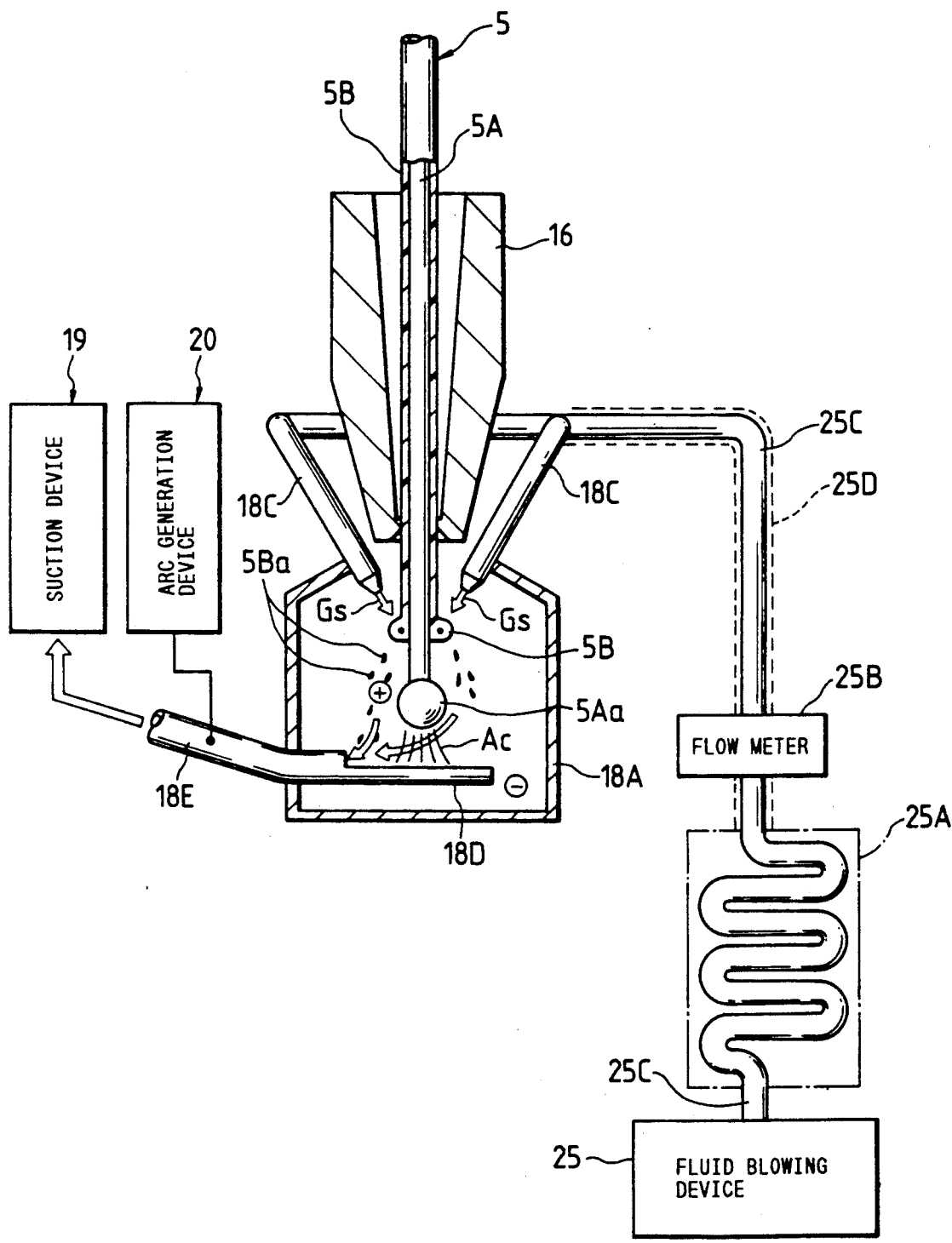
FIG. 8 is a schematic construction diagram showing a principle of forming a metallic ball in the embodiment 1-I.

As will be described later in detail, an end portion of the wire 5A of the coated wire 5 wound round the wire spool 11 is connected at the reference potential GND. Consequently, at the time of forming the metallic ball 5A1 at the front end portion of the coated wire 5 by means of the electric torch 18D, it is possible to set the electric torch 18D at a negative potential ($-$) and the wire 5A on the front feed end side of the coated wire 5 at a positive potential ($+$), as shown in FIGS. 2, 4 and 8.

Thus, in the bonding apparatus wherein arc Ac is generated between the wire 5A at the front end portion of the coated wire 5 and the arc electrode 18D to form the metallic ball 5A1 at the front end portion of the coated wire 5, the wire 5A of the coated wire 5 is connected to a positive potential ($+$) and the electric torch 18D to a negative potential ($-$), whereby the position of the arc Ac generated between the wire 5A of the coated wire 5 and the electric torch 18D can be stabilized as compared with the case of the opposite polarity and hence it is possible to suppress the crawling-up of the arc Ac toward the rear end of the wire 5A of the coated wire 5. The suppression of such crawling-up of the arc Ac is effective in suppressing the melting-up of the coating 5B of the coated wire 5, whereby it is possible to prevent resin accumulation caused by melting-up of the coating material.

The wire 5A of the coated wire 5 may be connected to a voltage higher or lower than the reference potential GND so as to have a positive potential relative to the electric torch 18D.

Figure 9:
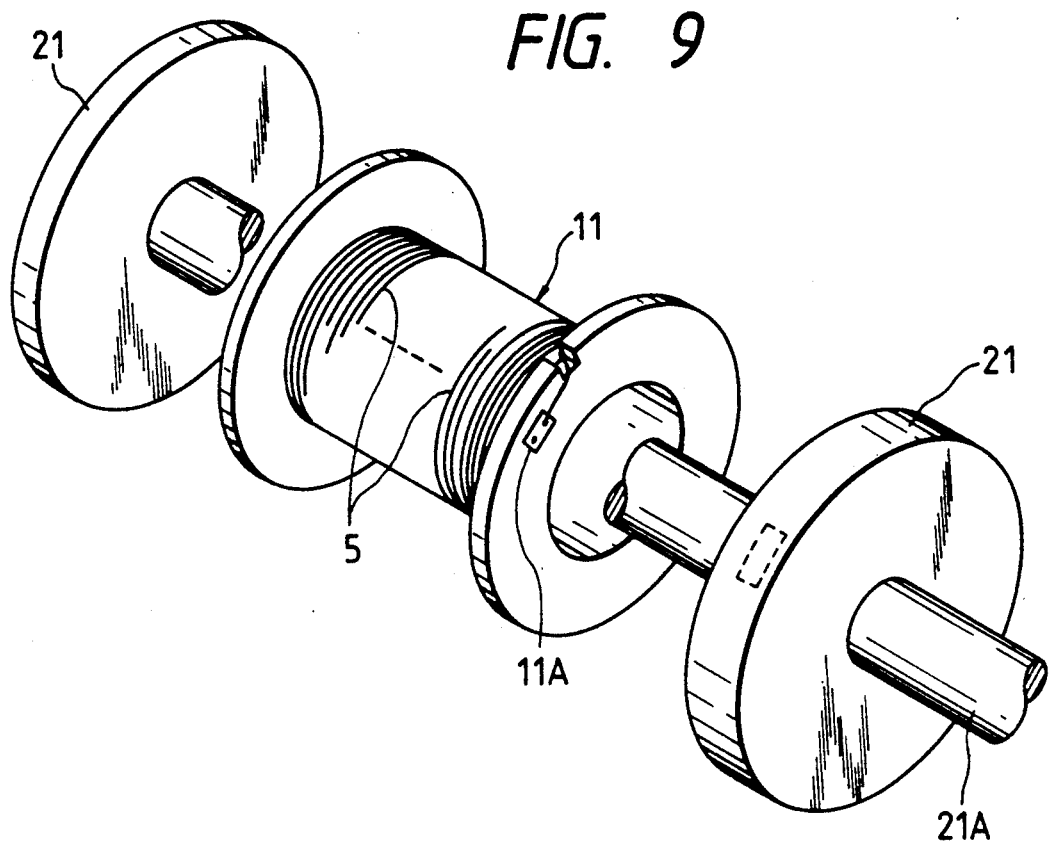
FIG. 9 is an exploded perspective view of a wire spool in the wire bonding apparatus used in the embodiment 1-I.

The wire spool 11 with the coated wire 5 wound thereon is constituted as illustrated in FIGS. 4 and 9 (an exploded perspective view of a principal portion). For example, it is formed by applying an anodized aluminum treatment to the surface of a cylindrical aluminum metal, which treatment is for improving mechanical strength and preventing the occurrence of a flaw. The wire spool 11 has an insulating property because it has been subjected to the anodized aluminum treatment mentioned above.

The wire spool 11 may be plated with chromium (Cr) to render it electroconductive.

Further, the wire spool 11 may be constituted using stainless steel.

The wire spool 11 is mounted in spool holders 21 and connected to the bonding apparatus body 10 through a rotary shaft 21A of the spool holders 21.

The spool holders 21 are constituted using, for example, an earthed stainless steel so that they have electroconductivity at least partially. Therefore, the static electricity on the coating 5B of the coated wire 5 wound round the spool holders 21 is discharged through the above stainless steel.

Figure 11:
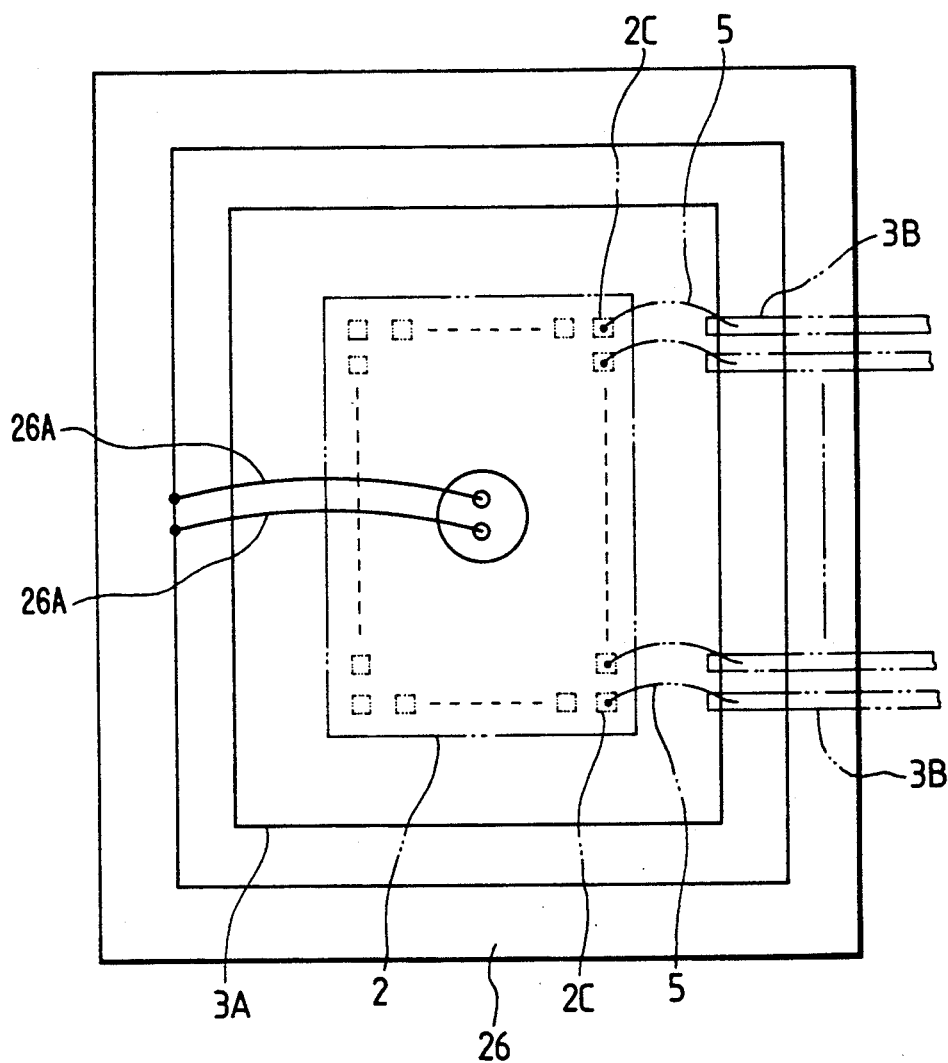
FIG. 11 is a schematic plan view of a local heating portion for wire bonding in the embodiment 1-I.

The wire spool 11 is provided with a connection terminal 11A as shown in FIGS. 9 and 11 (an enlarged perspective view of a principal portion). The connection terminal 11A is formed in a spot shape on the side (flange portion) of the wire spool 11 which comes into contact with the electroconductive portion of the spool holder 21.

Figure 10:
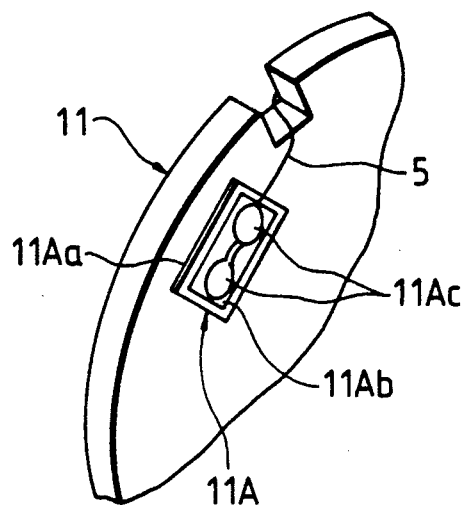
FIG. 10 is an enlarged perspective view of a principal portion of the said wire spool.

As shown in FIG. 10, the connection terminal 11A is made up of an insulator 11Aa, a conductor 11Ab provided on the insulator 11Aa and metallic connecting portions 11Ac formed on the conductor 11Ab. The insulator 11Aa is formed using, for example, a polyimide resin so that it is surely isolated electrically from the conductor 11Ab and the wire spool 11 and permits the metallic connecting portions 11Ac to come into positive abutment with a spool holder 21. The conductor 11Ab is formed using, for example, copper foil so that the metallic connecting portion 11Ac for connection with the wire 5A of the coated wire 5 and the metallic connecting portion 11Ac for contact with the spool holder 21 can be positively connected together. The metallic connecting portions 11Ac are formed using an electroconductive paste or solder.

The connection terminal 11A is constructed so as to make connection with the wire 5A at an end portion of the coated wire 5 on the side opposite to the side where it is fed to the bonding portion 12, that is, the wire 5A at the winding start end of the coated wire 5, through a cutout formed in the side face (flange portion) of the wire spool 11. The wire 5A is connected to the connection terminal 11A by means of a metallic connecting portion 11Ac. The coating 5B on the surface of the wire 5A at the winding start end of the coated wire 5 is removed by heating or chemically. The wire 5A of the coated wire 5 is connected to the reference potential GND through a spool holder 21, its rotary shaft 21A and the bonding apparatus body 10, which reference potential is the same as the reference potential GND of the arc generation device 20.

Thus, by providing the connection terminal 11A for connection with the reference potential GND on the wire spool and connecting the wire 5A at the winding start end of the coated wire 5 to the said connection terminal, it is possible to make connection with the reference electrode GND through the spool holder 21, etc., thus permitting positive connection of the wire 5A of the coated wire 5 to the reference potential GND.

Further, by such connection of the wire 5A of the coated wire 5 to the reference electrode GND, it is possible to ensure a sufficient potential difference between the electric torch 18D and the wire 5A of the coated wire 5 on the feed side at the time of formation of the metallic ball 5A1, thus permitting positive formation of the metallic ball.

As shown in FIGS. 2 and 4, the bonding tool 16 is supported by a bonding head (digital bonding head) 22 through a bonding arm 16A. In one end on the bonding head 22 side of the bonding arm 16A there is incorporated an ultrasonic wave oscillation mechanism 22H of a predetermined frequency. The oscillation generated by the ultrasonic wave oscillation mechanism 22H causes ultrasonic vibration of the bonding tool 16 through the bonding arm 16A.

The bonding head 22 is supported on a base 24 through an XY table 23. The bonding head 22 is provided with a device for moving the bonding arm 16A in vertical directions (arrow C directions in FIG. 2) so that the bonding tool 16 can be moved toward and away from the bonding portion 12. The said moving device is composed principally of guide members 22A, a vertically movable block 22B, an internal thread member 22C, an external thread member 22D and a motor 22E. The guide members 22A are disposed to permit the vertically movable block 22B to move in the arrow C directions. The motor 22E is a servomotor which, upon application thereto of a predetermined amount of an electric current, causes the external thread member 22D to rotate by a predetermined amount. And in response to the amount of this rotation the internal thread member 22C engaged with the external thread member 22D is moved axially and the vertically movable block 22B which is interlocked with this movement is moved in the direction of arrow C in the figure.

The bonding arm 16A supported by the vertically movable block 22B is rotatable about a rotary shaft 22F.

The rotation around the rotary shaft 22F of the bonding arm 16A is controlled by an elastic member 22G. This control for the rotation by the elastic member 22G is performed so as to prevent the bonding portion 12 from being pressurized to a higher extent than necessary to thereby prevent damage or breakage of the bonding portion.

Though not shown in the same figure, the rotation of the bonding arm 16A may be effected by oscillation of a voice coil motor disposed within the vertically movable block 22B.

The clamper 15 has a structure capable of gripping the coated wire 5 at both side faces of the wire and it is constructed so as to control the feed of the coated wire 5. The clamper 15 is mounted on the bonding arm 16A through a clamper arm 15A.

The guide 14 is for positioning the coated wire 5 fed from the wire spool 11 accurately with respect t the bonding tool 16 and it is fixed to the clamper arm 15A. In this embodiment, both the clamper 15 and the guide 14 are constituted using an electroconductive metal such as stainless steel and are connected to ground, so the electrification of the coating 5B caused by friction with the coated wire 5 during passing through the clamper 15 and the guide 14 is prevented. In the event the coating 5B is electrically charged, the static electricity in a charged state is removed through the clamper 15 and the guide 14 at the time when the outer peripheral surface of the coated wire 5 is contacted with the clamper 15 and the guide 14.

As shown in FIGS. 2 and 8, a cooling fluid blowing nozzle 18C of a cooling fluid blowing device 25 is provided near the front end in the feed direction of the coated wire 5 and near the feed path of the coated wire formed between the bonding tool 16 and the bonding portion 12. The cooling fluid blowing nozzle 18C is constructed so that when the metallic ball 5A1 is formed by the wire 5A at the front feed end of the coated wire 5, a cooling fluid (Gs) is blown to that ball forming portion (the wire 5A and the coating 5B) from the cooling fluid blowing device 25. As shown in FIG. 8, when the metallic ball 5A1 is formed by the wire 5A at the front end of the coated wire 5, the cooling fluid Ga from the cooling fluid blowing nozzle 18C blows off (5Ba) the coating 5B which is formed by melting-up with the heat of the arc Ac to thereby prevent resin accumulation around the coated wire projecting from the front end of the bonding tool 16 and also prevent such melting-up phenomenon from expanding beyond a certain position.

In this embodiment the cooling fluid blowing nozzle 18C is provided with respect to the cover member 18A so that the cooling fluid Ga may be directed toward the extending front end of the bonding tool 16, that is, to the front end portion of the coated wire 5. As shown concretely in FIGS. 4 to 7, the cooling fluid blowing nozzle 18C is positioned obliquely upwards in the figure in order t decrease melting-up of the coating 5B and it blows the cooling fluid Gs from the rear end side toward the front end side of the coated wire 5. It is desirable not to attach the cooling fluid blowing nozzle 18C to the bonding tool 16. More particularly, if the nozzle 18C is attached to the bonding tool 16, the weight of the bonding tool 16 will be increased thus resulting in increase of its ultrasonic vibration load, which leads to deterioration in bondability of the connection.

As the cooling fluid Gs there is used such a gas as $N_2$, $H_2$, He, Ar, or air, which fluid is fed from the cooling fluid blowing device (fluid source) 25 to the cooling fluid blowing nozzle 18C through a cooling device 25A a flow meter 25B and a fluid feed pipe 25C.

There may be disposed a corona discharge means within the cooling fluid blowing device 25 and ionized gas (deelectrifying fluid) may be used as the cooling fluid GS. In this case, it becomes possible to deelectrify the coated wire 5 in its position just before wire bonding, so it is possible to effectively prevent electrostatic breakdown of the semiconductor chip 2 caused by electrification of the coating 5B during wire bonding.

In addition to the use of such ion gas, even a mere gas spraying using $N_2$ is also effective in removing the electric charge on the coating 5B. This was confirmed through a study made by the present inventors.

The cooling device 25A is constructed so as to cool the cooling fluid Gs positively to a temperature lower than ordinary temperatures. For example, it is constituted by an electronic cooling device utilizing the Peltier effect. Though illustrated schematically in FIG. 8, the fluid feed pipe 25C is covered with a heat insulator 25D at least at its portion between the cooling device 25A and the feed port of the cooling fluid blowing nozzle 18C. That is, the heat insulator 25D serves to prevent the cooling fluid Gs cooled by the cooling device 25A from being changed in temperature during movement thereof through the fluid feed pipe 25C (in order to enhance the cooling efficiency).

A suction pipe 18E connected to the suction device 19 is provided near the front end portion in the feed direction of the coated wire 5 and in a position opposed to the cooling fluid blowing nozzle 18C with the melting-up portion of the coating 5B of the coated wire 5 made as the center. The suction pipe 18E mainly functions to suck melted-up coating fragments 5Ba although it is also used as a conductor which connects the electric torch 18D and the arc generation device 20 with each other. The coating fragments 5Ba sucked by the suction pipe 18E are sucked by the suction device 19 and then discharged to the exterior.

Figure 1A:
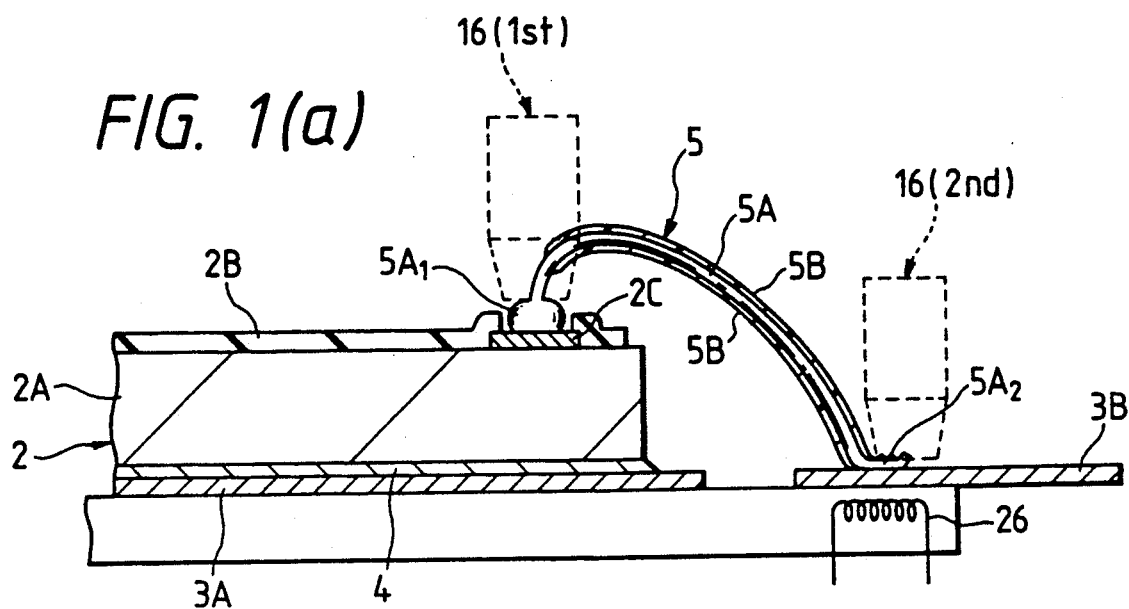
FIGS. 1(a) and 1(b) are explanatory sectional views showing a wire bonding procedure according to an embodiment 1-I of the present invention.
Figure 1B:
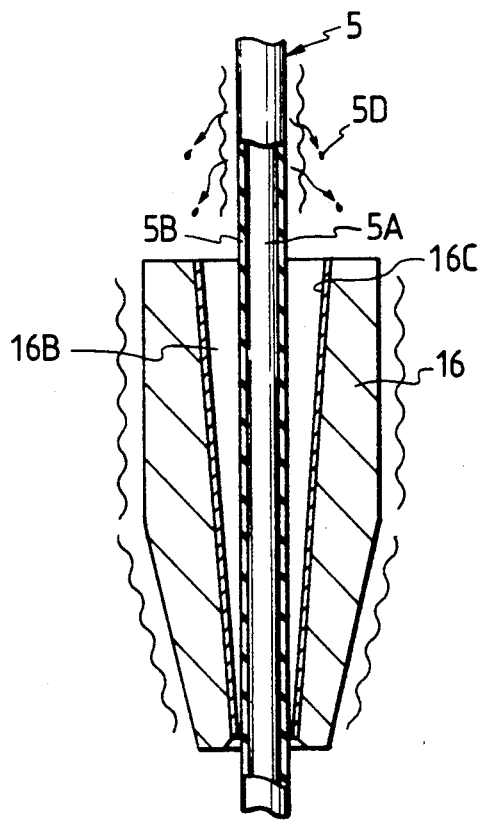

In this embodiment, moreover, in order to bond (second bonding) the other end of the coated wire 5 positively to the inner lead 3B of the lead 3, there is provided ceramic heaters 26 in such a square ring shape as shown in FIGS. 1(a) and 11, which heaters heat only the inner lead 3B locally to a temperature higher than that of the other portion. The reference numeral 26A denotes a power feed line for the square ring-shaped heater 26 for local heating.

The wire bonding method in this embodiment will be described below briefly.

First, as shown in FIGS. 2, 4, 5 and 8, the bonding tool 16 and the front end portion in the feed direction of the coated wire 5 projecting from the pressurizing side of the bonding tool 16 are covered with the cover member 18A. This operation is done by moving the cover member 18A in the direction of arrow A in FIG. 4 by means of the moving device driven by the drive source 18K. By using the cover member 18A, both the electric torch 18D and the cooling fluid blowing nozzle 18C can be disposed near the front end of the coated wire 5.

Then, as shown in FIG. 8, arc Ac is generated between the wire 5A at the front end in the feed direction of the coated wire 5 and the electric torch 18D to form a metallic ball 5A1 of the wire 5A. Under the heat of the arc Ac which forms the metallic ball 5A1, the insulating coating 5B at the front end in the feed direction of the coated wire 5 melts up. That is, the coating 5B at the said front end is removed and so the wire 5A is exposed.

The formation of the metallic ball 5A1 is done in as short a time as possible. If the metallic ball 5A1 is formed in a short time and that with high energy (in high regions of current and voltage), the amount of the coating 5B of the coated wire 5 which is melted up will become smaller. Thus, the short-time, high-energy formation of the metallic ball 5A1 stabilizes the generation of the arc Ac as noted previously. This can be done by setting the electric torch D and the wire 5A of the coated wire 5 at negative (−) and positive (+) potentials, respectively.

And during formation of the metallic ball 5A1, the cooling fluid Gs from the cooling fluid blowing device 2 is sprayed to the melted-up coating 5B of the coated wire 5 through the cooling fluid blowing nozzle 18C whose position has been set together with the cover member 18A, to blow off the coating 5B as shown in FIG. 8. The coating fragments 5Ba thus blown off are sucked by the suction device 19 through the suction pipe 18E and discharged to the exterior.

The cooling fluid Gs from the cooling fluid blowing nozzle 18C has been cooled to a temperature in the range of, for example, about 0° to about −10° C. by means of the cooling device 25A shown in FIG. 8. The lower the temperature of the cooling fluid Gs from the cooling fluid blowing nozzle 18C, the smaller the amount of the coating 5B of the coated wire melted up. More particularly, since the cooling fluid Gs which has been cooled in the cooling device 25A can cool the wire 5A of the coated wire 5, the coating 5B and the bonding tool 16 positively, the coating 5B will be melted only at its portion where the arc Ac is generated and will not be melted at the other portion; as a result, it is possible to decrease the amount of the coating 5B melted up.

Then, together with the cover member 18A, each of the electric torch 18D and the cooling fluid blowing nozzle 18C is moved in the direction of arrow A (reverse to the previous direction).

Next, the metallic ball 5A1 formed at the front end in the feed direction of the coated wire 5 is drawn towards the pressurizing face of bonding tool 16.

Then, in this state, the bonding tool 16 is moved toward the bonding portion 12 and is brought into contact with the surface of the external terminal 2C through the metallic ball 5A1 as indicated by broken lines in FIG. 1(a). In this state, the ultrasonic wave oscillation mechanism 22H in the bonding head 22 is operated to apply ultrasonic vibration of a predetermined frequency to the bonding tool 16 through the bonding arm 16A. The external terminal 2C and the metallic ball 5A1 are bonded together (first bonding) by a synergistic effect of the ultrasonic vibration under the heating environment.

Next, while the application of the ultrasonic vibration is continued, the bonding tool 16 is moved by controlling the operation of the XY table 23 and the motor 22E, up to a position just above the inner lead 3B, and is then brought down, whereby the coated wire 5 is stretched in the form of a loop between the semiconductor chip 2 and the inner lead 3B. At this time, the lower side of the coated wire 5 drawn out from the front end of the bonding tool 16 is rubbed against the surface of the inner lead 3B. As a result, the coating 5B of the coated wire 5 in contact with the surface of the inner lead 3B is destroyed and peeled off by the ultrasonic vibration being applied continuously to the bonding tool 16 and so the wire 5A is exposed. With further continuation of the ultrasonic vibration, the wire 5 thus exposed is ultrasonic-bonded (second bonding) to the surface of the inner lead 3B.

In this embodiment, as explained above, the application of the ultrasonic vibration is continued during movement of the bonding tool 16 from the first to the second bonding. As shown in FIG. 1 (b), above the bonding tool 16 during movement, the coated wire 5 itself is also in a vibrating state with the ultrasonic vibration of the bonding tool 16. In this position, therefore, foreign matters 5D adhered by static electricity to the circumference of the coated wire 5 are removed from the surface of the coated wire by the said vibration.

Thus, most foreign matters 5D adhered to the surface of the coated wire 5 are removed before insertion of the coated wire into the through hole 16B of the bonding tool 16, so that the bonding tool is surely prevented from being clogged by the adhered foreign matters 5D.

Further, in the interior of the through hole 16B of the bonding tool 16, the coated wire 5 undergoes the ultrasonic vibration averagewise from the circumference of the through hole, so that the coated wire 5 in the same hole is prevented from being deflected, that is, prevented from remaining contacted with a specific inner wall part of the through hole 16B. Consequently, the coated wire 5 can be prevented from being curled which is caused by a long time contact of the coated wire with the inner wall of the through hole, and so the coated wire 5 can be held upright within the bonding tool 16. Therefore, defective bonding caused by such curling of the coated wire 5 at this stage is also prevented effectively. In this embodiment, moreover, since the inner wall surface of the through hole 16B of the bonding tool 16 is coated with the electroconductive material 16C, the coated wire 5 can be prevented from being charged electrically and thus there can be attained a deelectrifying effect for the coated wire.

The frequency in the above ultrasonic vibration is set at a level falling under the range required for the removal of the coating 5B in the second bonding and also for ultrasonic bonding between the exposed wire 5A and the inner lead 3B. But control may be made so that the frequency can be changed between the oscillation frequency during the foregoing movement of the bonding tool 16 and that during the second bonding. For example, the thickness of the coating 5B on the wire surface is preferably in the range of 0.2 to 3 $\mu$m though it somewhat differs depending on the ultrasonic vibration energy and the thermal pressure bonding force of the bonding tool 16. If the thickness of the coating 5B of the coated wire 5 is too small, the dielectric strength as the insulating coating will be low. And where such thickness is too large, the coating 5B will become difficult to be destroyed by the ultrasonic vibration of the bonding tool 16. In the event the thickness of the coating 5B exceeds a predetermined value, the coating 5B will no longer be destroyed, thus resulting in defective connection between the wire 5A of the coated wire 5 and the inner lead 3B of the lead 3.

In bonding (second bonding) the other end of the coated wire 5 in this embodiment, only the inner lead 3B of the lead 3 is locally heated to a higher temperature than that of the other portion by means of the heater 26, so the heating and decomposition of the coating 5B are accelerated, thus permitting improvement in bondability of the second bonding. In this way it becomes possible to effect a firm wire bonding.

After completion of the above second bonding, the bonding tool 16 is raised and spaced from the inner lead 3B of the bonding tool 16. At this time, the coated wire 5 is gripped by the clamper 15 at an intermediate part thereof (above the bonding tool 16) so is cut from the rear end portion in the second bonding, and thus such a one cycle of wire bonding process for the coated wire 5 as shown in FIG. 1(a) is completed.

Thus, in the bonding technique of forming the metallic ball 5A1 at the front end of the coated wire 5, by providing the cooling fluid blowing nozzle 18C (part of the cooling fluid blowing device 25) for blowing the cooling fluid Gs to the front end portion of the coated wire 5 in the vicinity of the said front end portion, it is made possible to scatter the coating 5B being melted up of the coated wire 5, so it is possible to prevent resin accumulation from being formed by the coating 5B on the coated wire 5.

As a result, the coated wire 5 is prevented from being engaged with the bonding tool 16 which would occur in the presence of resin accumulation of the insulating coating 5B, thus permitting the coated wire 5 to be pulled closer to the pressurizing face of the bonding tool 16, and therefore it becomes possible to effect satisfactory bonding.

Further, in the bonding technique of forming the metallic ball 5A1 at the front end of the coated wire 5, by providing the cooling fluid blowing nozzle 18C (part of the cooling fluid blowing device 25) and also providing the suction pipe 18E (suction device 19) for sucking the coating 5B of the coated wire 5 being blown off as fragments by the cooling fluid Gs sprayed from the cooling fluid spray nozzle 18C, in the vicinity of the front end of the coated wire 5, the melted-up coating fragments 5Ba of the coated wire 5 are blown off to prevent a sphere of the coating 5B from being formed on the coated wire 5, thus permitting the prevention of defective bonding as noted previously. Besides, since the coating fragments 5Ba thus blown off are not scattered to the bonding portion 12, it is possible to prevent defective bonding caused by such scatter of the coating fragments 5Ba. For example, the defective bonding caused by such scatter of the coating fragments 5Ba means that the coating fragments 5Ba are scattered between the external terminals 2C of the semiconductor chip 2 or the inner lead 3B of the lead 3 and the wire 5A of the coated wire 5, resulting in poor conduction between the two.

Moreover, in the bonding technique of forming the metallic ball 5A1 at the front end of the coated wire 5, by providing the cooling fluid blowing nozzle 18C (cooling fluid blowing device 25) and also providing the cooling device 25A for cooling the cooling fluid Gs to be blown from the nozzle 18C, it is possible to greatly reduce the melting-up of the insulating coating 5B of the coated wire 5, and even in the event the coating 5B should be melted up, it is possible to blow it off, so it is possible to prevent a sphere of the coating 5B from being formed on the coated wire 5 and so prevent defective bonding as noted previously.

Further, by using ionized gas (a deelectrifying fluid) as the cooling fluid Gs it is made possible to remove the electric charge on the coating 5B of the coated wire 5, so electrostatic breakdown of the semiconductor chip caused by electrification of the coating 5B in wire bonding can be prevented effectively.

Moreover, in the bonding technique using the coated wire 5, the metallic ball 5A1 is formed on the front end side in the feed direction of the coated wire 5 and is connected to the external terminal 2C of the semiconductor chip 2, while the rear end side in the feed direction of the coated wire 5 is brought into contact with the inner lead 3B of the lead 3, then the coating 5B of this contact portion is destroyed and the exposed wire 5A is connected to the inner lead 3B, whereby the removal of the coating 5B can be done without using a coating removing torch for removing the coating 5B on the rear end side of the coated wire 5, so it is possible to eliminate such coating removing torch, a device for moving the torch and a controller. As a result, the wire bonding apparatus can be simplified in its construction, thus leading to the reduction of cost in the semiconductor device manufacturing process.

Figure 12:
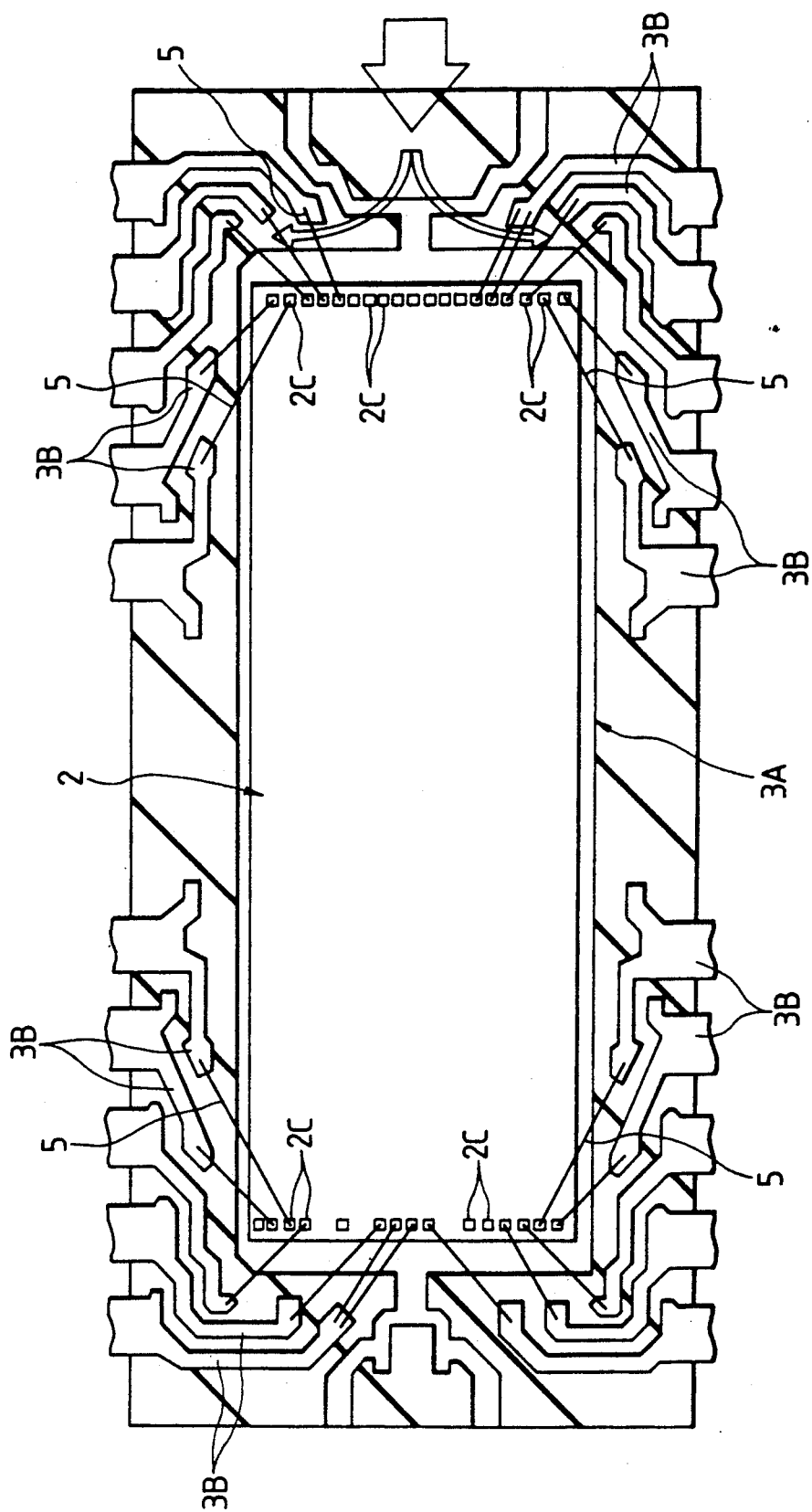
FIG. 12 is a plan view showing an example of wire bonding in the embodiment 1-I.

Further, since wire bonding using the coated wire 5 can be substantially realized, it becomes easy to realize, for example, a memory device wherein external terminals 2C are disposed on both opposed short sides on the semiconductor chip 2 as shown in FIG. 12 and which requires a complicated bonding wiring though the number of external terminals is small, or a highly integrated, high-function microprocessor or logical device having a large number of external terminals and requiring a complicated bonding wiring.

In the resin-sealed type semiconductor device 1 of this embodiment, moreover, by using a heat-resistant polyurethane prepared by the reaction of a polyol component and an isocyanate and containing in the molecular skeleton thereof a constituent unit derived from terephthalic acid, as the insulating coating 5B of the coated wire 5, it is possible to surely prevent tab short-circuit, chip short-circuit or inter-wire short-circuit caused by destruction of the coating 5B due to thermal decomposition of the coating.

More particularly after the bonding of the coated wire 5 as described above, there is performed the resin molding operation using the resin material 6 to produce the resin-sealed type semiconductor device 1. Where the distance between the external terminal 2C of the semiconductor chip 2 and the bonding position of the inner lead 3B of the lead 3 is long as shown in FIG. 12, there may occur a so-called chip touch state in which the coated wire 5 and the silicon area of the semiconductor chip 2 are in contact with each other as shown in FIG. 13, or a so-called tab touch state in which the coated wire 5 and the tab 3A are in contact with each other as shown in FIG. 15, or a so-called interwire touch state in which coated wires 5 are in contact with each other. Such wire touch phenomena are apt to occur when the wire length is 2.5 mm or larger or when the size of the tab 3A is too larger than that of the semiconductor chip 2.

Figure 14:
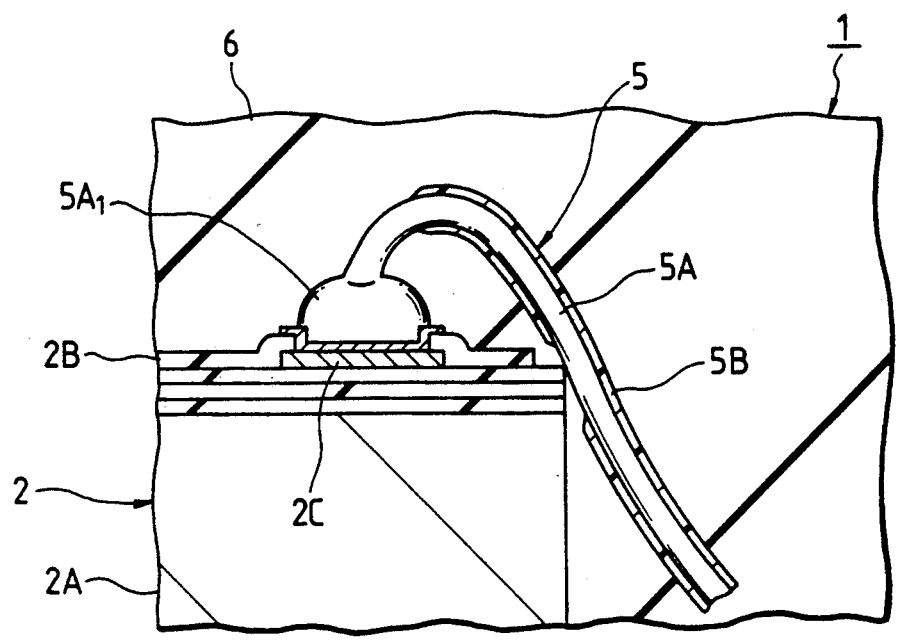
FIG. 14 is an enlarged, partially sectional view showing a chip short circuit state thereof.
Figure 16:
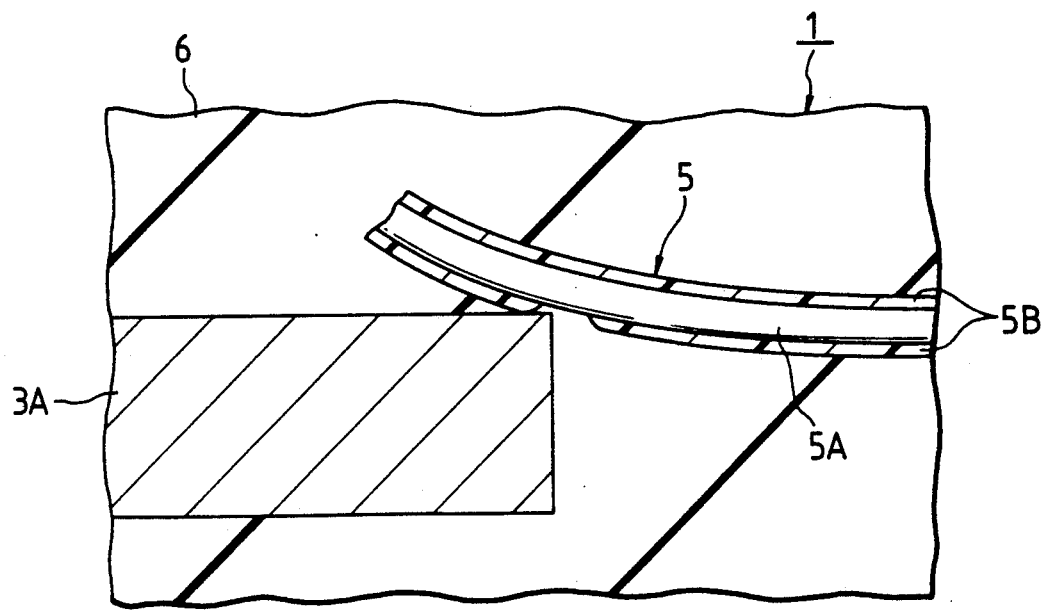
FIG. 16 is an enlarged, partially sectional view showing a tab short-circuit state.

Upon occurrence of a wire touch phenomenon, for example as shown in FIG. 14, the coating 5B of the coated wire 5 will be destroyed by heat deterioration due to the generation of heat from the semiconductor chip 2, so that the wire 5A will come into direct contact with the semiconductor chip 2, thus causing a chip short-circuit between it and the chip 2, or as shown in FIG. 16, there may occur a tab short-circuit between the wire and the tab 3A, or an interwire short-circuit between wires.

In the resin-sealed type semiconductor device 1 of this embodiment, as previously noted, since the coating 5B of the coated wire 5 is formed using a special heat-resistant polyurethane, even in the event of occurrence of the foregoing chip touch, tab touch or interwire touch state, it is possible to positively prevent short-circuiting.

Modifications of the wire bonding method in this embodiment will be described below with reference to FIGS. 26 to 30.

Figure 26:
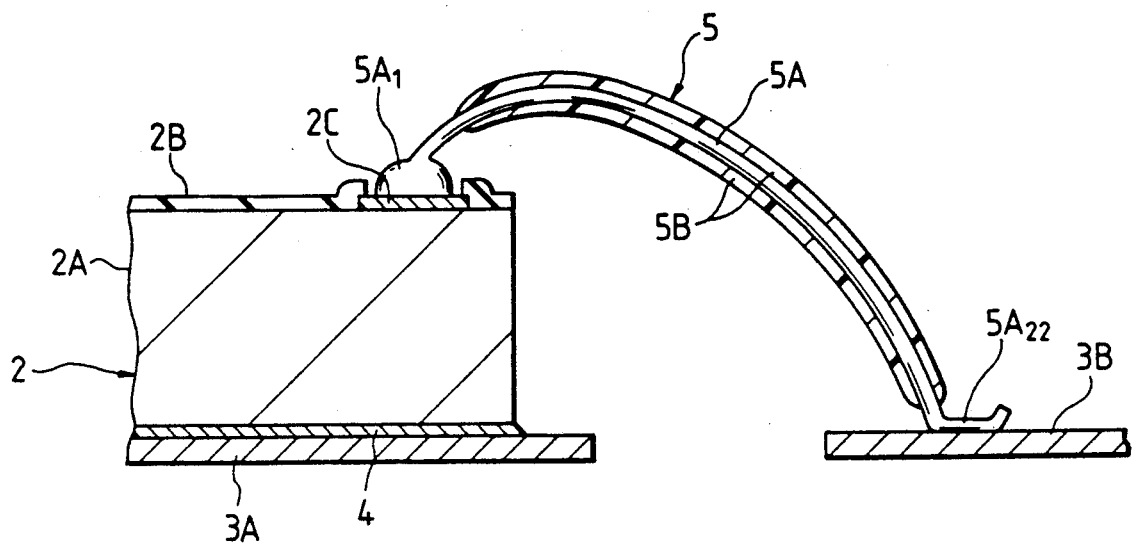
FIGS. 26 to 31 are partially sectional views explanatory of wire bonding states according to modifications in the embodiment 1-I.

In FIG. 26, on the first bonding side of the coated wire 5, there is performed ball bonding in the form of metallic ball 5A1 like the embodiment 1-I, but on the second bonding side, as indicated at 5A22 which denotes a second bonding portion, the coating 5B is removed in advance of the second bonding, which bonding is then performed by thermocompression bonding and/or ultrasonic vibration.

Figure 27:
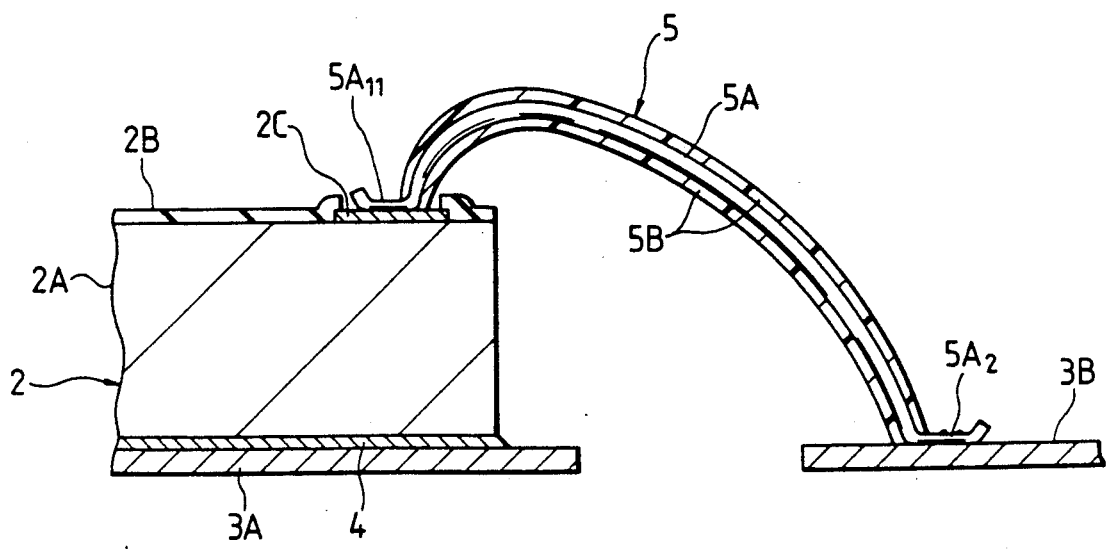

In FIG. 27, bonding is performed at a second bonding portion 5A2 without removing the coating 5B like the embodiment described in connection with FIG. 1, and on the first bonding side there is performed bonding by thermocompression bonding and/or ultrasonic vibration without pre-removal of the coating 5B, not by ball bonding involving the formation of a metallic ball, to form a first bonding portion 5A11. In the modification of FIG. 27, therefore, it is possible to adopt the same bonding method for both first and second bonding.

Figure 28:
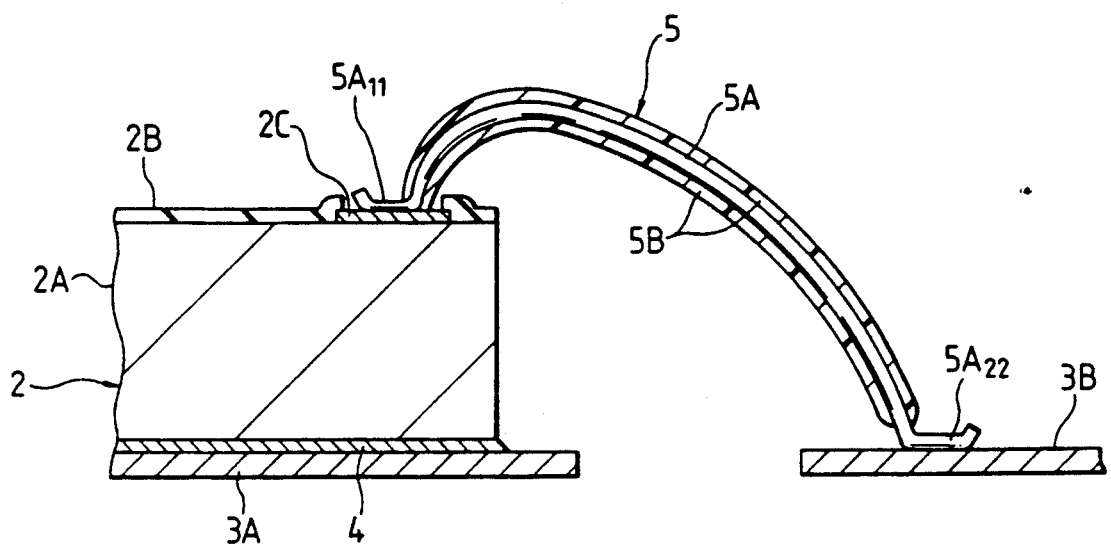

In FIG. 28, bonding at the first bonding portion $5A_{11}$ is carried out in the same manner as in FIG. 27, but bonding at the second bonding portion 5A22 is conducted by the same method as that shown in FIG. 26, that is, without pre-removal of the coating 5B.

Figure 29:
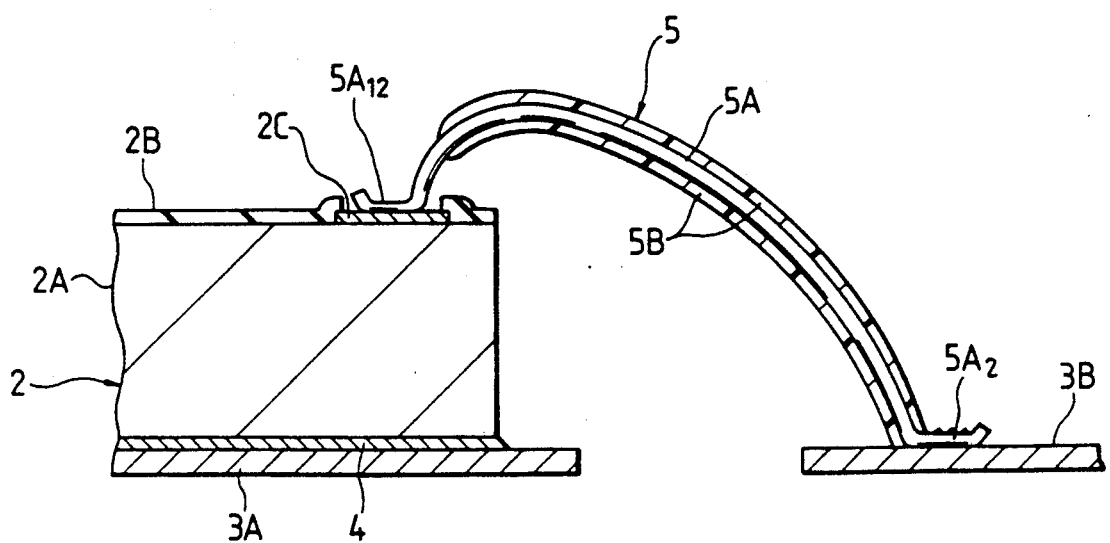

In FIG. 29, the coating 5B is removed in advance of bonding at a first bonding portion 5A12, while bonding at the second bonding portion 5A2 is performed without removal of the coating 5B like FIGS. 1(a) and 27.

Figure 30:
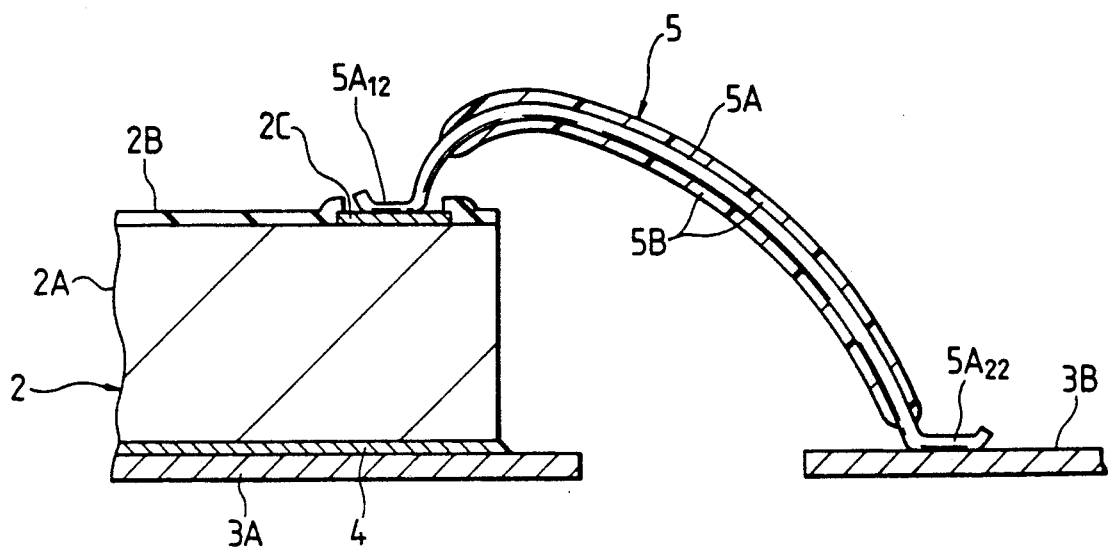

In FIG. 30, the coating 5B is removed beforehand at both the first and second bonding portions 5A12, 5A22, and in this state bonding of the wire 5A is conducted by a method which does not form a ball.

Figure 31:
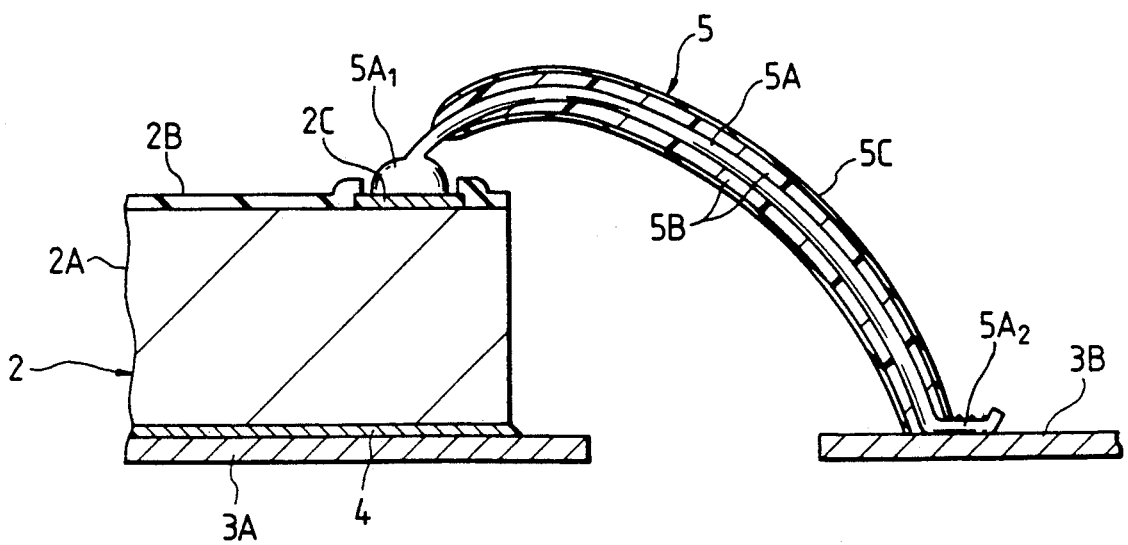

FIG. 31 shows a composite coating structure of the coated wire 5. More specifically, the outer surface of the wire 5A is coated with the coating 5B formed of the heat-resistant polyurethane and the outer surface of the coating 5B is further coated with a second coating 5C formed of an insulating material. As the material of the second coating 5C there may be used, for example, a polyamide resin, a special polyester resin, or a special epoxy resin. The second coating 5C may also be used for the purpose of improving the slipperiness of the coated wire 5 in the bonding tool 16. For this purpose there also may be used nylon or the like as the second protective film 5C.

The thickness of the second coating 5C may be set at a value twice or less, preferably 0.5 times or less, that of the coating 5B.

Although the present invention effected by the present inventors have been described above concretely on the basis of the embodiment 1-I, various other modifications may be made within the scope not departing from the gist of the invention.

For example, although the bonding tool 16 has bee described above with reference to figures using a capillary, there may be used a knife-like wedge. Also in this case, by continuing the application of ultrasonic vibration during the feed of wire between the first and the second bonding, it becomes possible to prevent wire clogging or wire curling or remove any adhered foreign matter 5D. Thus, there can be attained the same effect as above.

Further, the kind and composition of the material for forming the coating 5B or 5C, e.g. polyol component, isocyanate, terephthalic acid, or each compound thereof, as well as the kind and composition of additives, are not limited to those exemplified above.

Figure 32:
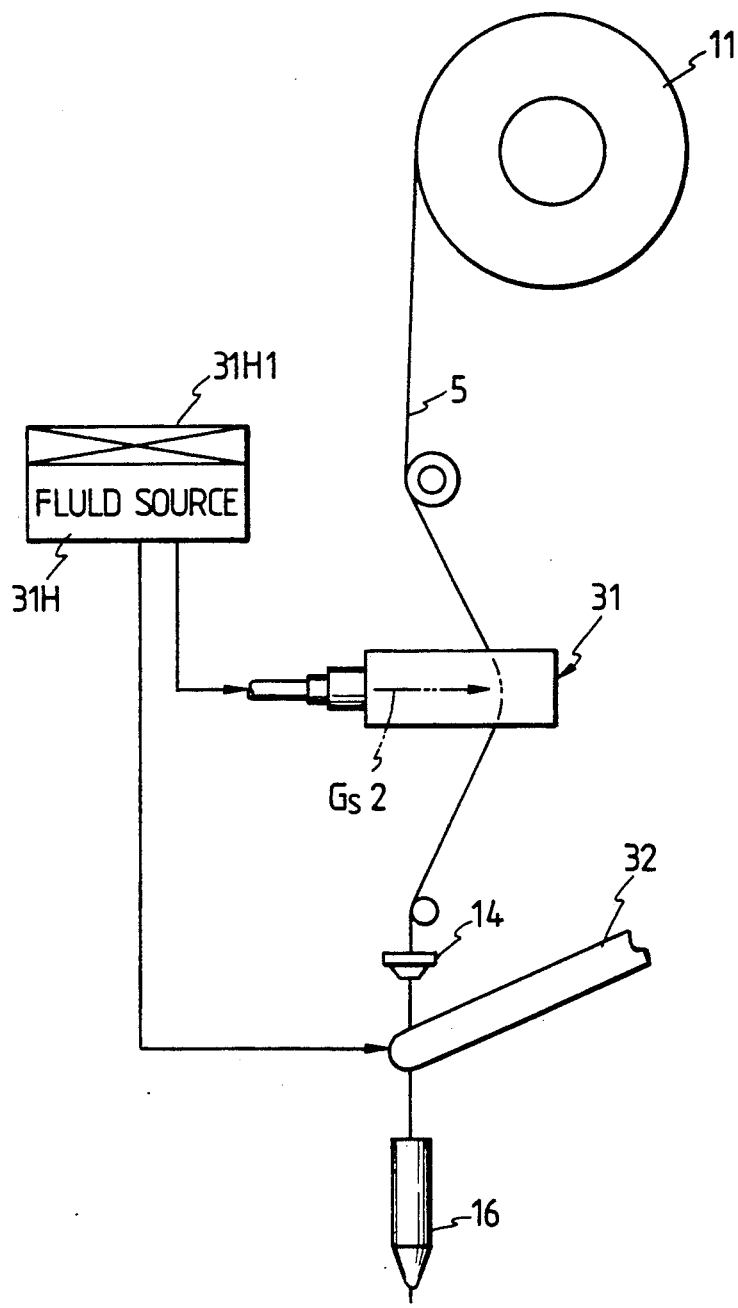
FIG. 32 is an explanatory view showing a path of a coated wire from a wire spool to a bonding tool in a wire bonding apparatus according to an embodiment 1-II of the present invention.
Figure 33:
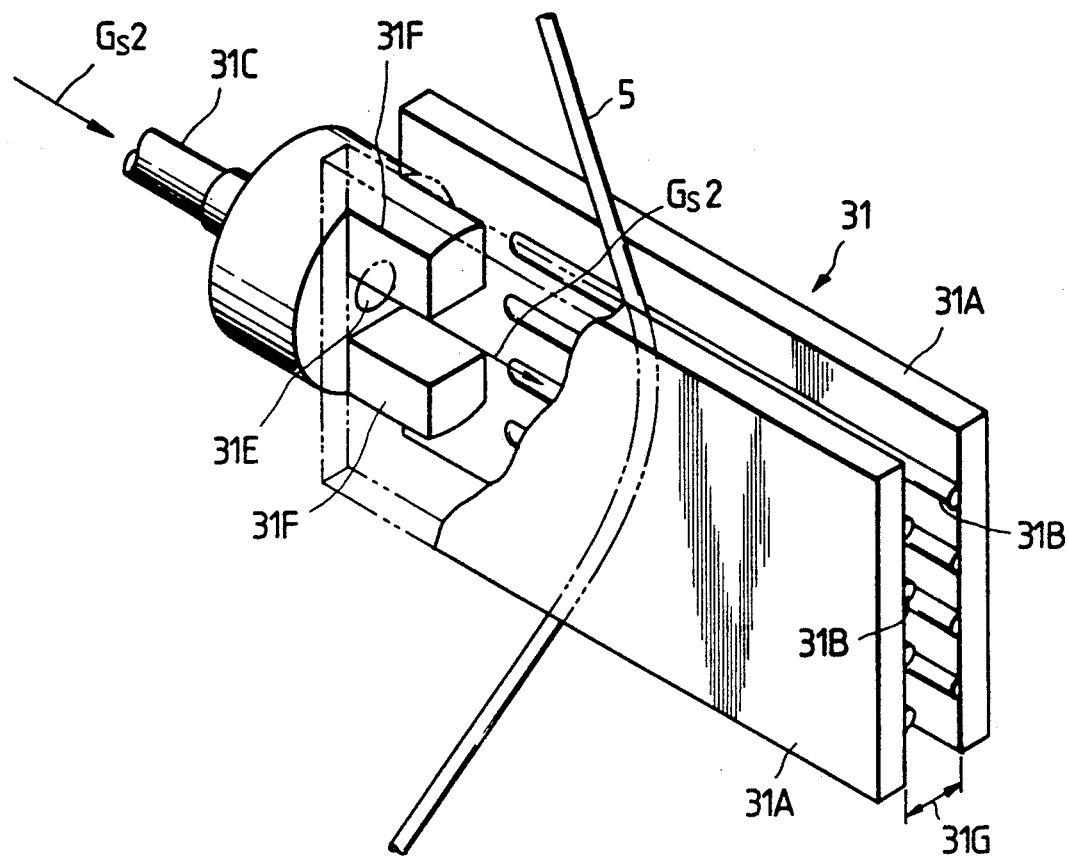
FIG. 33 is a partially cut-away perspective view showing a structure of an air back tensioner used in the embodiment 1-I.
Figure 34:
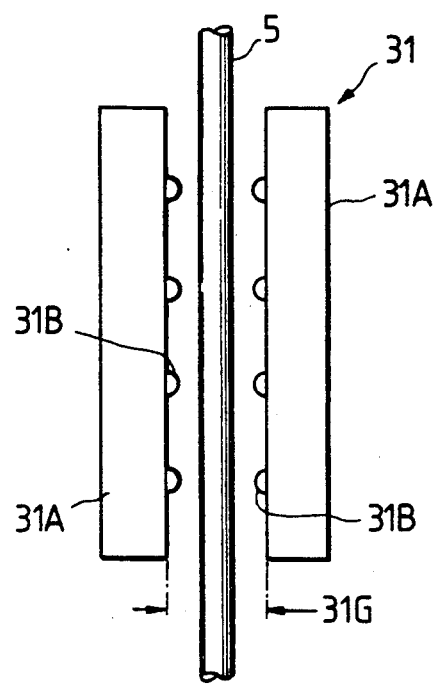
FIG. 34 is a side view showing the shape of an inner peripheral surface of the air back tensioner.
Figure 35:
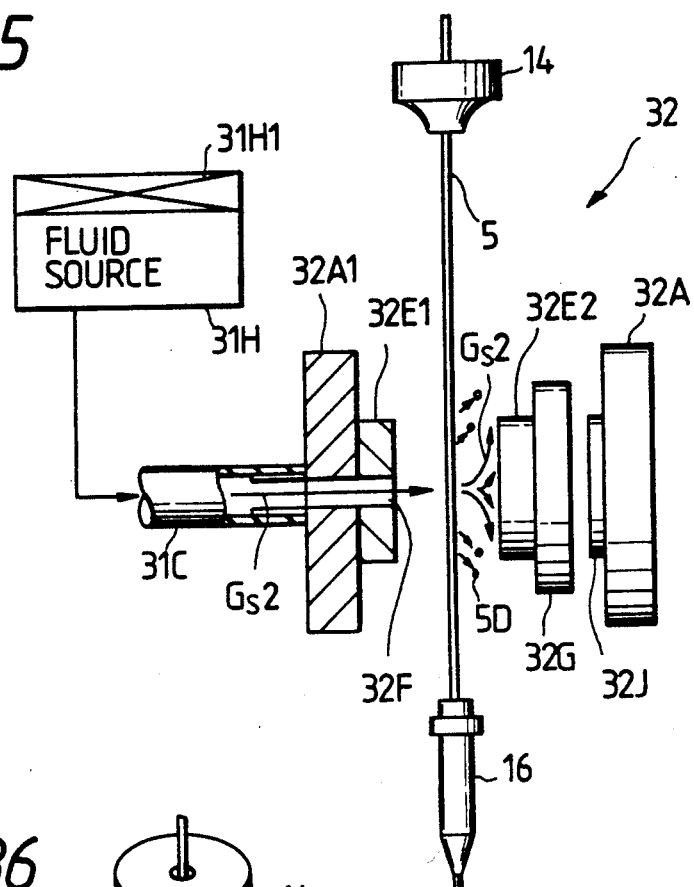
FIG. 35 is a schematic sectional view showing a clamper used in the embodiment 1-II.
Figure 36:
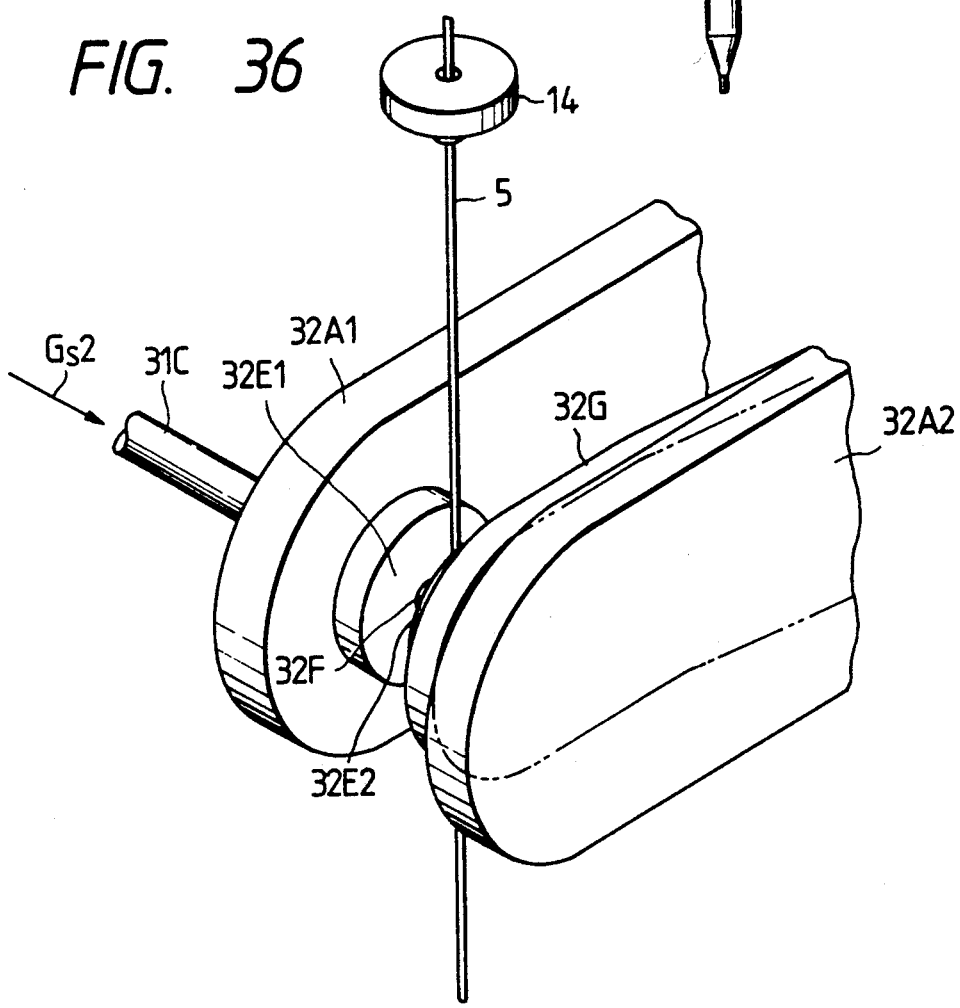
FIG. 36 is an enlarged perspective view showing the clamper and the vicinity thereof.
Figure 37:
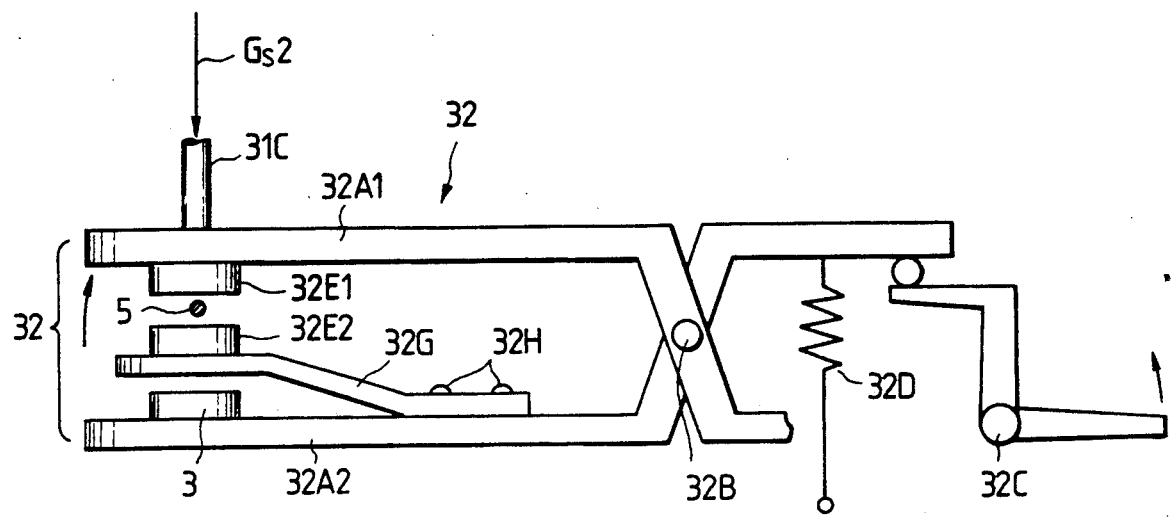
FIG. 37 is a schematic plan view of a clamper driving mechanism.
Figure 38:
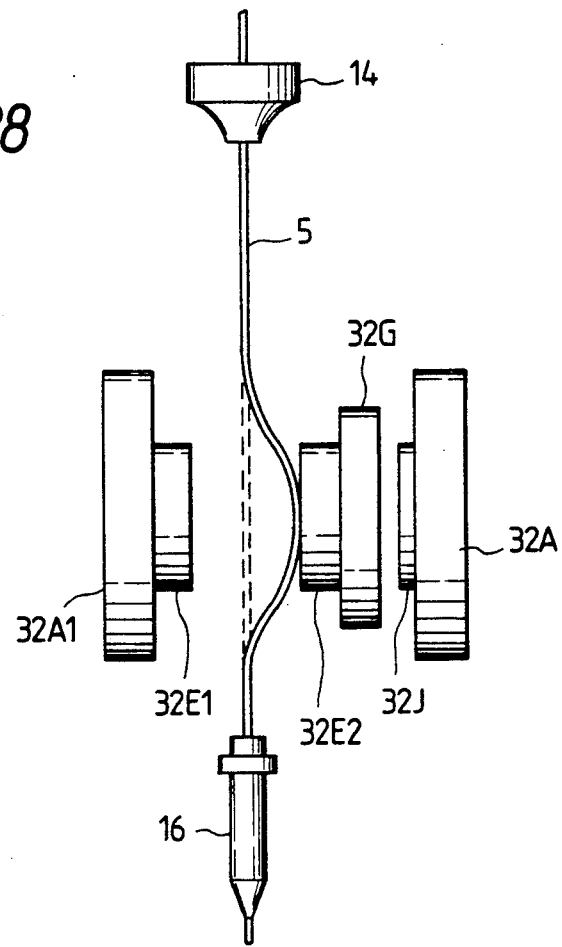
FIG. 38 is a schematic sectional view of a clamper in the prior art for comparison with FIG. 35.
Figure 39:
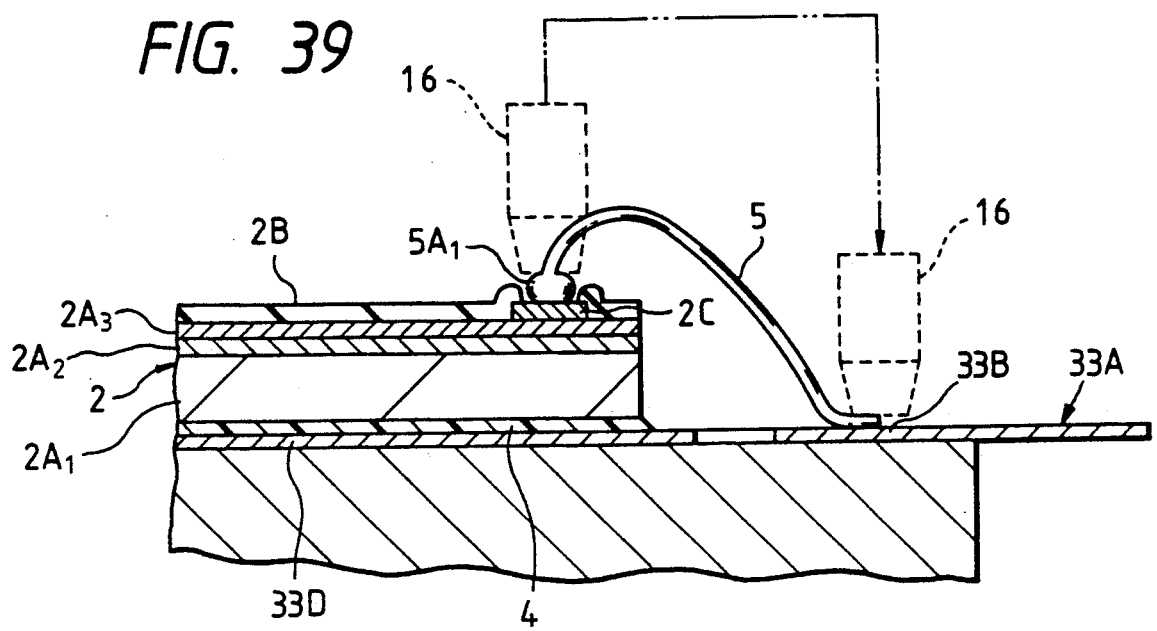
FIG. 39 is an explanatory sectional view showing a wire bonding state in the embodiment 1-II.
Figure 40:
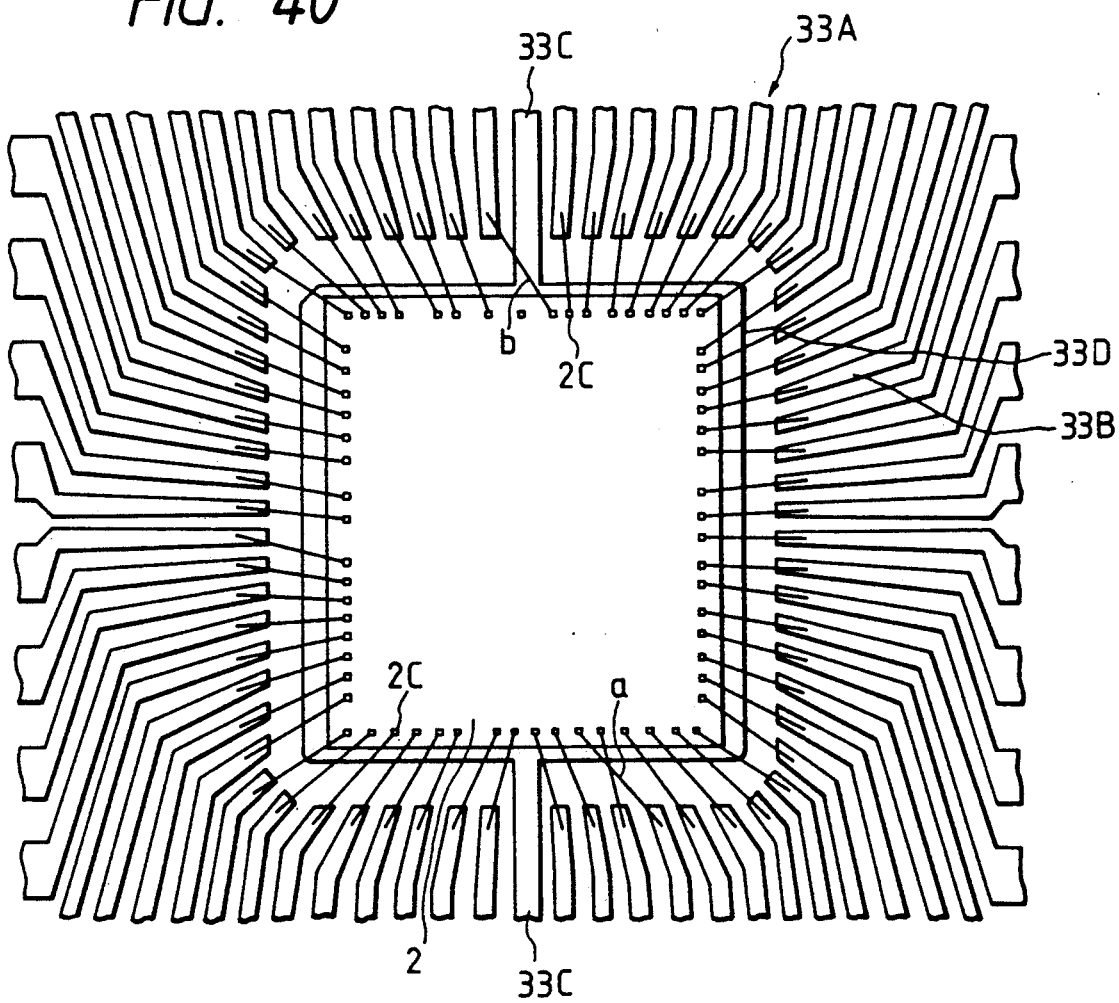
FIG. 40 is an explanatory plan view of a lead frame showing a wire bonding state in the embodiment 1-II.
Figure 41:
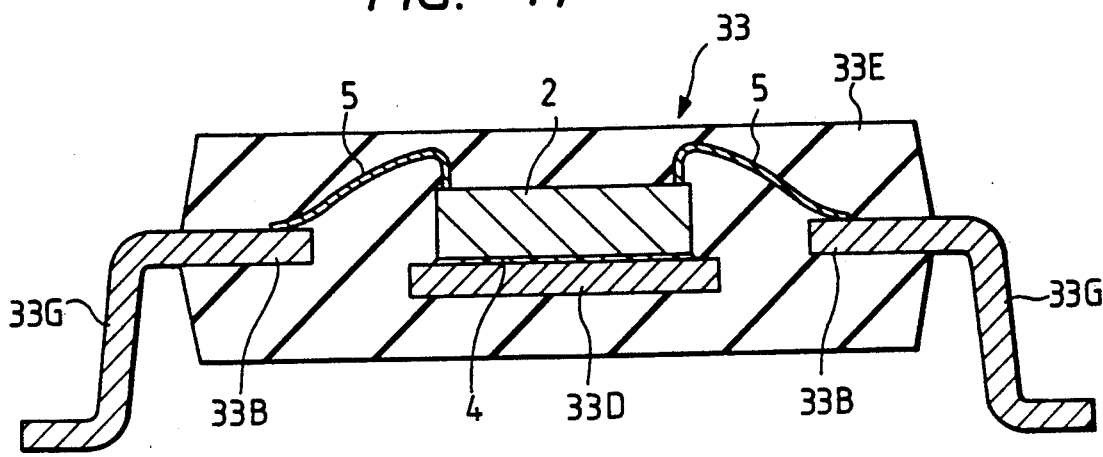
FIG. 41 is an entire sectional view of a resin-sealed type semiconductor device obtained by the embodiment 1-II.

FIG. 32 is an explanatory view showing a path of a coated wire from a wire spool to a bonding tool in a wire bonding apparatus as an assembling apparatus used in an embodiment 1-II of the present invention; FIG. 33 is a partially cut-away perspective view showing a structure of an air back tensioner; FIG. 34 is a side view showing the shape of an inner peripheral surface of the air back tensioner; FIG. 35 is a schematic sectional view showing a clamper; FIG. 36 is an enlarged perspective view showing the clamper and the vicinity thereof; FIG. 37 is a schematic plan view of a clamper driving mechanism; FIG. 38 is a schematic sectional view of a clamper in the prior art for comparison with FIG. 35; FIG. 39 is an explanatory sectional view showing a wire bonding state; FIG. 40 is an explanatory plan view of a lead frame, showing a wire bonding state according to this embodiment; and FIG. 41 is an entire sectional view of a resin-sealed type semiconductor device 33 obtained according to this embodiment.

In this embodiment, the structure of the winding bonding apparatus itself is almost the same as that shown in FIG. 2 in the previous embodiment 1-I, but this embodiment is characterized in that a deelectrifying means provided in the path from the wire spool 11 to the bonding tool 16 is different from that used in the embodiment 1-I.

More specifically, the coated wire 5 fed from the wire spool 11 passes through an air back tensioner 31, a guide 14 and a clamper 32 and is then inserted into the bonding tool 16.

The air back tensioner 31 has a pair of guide plates 31A as shown in FIG. 33. The guide plates 31A may each be obtained by treating the surface of an aluminum alloy plate with anodized aluminum, but at least the surface thereof which comes into contact with the coated wire 5 is constituted by an electroconductive metal, whereby the coated wire 5 can be prevented from being electrically charged during the contact. Further, not only the said contact surface but also the whole of each guide plate 31A may be constituted by stainless steel for example.

On the surface on a wire passage 31G side of each guide plate 31A there are formed a plurality of protuberances 31B in parallel with the long side of the plate as shown in FIG. 34. The protuberances 31B may be formed on the inner peripheral surface of the guide plate 31A by pressing, or rod-like members may be fixed by bonding or adhesion to the inner peripheral surface of the guide plate 31A formed flat.

Thus, in this embodiment the protuberances 31B, which extend in a direction substantially perpendicular to the passing direction of the coated wire 5, is formed on the inner peripheral surfaces of the guide plates 31B, whereby the outer peripheral surface of the coated wire and the inner peripheral surfaces of the guide plates 31A are contacted with each other substantially in a state of dot contact. This reduction in the contact area suppresses friction and so it is possible to prevent the outer peripheral surface of the coated wire 5 from being charged electrically.

To one side ends in the longitudinal direction of both guide plates 31A is attached a metallic adapter 31D which is connected to a fluid feed pipe 31C, with a fluid blow-off port 31E being formed in an end face of the adapter 31D. From the circumference of the fluid blow off portion 31E there project flat spacers 31F, by the thickness of which there is determined the width of the wire passage 31G. The width of the wire passage 31G differs, depending on the diameter of the coated wire 5 used or the height of the protuberances 31B from the inner surfaces of the guide plates 31A, but in this embodiment it is set at about 1 mm.

The fluid feed pipe 31C connected to the adapter 31D is connected at the opposite end thereof to a fluid source 31H. The fluid source 31H contains a corona discharge means 31H1, whereby ionized gas is fed as a deelectrifying fluid Gs2 to the wire passage 31G through the fluid blow-off port 31E of the adapter 31D.

Thus, according to this embodiment, by the supply of the deelectrifying fluid Gs2 to the wire passage Gs2, not only the application of back tension to the coated wire 5 to be done by the air back tensioner 31 can be effected, but also the static electricity charged on the coated wire can be removed at the same time. Further, since the contact between the coated wire 5 and the air back tensioner 31 is substantially a dot contact due to the structure of the protuberances 31B formed on the inner peripheral surfaces of the guide plates 31A as described above, re-electrification of the outer peripheral surface of the coated wire 5 when passing through the air back tensioner 31 is also suppressed.

Below the air back tensioner 31 is disposed a clamper 32 which has such a pair of clampers 32A as shown in FIGS. 36 and 37. The clamper arms 32A can be opened and closed on the front end side thereof by the operation of a cam mechanism 32C with which the clamper arms are engaged on the rear end side through a pivot shaft 32B (FIG. 37). The said pair of clamper arms, indicated by 32A1 and 32A2, are normally urged in a direction to close at their front ends by means of a spring 32D for example. From this state, upon operation of the cam mechanism 32C, the front ends of the clamper arms 32A1 and 32A2 move away from each other, so that the clamper 32 assumes an opened condition.

To the inner surface of the front end of one clamper arm 32A1 (stationary side) is fixed a first clamper chip 32E1 formed of a hard metal such as stainless steel and having a mirror surface formed by chromium plating for example. In a nearly central part of the chip surface of the first clamper chip 32E1 is formed a blow-off port 32F for the deelectrifying fluid Gs2 as shown in FIGS. 35 and 36. The blow-off port 32F is in communication with the fluid feed pipe 31C connected to the fluid source 31H, thus permitting spray of the deelectrifying fluid Gs2 such as ionized gas or nitrogen gas. In the fluid source 31H is incorporated such a corona discharge means 31H1 as referred to in the explanation of the air back tensioner 31.

To the front end of the other clamper arm 32A2 (movable side) is fixed a plate spring-like sub arm 32G having a predetermined elasticity, with its base portion being fixed with bolts 32H for example, and onto the front end of the sub-arm 32G is fixed a second clamper chip 32E2 formed using, for example, ruby. The second clamper chip 32E2 can be removed from the clamper arm 32A2 together with the sub-arm 32G. When the second clamper chip 32E2 was worn out as a result of clamping operations repeated a predetermined number of times, it can be replaced with a new one in the unit of the sub-arm 32G. Due to such a plate spring-like structure of the sub-arm 32G, the loading force imposed on the side of the coated wire 5 at the time of clamping the wire is controlled to prevent the wire from being damaged.

On the back side of the second clamper chip 32E2, that is, to the inner end of the movable clamper arm 32A2, there is fixed a chip-like stopper 32J.

The clamper 32 and the coated wire 5 are in such a positional relation as shown in FIGS. 35 and 36, in which the coated wire 5 being fed from the sprocket 14 to the bonding tool 16 passes nearly the center of the spacing between the opposed chip surfaces of the first and second clamper chips 32E1, 32E2. As shown in FIG. 35, the deelectrifying fluid Gs2 is normally ejected from the blow-off port 32F formed in the chip surface of the first clamper chip 32E1, and as the fluid Gs2 passes the coated wire 5 and the chip surface of the second clamper chip 32E2, the static electricity charged on the coated wire and that on the second clamper chip surface are removed. According to experiments made by the present inventors it has been confirmed that the electric charge removing effect can be attained even by the spraying of nitrogen gas in addition to the foregoing ionized gas as the deelectrifying fluid Gs2.

If only the chip surface of the clamper chip 32E2 is to be deelectrified, it is not always necessary to dispose the blow-off port 32F at the center of the clamper chip surface of the first clamper chip 32E1, but according to such arrangement as in this embodiment it becomes possible to blow the deelectrifying fluid Gs2 also to the side of the coated wire 5. Consequently, not only the static electricity on the coated wire 5 can be removed but also adhered foreign matters 5D such as small pieces adhered to the side of the same wire can be scattered off to make the coated wire clean. In this embodiment, therefore, clogging in the bonding tool 16 caused by the foreign matters 5D adhered to the coated wire 5 can be prevented effectively, so the maintenance period of the bonding tool 16 is prolonged, and consequently it is possible to realize an efficient production of a resin-sealed type semiconductor device 33. In this embodiment 1-II, as described above, the clamper chip 32E2 formed using ruby and attached to the front end of the sub-arm 32G is effectively prevented from being charged with static electricity, so it is possible to prevent the coated wire 5 from being attracted and curled by the clamper chip 32E2 prior to its insertion into the bonding tool 16. More particularly, in the prior art, as shown in FIG. 38, the coated wire 5 is attracted to the clamper chip 32E2 due to the static electricity charged on the clamper chip 32E2 and it will remain curled even when the clamper 32 is opened. If the coated wire 5 is inserted in this state into the bonding tool 16 and wire bonding is performed, the curled shape will also effect the loop shape in the wire bonding, thus resulting in that the bonding strength between the external terminal 2C (bonding pad) or the inner lead 33B and the coated wire 5 is deteriorated or there occurs wire-flow in resin molding due to loop trouble. Further, as a result of the coated wire 5 being attracted by the electrically charged clamper chip 32E2, the delivery of the coated wire 5 from the bonding tool 16 is not performed smoothly at the time of wire bonding. Consequently, as explained also at the beginning of this specification, an extra resisting force is exerted on the bonding tool 16 during descent of the tool, so when the coated wire 5 is stretched while being drawn out from the front end of the bonding tool 16, the breakage of the coated wire or loop trouble is likely to occur. In this connection, according to this embodiment 1-II, since the clamper chip 32E2 is surely deelectrified, the coated wire 5 is prevented from being attracted to the clamper chip surface, so that the coated wire 5 is inserted into the bonding tool 16 in an upright condition and that smoothly as shown in FIGS. 35 and 36.

Therefore, defective bonding caused by loop trouble due to breaking or curling of the coated wire 5 is prevented effectively. According to studies made by the present inventors, the attraction for the coated wire 5 caused by electrification of the clamper chip 32E2 (FIG. 38) is a phenomenon conspicuous in such a coated wire 5 as has the same structure as that explained in the embodiment 1-I, but it turned out that the said phenomenon was very likely to occur not only in such coated wire 5 but also in the use of an uncoated wire such as gold (Au), aluminum (Al) or copper (Cu) wire.

The structure of the resin-sealed type semiconductor device 33 assembled in this embodiment 1-II will be described below briefly.

In this embodiment 1-II the resin-sealed type semiconductor device 33 is provided in its state before assembly, that is, in the state of a lead frame 33A. FIG. 40 shows a completed state of wire bonding, but using this figure for convenience's sake, the construction of the inner leads 33B portion of the lead frame 33A will now be described. As shown in the same figure, the lead frame 33A has inner leads 33B which extend in four planar directions centered on and not in contact with a tab 33D supported substantially centrally by tab suspending leads 33C. The inner leads 33B are in contact with one another through a frame (not shown) at their outer peripheral portions shown in the same figure. The lead frame 33A is obtained by pressing or etching a plate member about 0.15 mm thick such as, for example, a Kovar, 42 alloy or nickel alloy plate and then forming the plate into such a shape as shown in FIG. 40.

Onto the tab 33D is fixed a semiconductor chip 2 through a bonding material 4 such as, for example, silver paste, silicon paste or gold foil applied in a thickness of about 30 μm. Over the semiconductor chip 2 is formed a microprocessor or a logical circuit through oxidation and diffusion steps using a photoresist technique though not shown. A schematic construction of the internal layers of the semiconductor chip 2 will now be described briefly. A chip substrate 2A1 about 400 μm thick is formed using silicon (Si), over which is formed a silicon oxide film 2A2 about 0.45 μm thick. Further, over the silicon oxide film 2A2 is formed a PSG film 2A3 about 0.3 μm thick as an interlayer insulating film, over which is formed a passivation film 2B about 1.2 μm thick as a top, protective film. Part of the passivation film 2B is opened, to which is exposed the upper surface of an underlying, partially formed, external terminal 2C of aluminum about 0.8 μm thick.

The wire bonding procedure in this embodiment will be described below. In the following description, the other wire bonding apparatus than that illustrated in FIG. 32 are of the same structure as that shown in FIG. 2 which was explained in the previous embodiment 1-I.

When the lead frame 33A is fixed in a predetermined position onto a bonding stage 17, the heat from heater 26 mounted within the bonding stage 17 is transmitted to the lead frame 33A, whereby the lead frame 33A and the semiconductor chip 2 are heated to a predetermined temperature required for bonding.

Then, the XY table 23 operates to move the bonding head 22 a predetermined distance, whereby the bonding tool 16 is stopped in a position just above the semiconductor chip 2 on the lead frame 33A.

At this time, the clamper 32 grips the coated wire 5 sideways, whereby the position of the coated wire is fixed.

Subsequently, as shown in FIG. 8 (a schematic construction diagram explanatory of a principle of forming a metallic ball 5A1), the electric torch 18D is moved up to a position close to the wire 5A at the front end in the feed direction of the coated wire 5 to generate arc Ac between the two to thereby form a metallic ball 5A1. Then, ultrasonic vibration is applied to the bonding tool 16 and the front end of the bonding tool is pressed against the external terminals 2C of the semiconductor chip 2. As a result, the metallic ball 5A1 is bonded onto the external terminal 2C by virtue of a synergistic effect of the heating by the heaters 26 and the said ultrasonic vibration (first bonding).

Then, upon operation of the cam mechanism 32C in the clamper 32, the clamper arms 32A1 and 32A2 assume an opened condition, whereby the coated wire 5 is released from the clamper 32.

At this time, in this embodiment, by blowing off of the deelectrifying fluid Gs2 from the blow-off port 32F of one clamper chip 32E1, the static electricity charged on the other clamper chip 32E2 is removed positively, so the coated wire 5 can be inserted in a substantially rectilinear condition into the bonding tool 16 without such curling thereof as shown in FIG. 38 which occurs in the prior art.

In this state, the vertically movable block 22B in the bonding head 22 and the XY table 23 are each moved a predetermined distance in respective directions, whereupon the bonding tool 16 moves while delivering the coated wire 5 from the front end thereof so that the coated wire describes a loop (see FIG. 39). The coated wire 5 thus delivered from the front end of the bonding tool 16 is fed from the wire spool 11 and reaches the bonding tool 16 through the air back tensioner 31 and the clamper 32. During this period, as shown in FIGS. 33 and 35, blowing of the deelectrifying fluid Gs is performed in the air back tensioner 31 and the clamper 32. During this period, moreover, such application of ultrasonic vibration to the bonding tool 16 as that described in the embodiment 1-I may be continued, or it may be discontinued except when bonding is performed.

Next, when the vertically movable block 22B is moved again downwards, the front end of the bonding tool 16 with the coated wire 5 drawn out therefrom comes into contact with the surface of an inner lead 33B, whereupon the ultrasonic wave oscillation mechanism 22H is operated to apply ultrasonic vibration again to the front end of the bonding tool 16, whereby at the underside of the coated wire 5 the coating 5B is rubbed against the surface of the inner lead 33B, resulting in that the coating 5B is partially destroyed and removed by the ultrasonic energy and so the inner wire 5A comes into contact with the surface of the inner lead 33B. In this state, the application of the ultrasonic vibration is continued, whereby the wire 5A and the inner lead 33B are bonded together (second bonding) as shown in FIG. 39.

Next, the clamper 32 is closed to grip the coated wire 5 above the bonding tool 16, and upon upward movement of the vertically movable block 22B, the coated wire 5 is cut between its bonded part and the bonding tool 16. Now, one cycle of the wire bonding operation is over.

The above wire bonding operation is repeated a predetermined number of cycles between all the external terminals 2C (bonding pads) on the semiconductor chip 2 and the corresponding inner leads 33B, whereby the wire bonding process in this embodiment is completed.

Thus, in this embodiment 1-II, the static electricity charged on the coated wire 5 and that on the clamper chip 32E2 are removed by the deelectrifying fluid Gs2 from the air back tensioner 31, whereby the attraction for the coated wire is prevented and any adhered foreign matter 5D is removed, so that the breaking of the coated wire 5, loop trouble, and clogging of the bonding tool, are surely prevented.

Thus, in this embodiment 1-II it is substantially possible to effect wire bonding using the coated wire 5, so it becomes possible to effect cross bonding in the position indicated at a in FIG. 40, thus permitting implementation of a highly integrated, high-function type microprocessor or logical element.

In the position indicated at b in FIG. 40 the coated wire 5 is bonded while spanning a tab suspending lead 33C, so it is very likely that the coated wire 5 and the tab suspending lead 33C will come into contact with each other. However, even in the event of contact of the coated wire with the lead 33C, only the coating 5B of the coated wire contact the lead 33C in this embodiment and thus electrical short-circuit is prevented. Thus, according to this embodiment 1-II it is possible to effect wire bonding which has been difficult to be attained by the prior art using uncoated wire.

After completion of the above wire bonding process, the lead frame 33A is placed in a mold (not shown) and a synthetic resin in a molten condition is poured into the mold under a high pressure, whereby there is formed a package body 33E (see FIG. 41) of the resin-sealed type semiconductor device 33. At this time, in the event there is any trouble such as curling in the loop shape of the coated wire 5 after bonding, it becomes more likely that coated wires 5 will contact together (wire short-circuit) or a coated wire 5 and the tab 33D will contact together (tab short-circuit), under the synthetic resin injection pressure. According to this embodiment, however, the coated wire 5 is deelectrified in the air back tensioner 31 and the clamper chip 32E2 is also deelectrified in the wire bonding process as previously noted, whereby when the coated wire 5 passes various components, including the clamper 32, it is prevented from being attracted to those components, and the adhesion of foreign matters thereto is also prevented effectively. Consequently, defective bonding such as the breaking of wire and trouble in the wire loop shape are prevented to ensure a highly reliable wire bonding.

After the injected synthetic resin was cooled and hardened, the lead frame 33A now having the package body 33E is taken out from the mold.

Next, the outer leads 33G projecting from the package body 33E are processed into an electrically separated, independent state and bent at a predetermined angle, whereby there is obtained the resin-sealed type semiconductor device 33 shown in FIG. 41.

Although the invention accomplished by the present inventors has been described above concretely on the basis of the embodiment 1-II, it goes without saying that the present invention is not limited thereto and that various modifications may be made within the scope not departing from the gist of the invention.

For example, although in the above description the blowing of the deelectrifying fluid Gs2 from the blow-off port 32F is performed continually during the wire bonding operation, the blowing cycle may be controlled to a predetermined time. It goes without saying that when inserting the coated wire 5 again into the bonding tool 16 during maintenance of the apparatus, the blowing of the deelectrifying fluid Gs2 from the blow-off port 32 is stopped.

Further, although in the above embodiments there was used ionized gas obtained by corona discharge or nitrogen gas as the deelectrifying fluid Gs2, this fluid is not limited to them. There may be used other fluids which exhibit a deelectrifying effect. For example, there may be adopted a deelectrifying means using radiation such as alpha or beta ray, or ultraviolet ray, or even such liquid as water which is also known to permit the removal of static electricity.

Although in the above description the present invention was applied mainly to winding bonding apparatus of a so-called combined type of thermocompression bonding and ultrasonic bonding, which is a utilization field of the invention, no limitation is placed thereon. For example, the present invention is applicable also to an ultrasonic bonding type wire bonding apparatus.

The following is a brief description of effects attained by typical inventions out of those disclosed in the above embodiments.

By applying ultrasonic vibration to the bonding tool continuously during wire bonding between electrodes in the semiconductor device assembling process, it becomes possible to remove foreign matters in the bonding tool vibrationwise, so it is possible to prevent clogging of the bonding tool effectively.

By permitting the removal of electric charge on the coated wire it is made possible to prevent the breaking of the coated wire, loop trouble and clogging of the bonding tool in the wire bonding operation.

Since it is possible to attain a complicated connection shape such as cross bonding, using coated wires, it is possible to implement a highly integrated, high-function type semiconductor device as a microprocessor or logical element.

By using a deelectrifying fluid as the feed fluid in the air back tensioner it is possible to effect both the application of back tension to wire and the removal of electric charge from the wire surface simultaneously, whereby the wire can be prevented from being electrically charged without complicating the apparatus structure.

By the removal of electric charge on the clamper chip surface it is possible to prevent wire from being attracted to the same surface which is caused by electrification on the assembling apparatus side regardless of whether the wire is coated or uncoated, so it is possible to effectively prevent loop trouble, disconnection and clogging of the bonding tool.

Consequently, the bonding efficiency in the resin-sealed type semiconductor device assembling process can be enhanced, whereby it becomes possible to provide a highly integrated, high-function type semiconductor device of high reliability.

(2) Embodiment 2

Figure 43:
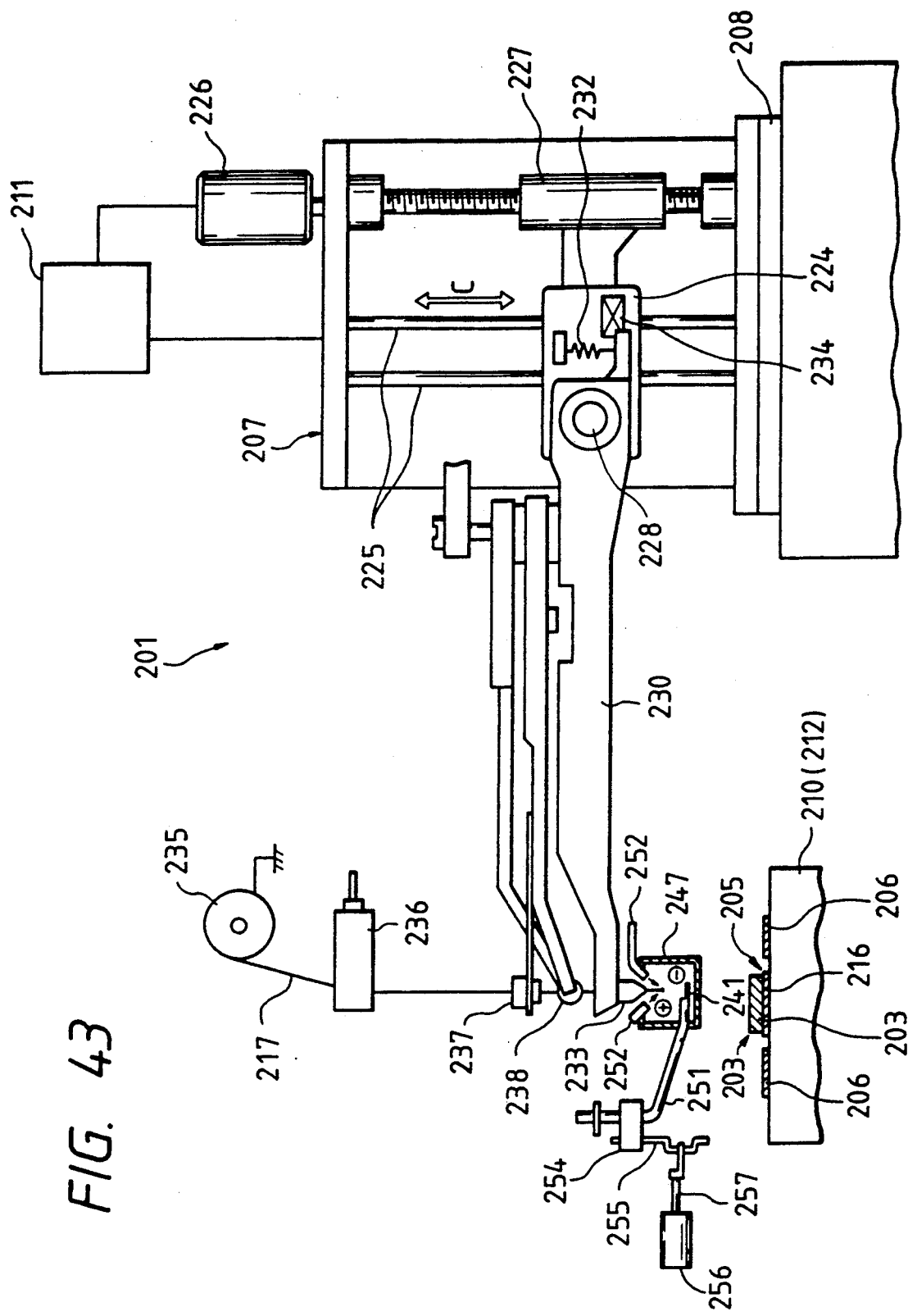
FIG. 43 is a schematic entire view of a wire bonding apparatus.
Figure 44:
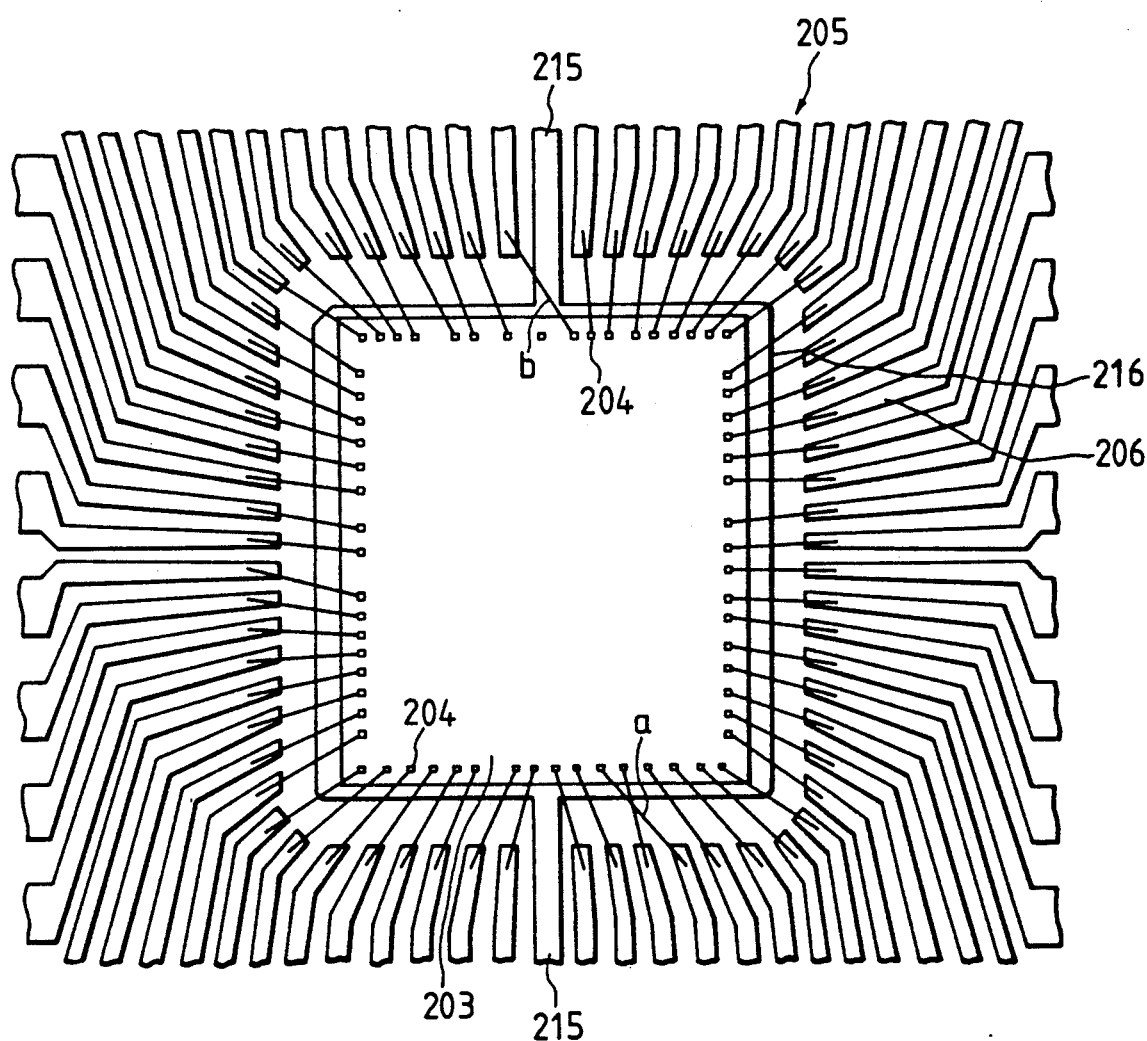
FIG. 44 is a plan view of a lead frame used in the embodiment-2.
Figure 45:
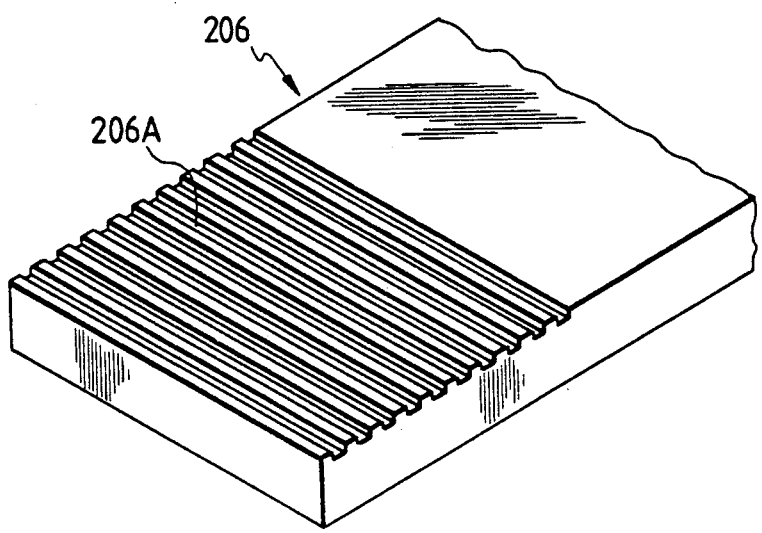
FIG. 45 is an enlarged, partial perspective view showing the state of the surface of an inner lead used in the embodiment-2.
Figure 46:
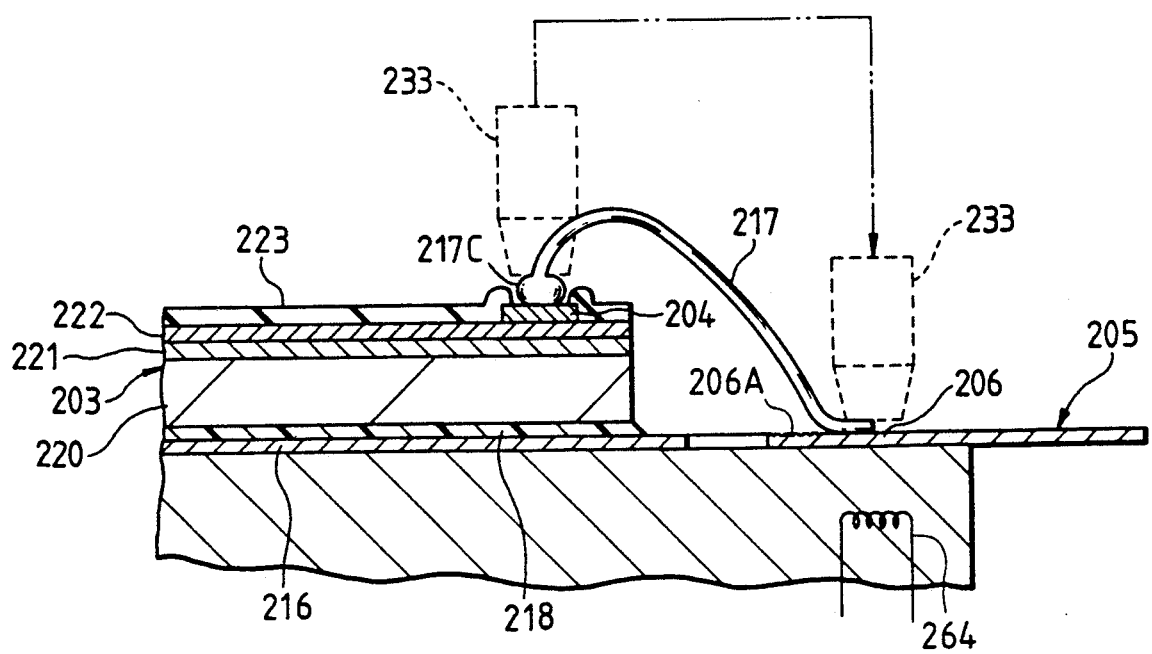
FIG. 46 is an explanatory sectional view showing a structure of a semiconductor chip.
Figure 47:
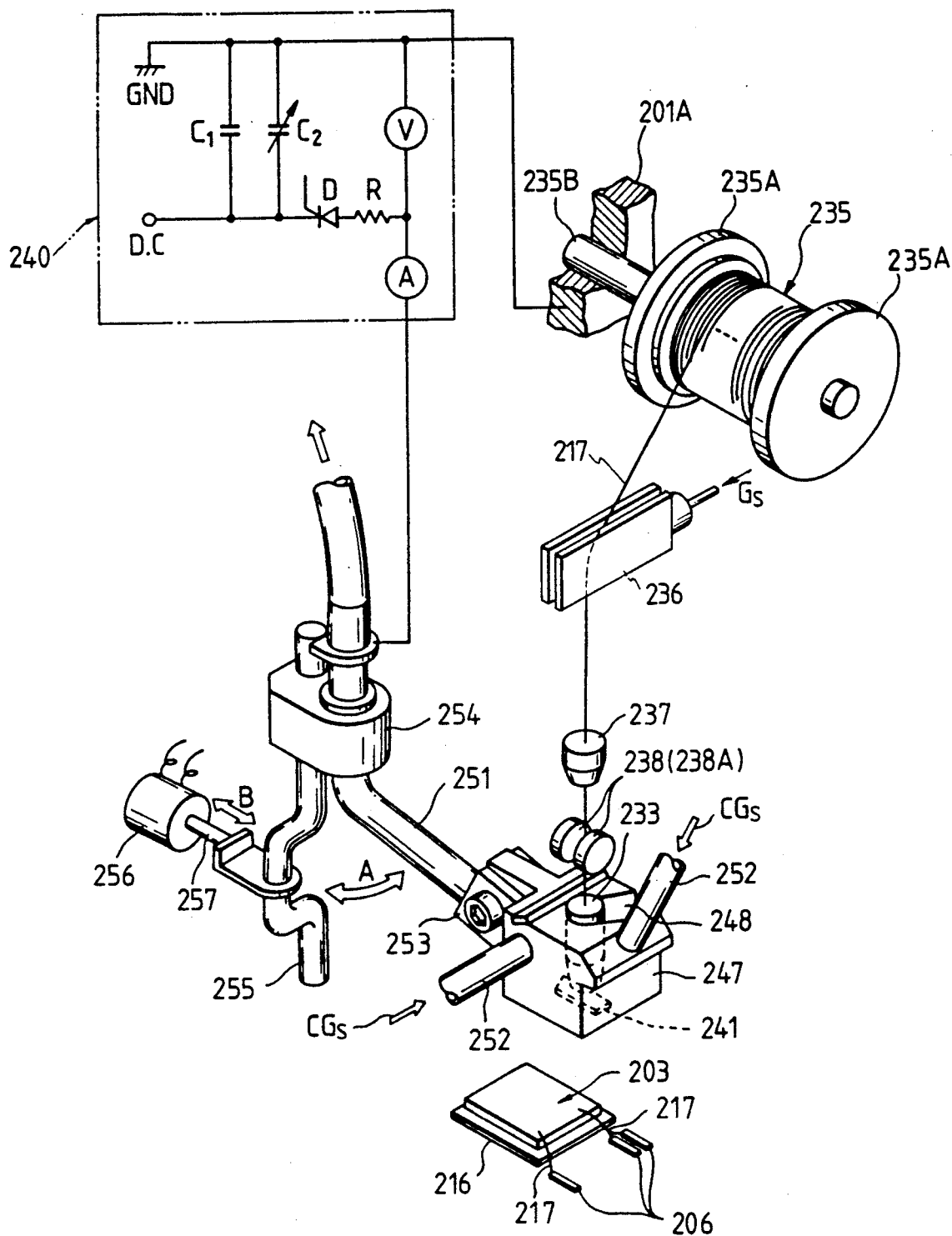
FIG. 47 is a perspective view showing a wire feed system.
Figure 48:
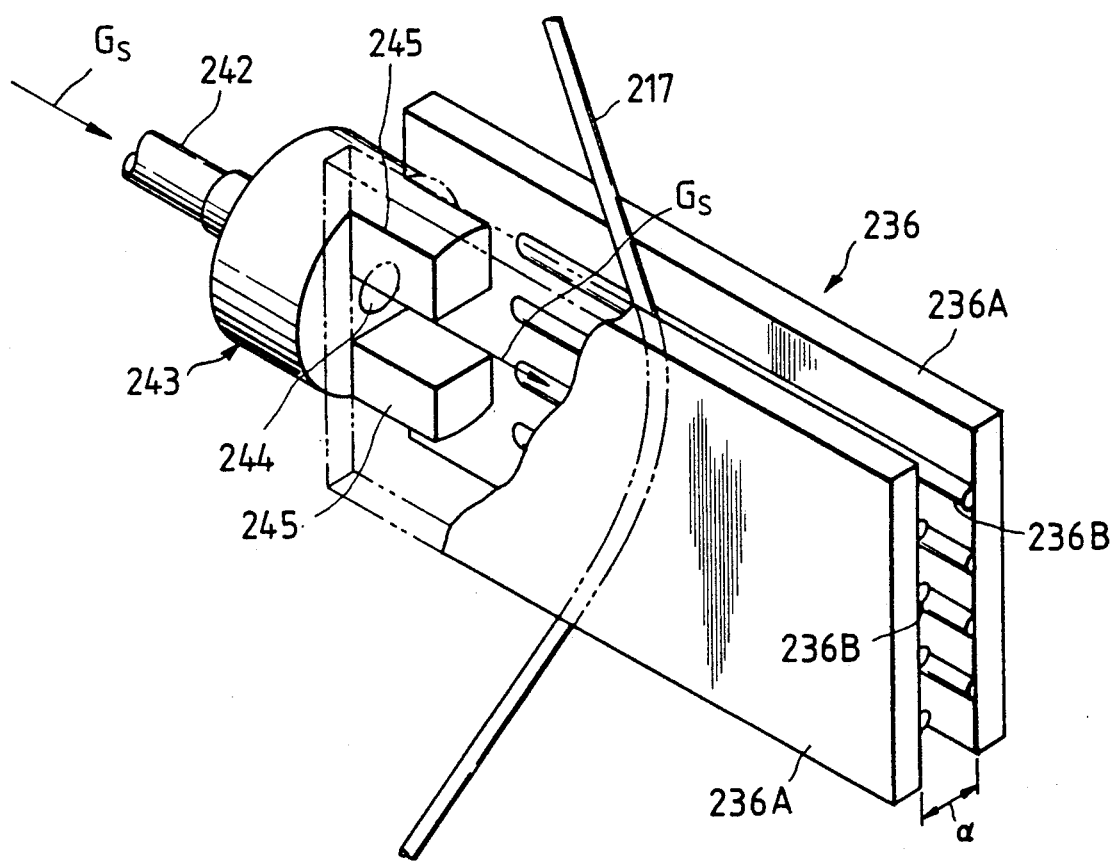
FIG. 48 is an enlarged perspective view showing a principal portion of an air back tensioner used in the embodiment-2.
Figure 49:
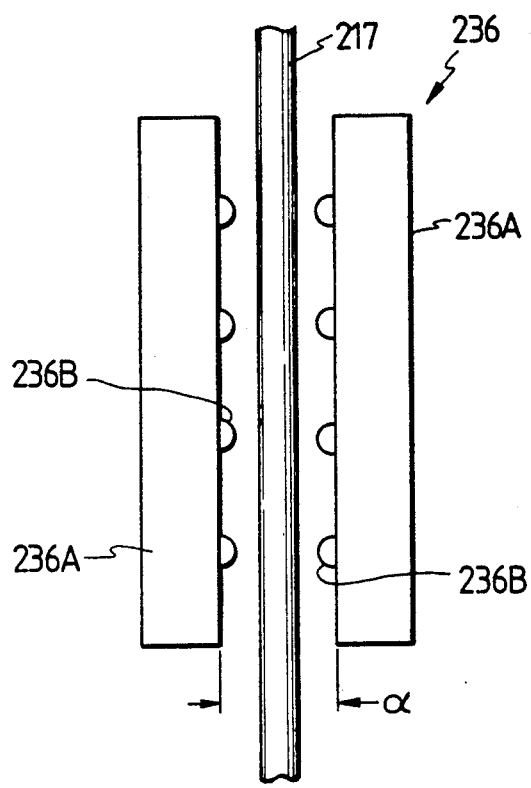
FIG. 49 is a front view of the said air back tensioner.
Figure 51:
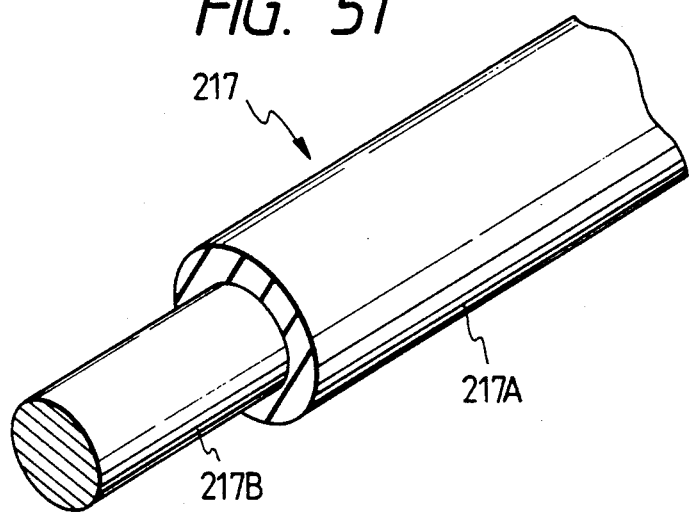
FIG. 51 is a sectional perspective view showing a structure of a coated wire.
Figure 50:
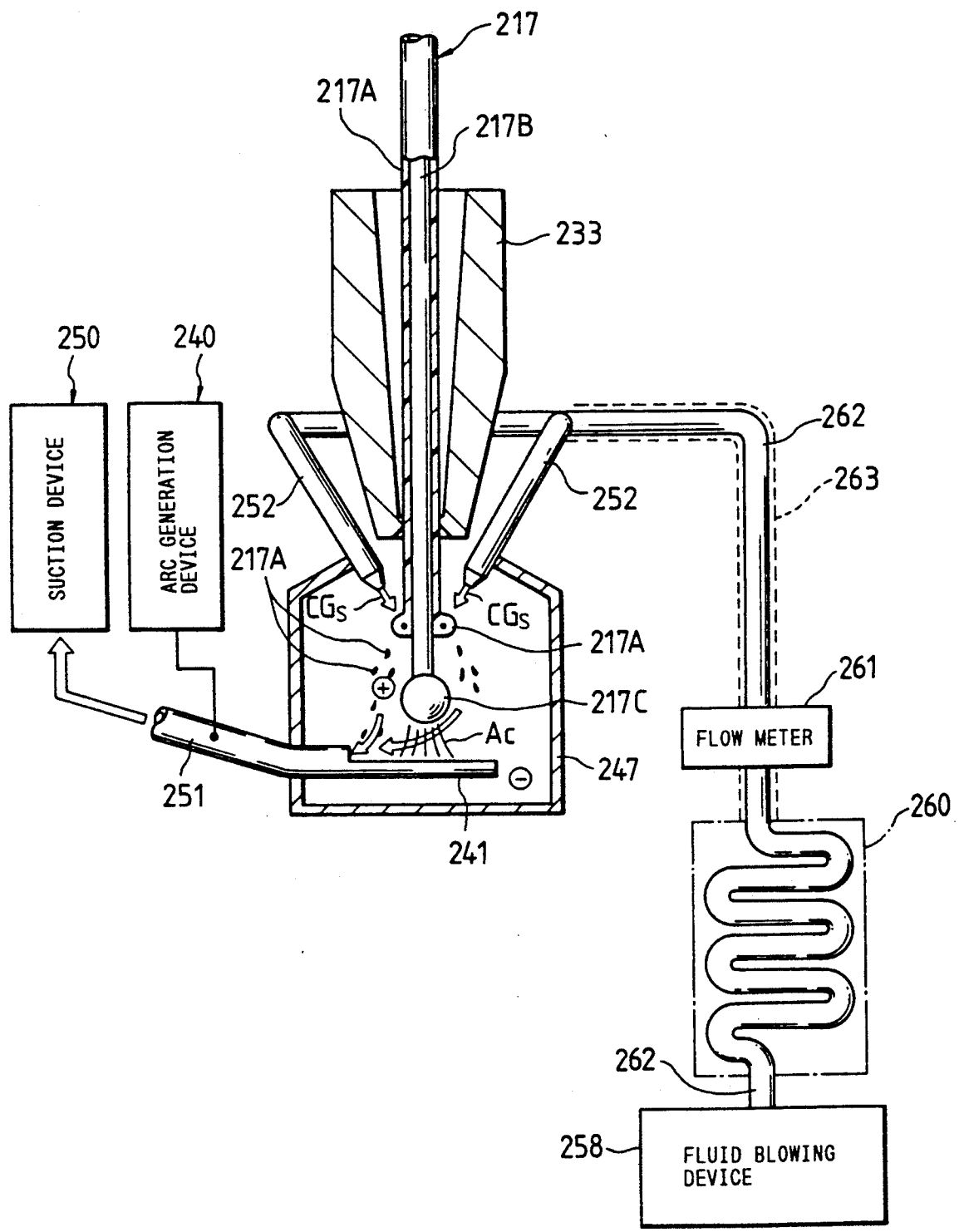
FIG. 50 is an explanatory view showing an arranged state of mechanisms in the vicinity of the bonding tool.
Figure 52:
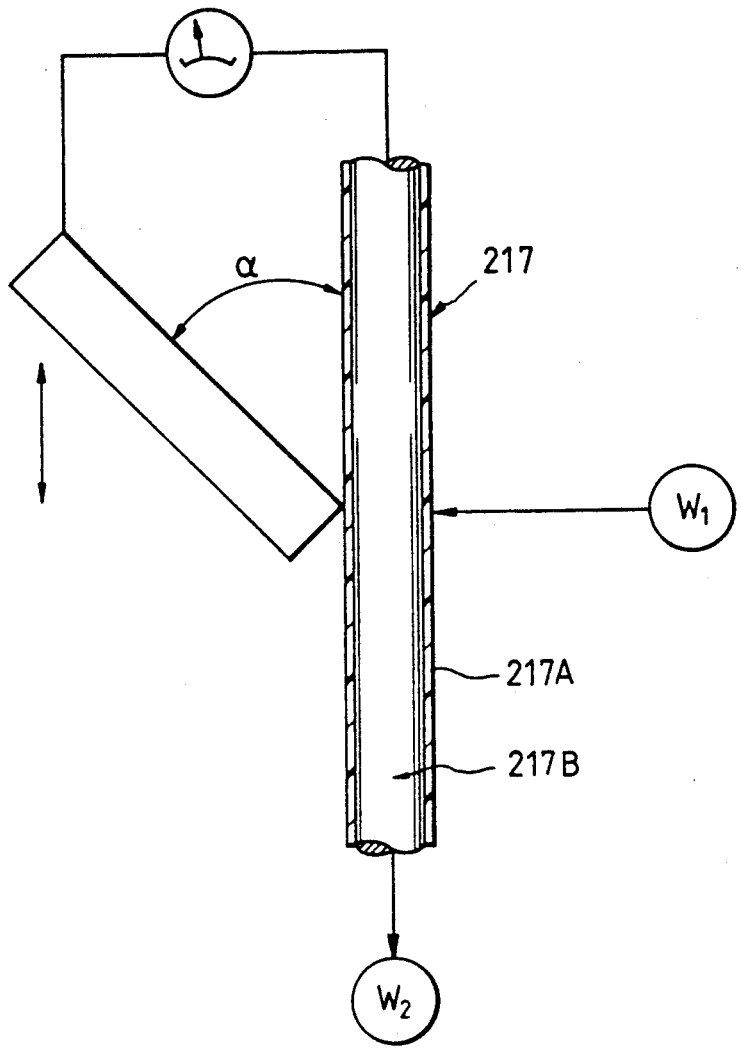
FIG. 52 is an explanatory view of an abrasion test.

FIG. 42 is an explanatory view showing the state of application of ultrasonic energy to a bonding tool in a semiconductor device assembling process according to an embodiment 2 of the present invention; FIG. 43 is a schematic entire view of a wire bonding apparatus; FIG. 44 is a plan view showing a lead frame used in this embodiment; FIG. 45 is an enlarged, partial perspective view showing the state of the surface of an inner lead used in this embodiment; FIG. 46 is an explanatory sectional view showing a structure of a semiconductor chip; FIG. 47 is a perspective view showing a wire feed system; FIG. 48 is an enlarged perspective view showing a principal portion of an air back tensioner used in this embodiment; FIG. 49 is a front view of the air back tensioner; FIG. 50 is an explanatory view showing an arranged state of mechanisms in the vicinity of the bonding tool; FIG. 51 is a sectional perspective view showing a structure of a coated wire; FIG. 52 is an explanatory view of an abrasion test; and FIG. 53 is a sectional view showing an entire construction of the semiconductor device.

Figure 53:
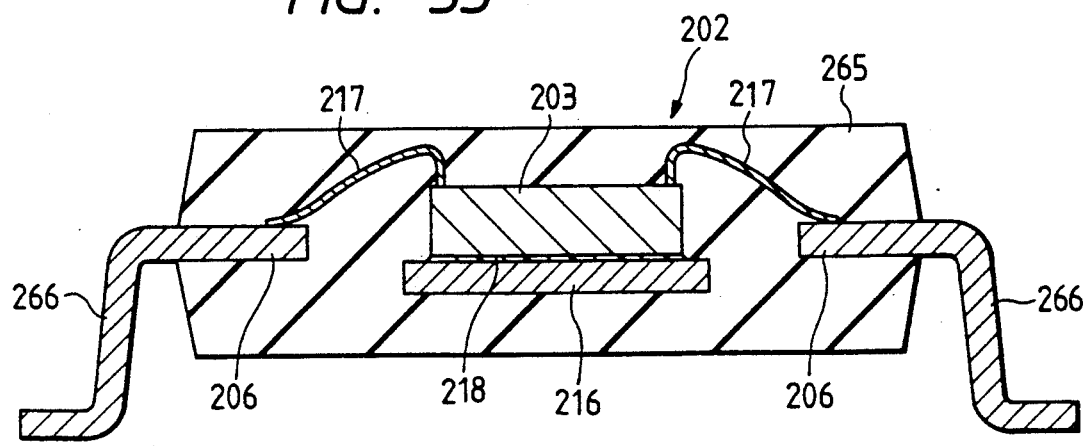
FIG. 53 is a sectional view showing an entire construction of the semiconductor device.

A wire bonding apparatus 201 according to this embodiment is used for electrical connection between external terminals 204 on a semiconductor chip 203 and inner leads 206 (inner end electrodes) of a lead frame 205 in assembling a resin-sealed type semiconductor device 202 of, for example, such a resin-sealed package structure as shown in FIG. 53.

The wire bonding apparatus 201, whose construction is schematically illustrated in FIG. 43, has an XY stage 208 with a bonding head 207 carried thereon as a drive mechanism, a bonding stage 210 on which is placed the lead frame 205, and a controller 211 for controlling the operations of those components.

The controller 211, which makes a synthetic control for the wire bonding apparatus 201, is constituted, for example, by a microcomputer system provided with a microprocessor and a memory, which system permits bonding operations in accordance with operating conditions set by the operator.

The bonding stage 210 is constituted by a heat block 212 which is movable vertically. The heat block 12 is constituted by a thermoconductive material such as, for example, a stainless steel alloy and is mounted removably with respect to the body of the bonding stage 210.

In the interior of the heat block 212 is provided a heat source (not shown) such as, for example, a cartridge heater to heat the lead frame 205 on the upper surface of the stage 210 to a predetermined temperature.

In this embodiment, as shown in FIG. 44, the lead frame 205 fed onto the bonding stage 210 has the inner leads 206 as inner-end electrodes extending in four planar directions without contact with and around a tab 216 which is supported substantially centrally by tab suspending leads 215. The inner leads 206 are contacted with one another through a frame at their outer peripheral portions in the same figure.

The lead frame 205 shown in FIG. 44 is in a completed state of wire bonding, but in its fed state onto the upper surface of the stage 210 the semiconductor chip 203 has just been mounted onto the tab 216.

The lead frame 205 is obtained by pressing or etching a plate member about 0.15 mm thick such as, for example, a Kovar, 42 alloy or nickel alloy plate and then processing it into the illustrated shape.

Part of the front end surface of each inner lead 206 (inner end electrode) is constituted by a concave-convex surface 206A as shown in FIG. 45. The concave-convex surface 206A can be formed by first processing the lead frame 205 into the shape shown in FIG. 44 and then pressing the front end surface of the inner lead 206 using a concave-convex punch. Although in the same figure cuts are made patternwise on part of the front end surface of the inner lead 206, this front end surface may be formed as a rough surface by increasing the density of such concaves and convexes. The concave-convex surface 206A ensures the destruction and removal of a coating 217A of a coated wire 217 as will be described later in detail.

The following description is now provided about the semiconductor chip 203 mounted on the tab 216.

The semiconductor chip 203, as shown in FIG. 46, is fixed onto the tab 216 through a bonding material 218 such as silver paste, silicon paste, or gold foil applied onto the tab in a thickness of about 30 μm.

The semiconductor chip 203 is obtained by slicing an ingot of silicon (Si) obtained by such a technique as a single crystal pull-up method, in the crystalline direction to obtain a wafer, then forming on the wafer surface a microprocessor or a logical circuit through oxidation and diffusion steps using a photoresist technique, and thereafter dicing the wafer in a square shape.

A schematic construction of each of the internal layers of the semiconductor chip 203 will now be explained briefly. Over a chip substrate 220 of silicon (Si) about 40 μm is formed a silicon oxide film 221 about 0.45 μm thick, over which is further formed a PSG film 222 about 0.3 μm thick as an interlayer insulating film. Then, as the top layer there is formed a passivation film 223 as a protective film in a thickness of about 1.2 μm. Part of the top layer is opened and the upper surface of an underlying, partially provided, external terminal 4 (bonding pad) of aluminum (Al) about 0.8 μm thick is exposed externally upwards.

On the other hand, as shown in FIG. 43, in the interior of the bonding head 207 on the XY stage 208 there is disposed a vertically movable block 224 so as to be movable vertically through guide shafts 225 which are disposed vertically with respect to the XY stage 208. To the side face of the vertically movable block 224 is attached a ball screw mechanism 227 which converts the rotation of a servomotor 226 fixed to the bonding head 207 into vertical linear motions. Therefore, with rotation of the servomotor 226, the vertically movable block 224 can be moved vertically by a predetermined distance.

In the vertically movable block 224 is mounted a bonding arm 230 which is rotatable in a vertical plane about a rotary shaft 228. One end of the bonding arm 230 is urged upwards in FIG. 43 by a biasing means 232 such as a spring fixed to the vertically movable block 224, whereby a counterclockwise urging force is exerted on the bonding arm 230 with operation of the vertically movable block 224. The biasing means 232 is constructed so as to prevent the external terminals 204 on the semiconductor chip 203 from being pressed more than necessary and damaged or broken when the bonding tool 233 comes into abutment with the external terminals.

An ultrasonic wave oscillator 234 is attached to the inner end of the bonding arm 230 on the side of the vertically movable block 224 to provide a predetermined ultrasonic energy to the bonding arm 230. The output energy of the ultrasonic oscillator 234 is controlled so as to be variable in accordance with a control signal provided from the controller 211. The controller 211 controls the output of the ultrasonic energy for the ultrasonic wave oscillator 234 on the basis of a program stored in a memory section.

At the front end of the bonding arm 230 to which the said ultrasonic energy is transmitted there is provided a bonding tool 233 (capillary). Into the bonding tool 233 is inserted the coated wire 217 fed from a wire spool 235 in a slightly projecting condition at the front end thereof.

An example of construction of the coated wire 217 used in this embodiment will be described below.

The coated wire 217 used in this embodiment has a sectional structure wherein a coating 217A is formed around a wire 217B, as shown in FIG. 51.

The wire 217B of the coated wire 217 is formed using gold (Au), copper (Cu) or aluminum (Al).

As the material of the coating 217A there is used a heat-resistant polyurethane resin which is prepared by the reaction of a polyol component and isocyanate and which contains in its molecular skeleton a structural unit derived from terephthalic acid. The use of such a composition of a heat-resistant polyurethane resin is very useful in preventing heat deterioration of the coating 217 and improving the bondability and peeling strength in bonding.

As a concrete characteristic condition required of the coating 217A it is important to use a material for the coating satisfying the condition that the degradation rate should be not larger than 20% at a reduced number of times of destruction of the coating 217A after 100 hours in an environment of 150°–175° C. through a temperature cycle test or an abrasion test under such experimental conditions as shown in FIG. 52.

Further, it is necessary that there should occur no inconvenience in bondability when the wire bonding operation is actually performed using the coated wire 217. According to the results of studies on this respect made by the present inventors, it is desirable to use a material for the coating 217A which material exhibits non-carbonizability when the coating is heat-removed at the time of forming a metallic ball 217C as will be described later.

This is for the following reason; when the coating 217A is removed by heating at the time of forming a metallic ball 217, the coating melts up above the metallic ball 217C. At this time, if the coating 217A is carbonizable, it will be carbonized without being decomposed at a high heating temperature, e.g. 1,060° C. or so. As a result, the carbonized coating 217A will adhere to and remain on the surface of the wire 217B in such a manner that it wraps the wire 217B therein just above the metallic ball 217C. So this, as an adhered foreign matter, causes clogging in the bonding tool 233, and in the worst case, causes curling and breaking of wire.

When the above facts are together taken into account, it is necessary for the coating 217A of the coated wire 217 to satisfy at least the following two conditions.

Firstly, the degradation rate should be not larger than 20% at a reduced number of times of destruction of the coating 217A after 100 hours at 150°–175° C. through a temperature cycle test or an abrasion test under such experimental conditions as shown in FIG. 52.

Secondly, the coating 217A should be formed using a material which exhibits non-carbonizability when the coating is removed by heating at the time of forming the metallic ball 217C.

The heat-resistant polyurethane as the material of the coating 217A which satisfies the above conditions will now be described more concretely. It is prepared using a polymer component containing as a main constituent a terephthalic acid-based polyol which contains active hydrogen, and an isocyanate. It is to be understood that the expression "containing as a main constituent" includes the case where the whole is constituted by the main constituent alone.

The above terephthalic acid-based polyol which contains active hydrogen can be obtained by a conventional esterification reaction of terephthalic acid and a polyhydric alcohol at a reaction temperature of 70° to 250° C. and at an OH/COOH ratio in the range of 1.2 to 30. Generally, it has an average molecular weight in the range of 30 to 10,000, contains 100 to 500 hydroxyl groups and has hydroxyl groups at both ends of its molecular chain.

As examples of constituent materials of such terephthalic acid-based polyol are mentioned aliphatic glycols such as ethylene glycol, diethylene glycol, propylene glycol, dipropylene glycol, hexane glycol, butaneglycol, glycerin, trimethylolpropane, hexane triol, and pentaerythritol. Such a polyhydric alcohol as 1,4-dimethylolbenzene is also employable. Particularly, ethylene glycol, propylene glycol and glycerin are preferred.

As a dicarboxylic acid there is used terephthalic acid, but if necessary, amic acid or imic acid may be used together with terephthalic acid.

There also may be used in combination therewith and to an extent not causing deterioration of heat resistance a dibasic acid such as isophthalic acid, orthophthalic acid, succinic acid, adipic acid or sebacic acid, or a polybasic acid such as 1,2,3,4-butanetetracarboxylic acid, cyclopentanetetracarboxylic acid, ethylenetetracarboxylic acid, pyromellitic acid or trimellitic acid.

As examples of the isocyanate to be reacted with the above terephthalic acid-based polyol there are mentioned those obtained by blocking the isocyanate groups of polyvalent isocyanates each having at least two isocyanate groups in one molecule such as toluylene diisocyanate and xylylene diisocyanate, with compounds having active hydrogen such as, for example, phenols, caprolactam and methyl ethyl ketone oxime. Such isocyanates are stabilized. Also employable are those obtained by reacting the above polyvalent isocyanate compounds with polyhydric alcohols such as trimethylolpropane, hexanetriol and butanediol and blocking the reaction products with compounds having active oxygen.

As examples of the above isocyanate compounds three are mentioned millionate MS-50, collonate 2501, 2503, 2505, collonate AP-St and desmodule CT-St, manufactured by Nippon Polyurethane Industry Co., Ltd. As the above polyvalent isocyanates it is suitable to use those ranging in molecular weight from 300 to 10,000.

According to the present invention, a coating composition is prepared using the above materials and it is then applied to the wire 217B as the coated wire body in a thickness of several μm to obtain the coated wire 217 having an insulating coating around the wire 217B.

Such coating composition can be prepared by adding, for one equivalent of hydroxyl groups of the polyol component, 0.4 to 4.0 equivalents preferably 0.9 to 2.0 equivalents, of isocyanate groups of the stabilized isocyanate, a required amount of a hardening accelerating catalyst and an appropriate amount of an organic solvent (e.g. a phenol, a glycol ether, or naphtha) usually to adjust the solids content to a value in the range of 10 to 30 wt. %. Where required, there may be added appropriate amounts of such additives as an appearance improver and a dye.

The reason why 0.4 to 4.0 equivalents of isocyanate groups of the stabilized isocyanate are added for one hydroxyl group equivalent of the polyol component in the present invention is that if the amount of the isocyanate groups added is less than 0.4 equivalent, the crazing characteristic of the resulting insulated wire will be deteriorated, while an amount thereof exceeding 4.0 equivalents will result in deteriorated abrasion resistance of the coating. The amount of a hardening accelerating catalyst added in preparing the coating composition is preferably 0.1 to 10 parts by weight based on 100 parts by weight of the polyol component. If the amount thereof is less than 0.1 part by weight, there will not be attained a satisfactory hardening accelerating effect and the coating forming ability will be deteriorated, while an amount of the said catalyst used exceeding 10 parts by weight will lead to deterioration in the heat deterioration characteristic of the resulting heat-resistant urethane bonding wire.

As examples of the above hardening accelerating catalyst, mention may be made of metal carboxylic acids, amino acids and phenols. More concrete examples include zinc, iron, copper, manganese, cobalt and tin salts of naphthenic, octenoic and versatic acids, as well as 1,8-diazabicyclo(5,4,0)undecene-7,2,3,6-tris(-dimethylaminomethyl)phenol.

After application of the thus-prepared coating composition onto the surface of the wire 217B as the coated wire body, the thus-coated wire is subjected to baking by means of a conventional baking device.

Conditions for the application and baking of the coating composition differ, depending on the proportions of the polyol component, the stabilized isocyanate, a polymerization initiator and the hardening accelerating catalyst used, but usually involve a temperature in the range of 200° to 300° C. and a period of time in the range of 4 to 100 seconds. In short, the baking is conducted at a temperature and for a period of time sufficient to substantially complete the hardening reaction of the coating composition to obtain the coated wire 217 in this embodiment.

The thickness of the coating 217A somewhat differs, depending on the ultrasonic energy and thermocompression bonding force of the bonding tool 233, but preferably it is in the range of 0.2 to 3 μm. Where the coating thickness is smaller, the insulation reliability of the coating 217A will be poor, while a larger coating thickness will result in the coating 217A being difficult to be removed at the time of bonding.

According to the results of a study made by the present inventors, other than the heat-resistant polyurethane of the foregoing composition, commercially available polyurethanes or formal are unsatisfactory in point of their characteristics as the coating 217A because their degradation rates exceed 20% at a reduced number of times of destruction of the coating 217A after 100 hours at 150°–175° C., although they satisfy the requirement that they should be non carbonizable.

Also, polyimides, polyamides, nylons, polyesters, polyamide-imide resins and polyester imides were found to be unsatisfactory in point of their characteristics for use as the coating 217A of the coated wire 217 because they exhibit carbonizability at the time of forming the metallic ball 217C or when the coating 217A is removed by heating.

In the wire bonding apparatus 201 of this embodiment., as shown in FIG. 47, the coated wire 217, an example of whose construction is as shown above, is fed from the wire spool 235 around which it is wound, to the bonding tool 233 through an air back tensioner 236, a sprocket 237 and a clamper 238.

The wire spool 235 is obtained, for example, by treating the surface of a cylindrical aluminum metal with anodized aluminum. This treatment with anodized aluminum is performed for improving the mechanical strength and preventing flawing. Provided, however, in order to prevent the coated wire 217 wound thereon from being electrically charged, the wire spool surface may be treated, for example, plated with chromium (Cr) and thereby rendered electroconductive. Further, the wire spool 235 itself ma be constituted by a stainless steel alloy.

The wire spool 235 is supported by spool holders 235A, and a rotary shaft 235B of the spool holder 235A is fixed to the bonding apparatus body 201A. The spool holders 235A are formed using a stainless steel alloy connected to ground, for example, in order that the spool holder may be electroconductive at least partially. Therefore, in the coated wire 217 wound round the spool holder 235A, static electricity charged on the coating 217A is discharged through the above stainless steel alloy portion. Further, although a detailed illustration is omitted, at the winding start end of the coated wire 217 wound round the spool, the coating 217A is removed to expose the wire 217B, which exposed wire is bonded to the wire spool 235. As shown in FIG. 47, the wire 217B of the coated wire 217 wound round the spool is connected to a reference potential GND through the wire spool 235, spool holder 235A, rotary shaft 235B and wire bonding apparatus body 201A. In this embodiment, the reference potential GND is at the same level as the reference potential GND of an arc generation device 240. By such connection of the wire 217B of the coated wire 217 to the reference potential GND, the potential difference between an electric torch 241 and the wire 217B of the coated wire 217 can be held at a predetermined value, thus ensuring stable arc generation, during the formation of a metallic ball 217C as will be described later, so the metallic ball 217C can surely be formed.

The air back tensioner has a pair of guide plates 236A which permit the coated wire 217 to pass therebetween, as shown in FIGS. 48 and 49. The guide plates 236A are each obtained by treating the surface of an aluminum alloy plate with anodized aluminum and plating the thus-treated surface with chromium. But it may be constituted using a stainless steel alloy. The structure of the guide plates 236A is not specially limited if only it can prevent the coated wire 217 from being electrically charged at least during contact with the coated wire. As shown in FIG. 49, a plurality of protuberances 236B are formed on the surface of each guide plate 236A on the side of a wire passage $\alpha$. The protuberances 236B are provided for minimizing the contact area between the coated wire 217 passing through the wire passage u and the guide plates 236A. In the presence of the protuberances 236B the coated wire 217 passing through the wire passage u comes into substantially dot-contact with the guide plates 236A to prevent the coating 217A from being electrically charged by contact friction. Therefore, the surfaces of the protuberances 236B are required to have electroconductivity, so are plated with chromium (Cr) for example, or the protuberances 236B themselves are formed by a stainless steel alloy for example. Such protuberances 236B may be obtained by projecting the inner peripheral surface of the guide plates 236A at predetermined positions using a processing technique such as pressing, or by fixing rod-like members which constitute the protuberances 236B to flatwise-formed inner peripheral surfaces of the guide plates 236A using such means as bonding or adhesion.

A metallic adapter 243 connected to a fluid feed pipe 242 is attached to one end of the guide plates 236A, with a fluid blow-off port 244 being formed in an end face of the adapter 243. And flat spacers 245 are projecting from the circumference of the fluid blow-off port 244 in the longitudinal direction of the guide plates. The width of the wire passage $\alpha$ is determined by the thickness of the spacers 245. The width of the wire passage $\alpha$ thus determined is, for example, 1 mm or so although it differs, depending on the diameter of the coated wire 217 used or the height of the protuberances 236B.

The fluid feed pipe 242 connected to the adapter 243 is connected at the other end thereof to a fluid source. The fluid source contains, for example, a corona discharge means whereby ionized gas as deelectrifying fluid Gs is fed to the wire passage $\alpha$ from the fluid blow-off port 244 of the adapter 243.

According to this embodiment, therefore, not only the application of back tension to the coated wire 217, which is the primary object of the air back tensioner, can be effected but also the use of the deelectrifying fluid Gs permits the removal of static electricity charged on the coated wire 217. Further, in the presence of the protuberances 236B on the inner peripheral surfaces of the guide plates 236A the coated wire 217 and the guide plates 236A (air back tensioner 236) come into substantially dot-contact with each other, so the coated wire is prevented from being electrically charged when passing through the air back tensioner 236.

The coated wire 217 which has been fed from the wire spool 235 and passed through the air back tensioner 236 is inserted into the bonding tool 233 through the guide 237 and the clamper 238. The guide 237 is for positioning the coated wire 217 accurately with respect to the bonding tool 233 and it is fixed to the bonding apparatus body 201A. The clamper 238 is for holding and releasing the coated wire inserted into the bonding tool 233 and it grips the coated wire 217 sideways through an opening or closing movement of a pair of clamper chips 238A.

In this embodiment, the sprocket 237 and the clamper 238 which come into contact with the coated wire 217 are constituted by an electroconductive metal, whereby the coating 217A of the coated wire is prevented from being electrically charged and static electricity once charged on the coating 217A is removed. Where it is impossible to use an electroconductive metal by reason that abrasion resistance must be ensured such as the clamper 238, it is possible to prevent the coated wire 217 from being electrically charged and remove static electricity by forming the same blow off port for the deelectrifying fluid Gs as that explained in connection with the air back tensioner 236 and blowing the deelectrifying fluid to the coated wire 217.

At the time of forming the metallic ball 217C, the bonding tool 233 positioned below the clamper 238 is enclosed with a cover 247 as shown in FIG. 47. The cover 247 is rotatable in the direction of arrow A in the same figure, whereby the bonding tool 233 is inserted from a tool insertion opening 248 and then covered. The cover 247 is provided for the following reasons. Firstly, the semiconductor chip 203 or the inner leads 206 are to be prevented from being stained with scattered fragments of the coating 217A which is melted up at the time of forming the metallic ball 217C. Secondly, in the case where the wire 217B is formed of an oxidative material such as Cu or Al, it is intended to maintain an anti-oxidizing gas atmosphere (sealing gas atmosphere) easily. For example, the cover 247 can be constituted by a heat-resistant stainless steel alloy. Further, the cover 247 may be formed using a transparent glass material having heat resistance so that the worker can check the state of formation of the metallic ball 217 in the interior.

In the bottom portion of the cover 247 is disposed an electric torch 241 (arc electrode) as shown in FIG. 47. The electric torch 241 is disposed in a position close to the front end of the wire 217B of the coated wire 217 drawn out from the front end of the bonding tool 233 (see FIG. 50) to generate arc Ac therebetween to thereby form the metallic ball 217C. The electric torch 241 can be formed using, for example, tungsten (W) which resists high temperatures.

The interior of the electric torch 241 is hollow and in communication with a suction pipe 251 connected to a suction device 250 as shown in FIG. 50 to suck and remove coating fragments scattered by a cooling fluid CGs ejected from a later-described fluid blowing nozzle 252. The coating fragments thus sucked through the electric torch 241 and the suction pipe 251 are then sucked to the suction device 250 disposed outside and thereafter discharged to the exterior.

The electric torch 241 is electrically connected to the arc generation device 240 through the suction pipe 251. The suction pipe 251 is constituted by an electroconductive metal such as, for example, a stainless steel alloy, to which is fixed the electric torch 241 through a bonding metal layer such as, for example, Ag-Cu solder material. Further, the suction pipe 251 fixes the cover 247 through a holder member 253. Thus, the electric torch 241 and the cover 247 are movable integrally through the suction pipe 251.

The means for moving the suction pipe 251 comprises a support member 254 which supports the suction pipe 251 fixedly, a crank shaft 255 for rotating the support member 254 in the direction of arrow A in FIG. 47 and a drive source 256, e.g. solenoid, for rotating the crank shaft 255. The rotation of the crank shaft 255 is attained by the movement of a shaft 257 which is connected to the crank shaft 255 and movable in the direction of arrow B in the same figure. The crank shaft 255 is supported rotatably with respect to the bonding apparatus body 201A.

For the cover 247 of the above rotatable structure there is mounted the fluid blowing nozzle 252 so as to extend from the exterior toward the interior of the cover. FIG. 50 shows a cooling fluid CGs feed mechanism for the fluid blowing nozzle 252, which feed mechanism can feed the cooling fluid CGs to the base portion of the coated wire 217 projecting from the wire bonding tool 233.

The cooling fluid CGs ejected from the fluid blowing nozzle 252, as shown in the same figure, functions to scatter and remove the coating 217 melted up by the arc Ac generated between the coated wire 217 and the electric torch 241 at the time of forming the metallic ball 217 at the front end of the coated wire, and also functions to cool and harden the thus melted-up coating 217A at a predetermined certain amount, thereby preventing clogging in the bonding tool 233. From such a standpoint, in order to suppress the melting-up of the coating 217A, the fluid blowing nozzle 252 is disposed in a position in which it faces the coated wire 217 obliquely from above, and the cooling fluid CGs is blown from the rear end side (above) of the coated wire 217 to the front end (below) thereof.

It is desirable that the fluid blowing nozzle 252 be fixed to the cover 247 as in this embodiment and not fixed to the bonding tool 233. If it is fixed to the bonding tool 233, the ultrasonic vibration load will be increased because of increase in weight of the bonding tool 233, thus leading to deteriorated bondability.

As the cooling fluid CGs there may be used, for example, nitrogen gas, hydrogen gas, helium, argon, or clean air. As shown in FIG. 50, the cooling fluid CGs is fed from a fluid blowing device 258 (fluid source) to the fluid blowing nozzle 252 through a cooling device 260, a flow meter 261 and a fluid feed pipe 262. In this connection, a corona discharge means may be provided in the fluid blowing device 258 for the supply of ionized gas (deelectrifying fluid Gs) as the cooling fluid CGs. In this case, it is possible to deelectrify the coated wire 217 in the position just before the wire bonding operation, so it is possible to prevent electrostatic breakdown of the semiconductor chip 203 caused by electrification of the coating 217A. According to the results of a study made by the present inventors, it turned out that the coating 217A could be deelectrified even by the blowing of nitrogen gas, other than the above ionized gas.

The cooling device 260 is constituted so as to cool the cooling fluid CGs positively to a temperature lower than ordinary temperatures. For example, the cooling device 260 can be constituted by an electronic cooling device utilizing the Peltier effect. Though illustrated briefly in FIG. 50, the fluid feed pipe 262 disposed between the cooling device 260 and the fluid blowing nozzle 252 is coated with a heat insulating material 263 to suppress the rise in temperature of the cooling fluid CGs flowing through the fluid feed pipe 262. The fluid feed pipe 262 itself may be constituted as a double pipe structure comprising outer and inner pipes to effect cooling positively also halfway in the fluid feed pipe.

In FIG. 47, the arc generation device 240 indicated as the area enclosed with a dash-double dot line comprises a capacitor C1, a charging capacitor C2, an arc generating thyristor D of a trigger-operated type and a resistor R. A DC power source D.C for the arc generation device 240 has a negative polarity of say $-1,000$ to 3,000V.

The DC power source D.C is connected to the electric torch 241 through the thyristor D resistor R, etc. and its reference potential GND side is set at, for example, 0[V]. The reference marks V and A in the same figure represent a voltmeter and an ammeter, respectively.

The wire bonding method according to this embodiment will be described below.

When the XY stage 208 is operated with the lead frame 205 placed on the bonding stage 210, the bonding head 207 is moved a predetermined distance and the bonding tool 233 assumes a position just above the semiconductor chip 203 on the tab 216.

In this state, the drive source 256 shown in FIG. 47 operates to move the suction pipe 251 in the direction of arrow A in the same figure, so that the front end of the bonding tool 233 is covered with the cover 247.

Next, as shown in FIG. 50, a high voltage in the range of about −1,000 to −3,000[V] is applied to the arc generation device 240 to generate arc Ac between the electric torch 241 connected to the arc generation device and the front end of the wire 217B of the coated wire 217 projecting from the bonding tool 233. By the action of the arc Ac the front end of the wire 217B is melted to form a spherical metallic ball 217C. At this time, the coating 217A of the coated wire 217 melts up from the wire front end by the heat of the arc Ac, whereby the coating 217A of that portion is removed and so the surface of the wire 217B is exposed.

It is desirable that the formation of the metallic ball 217C be done in as short a time as possible. Further, the amount of the coating 217A of the coated wire 217 melted up can be reduced by forming the metallic ball 217C using a high energy (high current or voltage). Forming the metallic ball 217C in a short time using a high energy means stabilizing the state of generation of the arc Ac. In this embodiment, the arc Ac is stable enough to suppress the increase and scatter in the amount of the coating melted up because the wire 217B of the coated wire 217 is fixed and held at the ground potential GND (=0[V]) in a negative potential of about −1,000 to −3,000[V] of the electric torch 241 as noted above.

Further, during the formation of the metallic ball 217, the cooling fluid CGs is blown against the melted-up portion of the coating 217A of the coated wire 217 through the fluid blowing nozzle 252 in the bonding space surrounded with the cover 247. By this blowing of the cooling fluid CGs the melted up coating 217 is scattered and sucked to the suction device 250 through the electric torch 241 and the suction pipe 251, then discharged to the exterior.

The cooling fluid CGs from the fluid blowing nozzle 252 has been cooled to a temperature of say about −10° to 0° C. by the cooling device 260 shown in FIG. 50. In this connection, the lower the temperature of the cooling fluid CGs from the fluid blowing nozzle 252, the smaller will be the amount of the coated wire 217 melted up. More specifically, since the cooling fluid CGs cooled by the cooling device 260 can positively cool the wire 217B of the coated wire 217, the coating 217A thereof and the bonding tool 233, the coating 217A can be melted only at its portion where the arc Ac is generated, without affecting the other portion of the coating 217A, and thus it is possible to control the amount of the coating 217 to be melted up.

After formation of the metallic ball 217C in the above manner, the drive source 256 is operated again to turn the suction pipe 251, so that the cover 247 leaves the circumference of the bonding tool 233, which is thus uncovered.

In this state, the servomotor 226 on the bonding head 207 is operated a predetermined amount to move the ball screw mechanism 227 downwards; as a result, the bonding tool 233 comes into contact with the upper surface of a predetermined external terminal 204 on the semiconductor chip 203.

With this state kept intact, when the ultrasonic wave oscillator 234 is operated (application of the first ultrasonic vibration) under control by the controller 211, a predetermined ultrasonic vibration is applied to the bonding tool 233 through the bonding arm 230.

At this time, the metallic ball 217C is bonded to the external terminal 204 (first bonding) by a synergistic effect of the urging force induced by the operation of the vertically movable block 224, the above ultrasonic vibration and the heating by the heat block 212.

Next, when the ultrasonic energy of the ultrasonic wave oscillator 234 is returned to its initial value under control by the controller 211 (see FIG. 42) and the servomotor 226 is operated, the bonding tool 233 rises above the semiconductor chip 203. Further, upon operation of the XY stage 208, the bonding tool 233 moves along the path indicated by a dash-double dot line in FIG. 46 while delivering the coated wire 217 from the front end thereof and reaches a position just above a predetermined part of the inner lead 206. This "predetermined part" indicates the surface portion of the inner lead 206 formed as the concave-convex surface 206A.

During such movement of the bonding tool 233, the generation of the ultrasonic energy by the ultrasonic wave oscillator 234 may be continued.

By continuing the application of the ultrasonic energy the attraction for the coated wire 217 in the bonding tool 233 is prevented and the delivery of the coated wire from the front end of the bonding tool 233 becomes smooth, so deformations such as bending of the coated wire 217 caused by the attraction for the coated wire are prevented and loop trouble is also suppressed.

When the servomotor 226 operates in this state, the bonding tool 233 comes into contact with the concave-convex surface 206A of the inner lead 206. Next, when the ultrasonic wave oscillator 234 is operated under control by the controller 211 (application of the second ultrasonic vibration), the underside of the coated wire 217 drawn out from the front end of the bonding tool 233 comes into sliding contact with the concave-convex surface 206A and the coating 217A of this portion is destroyed and removed mechanically, so the wire 217B is exposed.

When the XY stage 208 is operated and the bonding tool 233 moved outwards (rightwards in FIG. 46) over the inner lead 206 while the application of the second ultrasonic vibration, the state of application of the ultrasonic energy from the ultrasonic wave oscillator 234 is changed over (to the third ultrasonic vibration) under control by the controller 211, and the exposed wire 217B is bonded to the surface of the inner lead 206 by a synergistic effect of the said ultrasonic vibration and the heat from a heater 264 provided in an interior portion corresponding to the inner lead 206 of the XY stage 208.

Figure 42A:
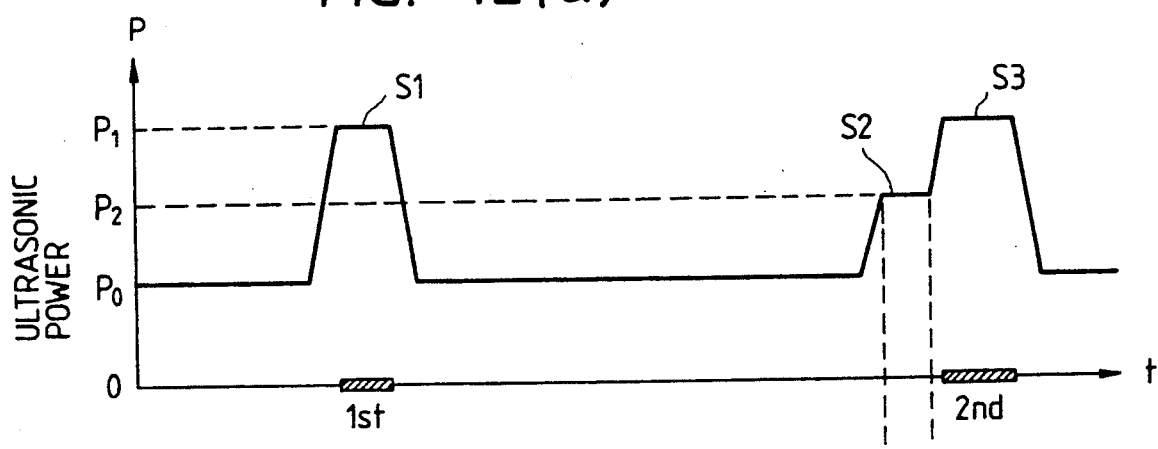
FIGS. 42(a) and 42(b) are views explanatory showing the state of application of ultrasonic energy to a bonding tool in a semiconductor device assembling process according to an embodiment-2 of the present invention.
Figure 42B:
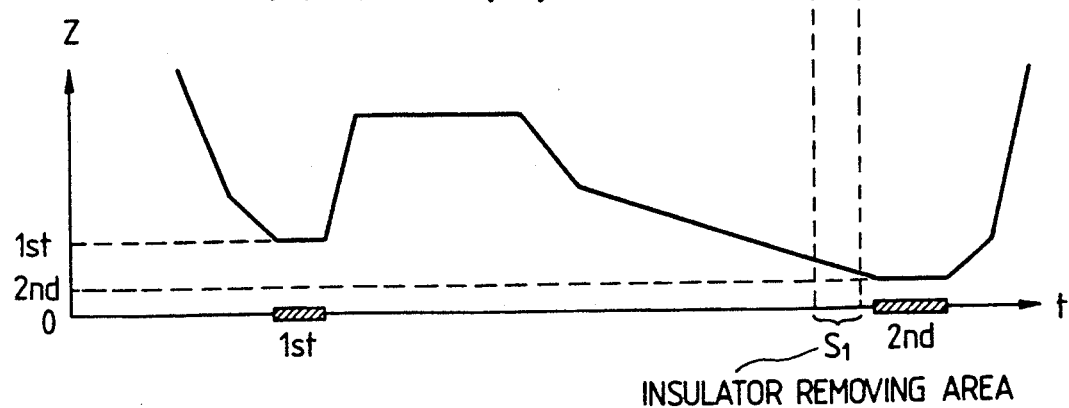

It is FIGS. 42(a) and 42(b) that show changes in ultrasonic energy caused by the first (S1), second (S2) and third (S3) ultrasonic vibrations explained above. In those figures, the first and third ultrasonic vibrations (S1, S3) are necessary for the bonding of the wire 217B with the external terminal 204 or the inner lead 206, while the second ultrasonic vibration (S2) is necessary for the destruction of the coating 217A. According to studies made by the present inventors, it turned out that the ultrasonic energy required for the destruction and removal of the coating 217A was not always of the same level as that of the ultrasonic energy required for bonding and that also as to the ultrasonic wave frequency, a lower frequency than the frequency required for bonding was more effective.

In this embodiment, therefore, as shown in those figures, efficient removal of the coating 217A and bonding of the wire 217 with the external terminal 204 and the inner lead 206 can be attained by controlling the ultrasonic wave oscillator 234 so as to output an ultrasonic energy most suitable for the purpose of the application of ultrasonic vibration. Although in FIG. 42 the ultrasonic energies in the first and third ultrasonic vibrations (S1, S3) are set equal in level, both ultrasonic energies may be changed into different levels according to temperature conditions such as heating.

Thus, in this embodiment it is possible to attain an efficient removal of the coating 217A and improvement of the bonding reliability by making control through the controller 211 to change the level of ultrasonic energy provided from the ultrasonic wave oscillator 234.

In this embodiment, moreover, on the inner lead 206 the position for removal of the coating 217A and that for bonding are different whereby the bonding part is kept clean to prevent defective bonding caused by stain of the coating 217A, etc.

Further, in removing the coating 217A, since the corresponding surface portion of the inner lead 206 is formed as the concave-convex surface 206A, the adhesion of the coating thereto can be surely prevented, whereby the bonding strength between the wire 217B and the inner lead 206 can be enhanced.

After completion of the above wire bonding process, the lead frame 205 is placed in a mold, into which is then injected molten resin such as, for example, a molten epoxy resin under a high pressure, whereby there is formed a package body 265 of the resin-sealed type semiconductor device 202 as shown in FIG. 53. At this time, in the event the bonding of the wire 217B with the inner lead 206 is done while the coating 217A remains adhered onto the surface of the inner lead because of incomplete peeling of the coating, it is possible that there will occur wire drift or breaking of the coated wire 217 under the molten resin injection pressure. But in this embodiment, since the application of ultrasonic vibration is controlled in the manner described above and the coating 217A is peeled off almost completely through destruction and removal thereof by its sliding contact with the concave-convex surface 206A of the inner lead 206, the bonding between the exposed wire 217B and the inner lead 206 is done positively to effectively prevent the aforementioned wire drift and breaking of the coated wire 217.

After hardening of the thus-injected molten resin, the lead frame 205 with the package body 265 is taken out from the mold.

Next, leads 266 (outer leads) projecting from side faces of the package body 265 are processed to obtain the resin-sealed type semiconductor device 202 shown in FIG. 53. In this semiconductor device 202 the package body 265 has a thin package structure about 1 mm in thickness.

In this embodiment, as set forth above, the destruction and removal of the coating 217A can be done positively particularly in the second bonding, so it is possible to enhance the bonding strength and the reliability of the electrode connection in the semiconductor device 202 using the coated wire 217.

As a result, for example as shown in FIG. 44, it becomes possible to effect a so-called cross bonding indicated by a or such a complicated connection as indicated by b wherein the coated wire spans a tab suspending lead 215, so it becomes easy to attain a highly integrated, high-function construction of the semiconductor device 202.

Although the embodiment 2 of the present invention has been described above concretely, it goes without saying that the invention is not limited thereto and that various modifications may be made within the scope not departing from the gist of the invention.

For example, although the bonding tool 233 illustrated is a capillary, there may be used, for example, a knife-like wedge.

Further, although in the embodiment in question the ultrasonic vibrations were applied intermittently to the bonding tool 233, the application of ultrasonic vibrations may be done continuously during the period from the first to the second bonding. In this case, under the action of the ultrasonic vibrations, the foreign matter adhered to the circumference of the coated wire 217 in the bonding tool 233 can be removed and curling of the coated wire 217 can be prevented, whereby the bonding reliability in wire bonding can be further enhanced.

The following is a brief description of effects obtained by typical inventions out of those disclosed in this embodiment.

By making ultrasonic vibrations changeable through control it is possible to select an optimum condition for the application of ultrasonic vibration such as an optimum ultrasonic energy or an optimum ultrasonic wave frequency in the removal and destruction of the coating and also in the bonding with the electrode surface, and so the removal of the coating can be ensured, whereby the bonding strength between the wire and the electrode surface is improved and the bonding reliability can be enhanced.

Moreover, by forming a concave-convex surface near the electrode, the coating destroying and removing efficiency under the application of ultrasonic vibration can be enhanced and the bonding work efficiency can be improved, further, the removal of the coating becomes further ensured and the bonding reliability can be enhanced.

Further, by forming the surface of each inner-end electrode partially as a concave-convex surface, the removal of the coating can be done positively, so the bonding strength is enhanced and it becomes substantially possible to realize a semiconductor device structure using coated wires, whereby it is possible to provide a highly integrated, high-function type semiconductor device of high reliability.

(3) Embodiment 3

In this embodiment, the details of some steps in the above embodiments or a bonding process as a modification thereof will be described below.

Figure 54:
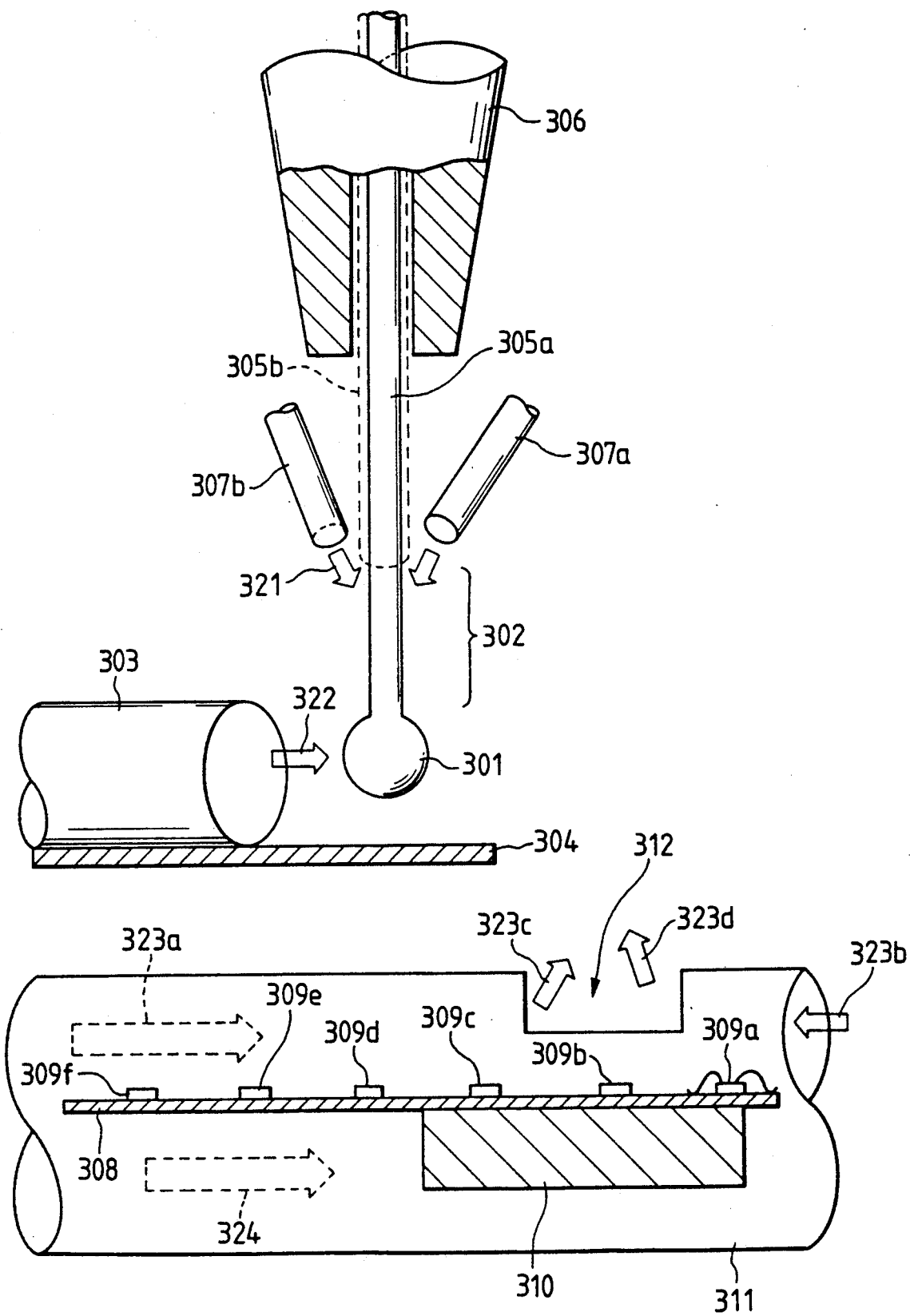
FIG. 54 is a schematic sectional view of a bonding apparatus according to an embodiment-3 of the present invention.

FIG. 54 is a schematic, partially sectional view showing principal portions of the coated wire bonding apparatus of the present invention. In the same figure, the numeral 301 denotes a ball about 70–90 $\mu$m in diameter formed by spaced arc discharge; numeral 302 denotes a coating removed portion (20–200 $\mu$m) resulting from melting-up of the resin coating due to heat in the formation of the ball; numeral 303 denotes a ball forming atmosphere supply gas nozzle; numeral 304 denotes a discharge electrode integral with the nozzle 303; numeral 305a denotes a core, i.e., a metallic core portion, of a bonding wire; numeral 305b denotes a coating of the bonding wire; numeral 306 denotes a (ball wedge type) capillary (bonding tool) for thermosonic ball bonding, permitting -pressing in the vertical direction and horizontal application thereto of ultrasonic vibrations (the horizontal direction being the extending direction of a bonding arm). Numerals 307a and 307b each denote a melt-up preventing gas nozzle; numerals 309a to 309f each denote an integrated circuit chip die-bonded onto a die pad on the lead frame (309a is in a completed state of wire bonding); numeral 310 denotes a heat block for heating leads and chips; numeral 311 denotes a tube which is open on both sides to permit the lead frame to pass therethrough; numeral 312 denotes an opening for wire bonding formed on the upper side of the tube 311; numeral 321 denotes a melt-up preventing gas stream; numeral 322 denotes a ball forming atmosphere gas for shielding the ball portion at the time of forming a ball and also in the subsequent annealing; numerals 323a to 323d each denote a lead gas atmosphere stream for -preventing oxidation of the lead frame, etc.; and numeral 324 represents a transfer direction of the lead frame.

Tables 3 and 4 (each table being at the end of the specification) show various conditions in the bonding illustrated in FIG. 54.

A concrete wire bonding process will be described below with references to FIG. 54 and Tables 3 and 4.

With the spool-side end of the wire connected to ground and the front end thereof and the discharge electrode 304 spaced from each other at a predetermined distance, a pulse voltage is applied so that the polarity of the wire side becomes positive, to generate an arc discharge between the front end of the wire and the electrode 304, resulting in that a ball 301 is formed by the heat produced and the coating at the front end portion of the wire is melted up. At this time, in order to prevent oxidation of the ball, the ball forming atmosphere gas 322 is blown sideways of the wire throughout before and after the formation of the ball. At the same time, in order to prevent the coating from being melted up to an excessive degree, the melt-up preventing, or cooling, gas 321 is fed to the wire neck portion just above the ball during the formation of the ball and until the melting-up of the coating stops.

The ball which has been cooled slowly from its discharge temperature (above 1,000° C.) down to 300°–200 Ⓡ° C. or so in the ball forming gas 322 is then used for wire bonding. Upon completion of the ball formation, the electrode 304 retracts and the capillary 306 goes down, enters the tube 311 from the opening 312 and performs a first bonding (nail head bonding to aluminum pad on the chip 309 by thermosonic bonding). Subsequently, the capillary 306 moves while delivering the wire 305 to the second bonding point of the corresponding lead. In this position, wedge bonding is performed while destroying the coating. During this operation, the interior of the tube is filled with the lead atmosphere gas. The above bonding cycle for one wire is performed during the period of about 0.1 to about 0.3 seconds. Bonding of all the wires is effected by repeating the above cycle.

(4) Embodiment 4

This embodiment shows partial structures of the preceding embodiments or the details of steps or a modification thereof.

Figure 55:
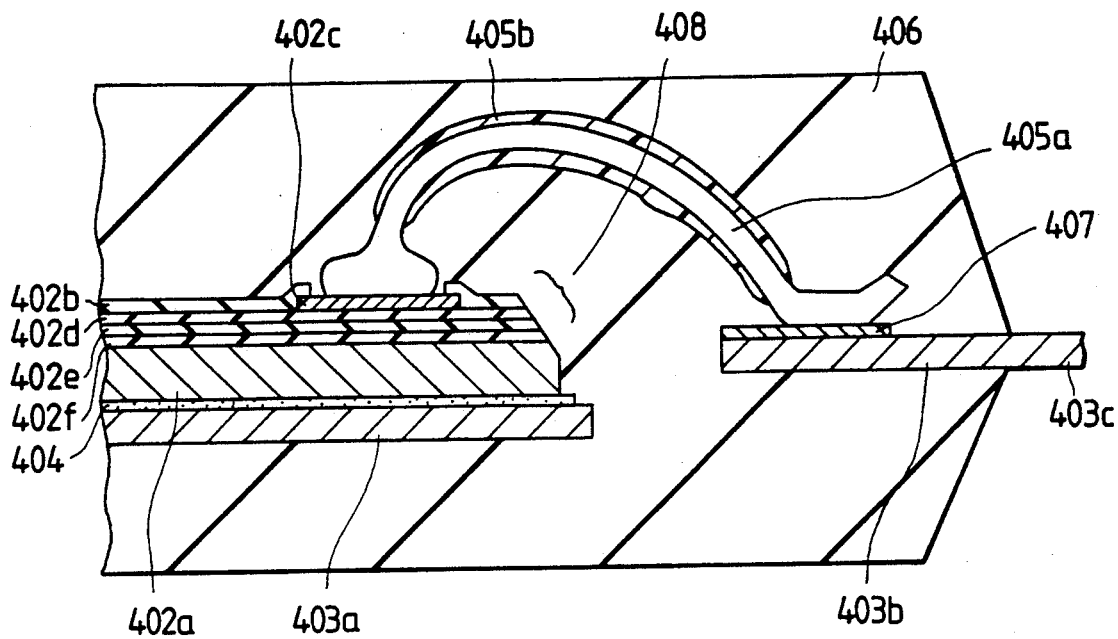
FIG. 55 is a sectional view of a resin-sealed semiconductor integrated circuit device according to an embodiment-4 of the present invention.

FIG. 55 is a partial sectional view of a face resin package according to the present invention. In the same figure, numeral 402a denotes a silicon substrate (200–400 μm thick); numeral 402b denotes a final passivation film of $SiO_2$ (1 μm thick); numeral 402c denotes an aluminum bonding pad (1 μm thick, 100 μm × 100 μm square); numerals 402d and 402e each denote an interlayer insulating film of PSG for example (0.5–1.5 μm thick); numeral 402f denotes a field $SiO_2$ film (0.3–1 μm thick) formed by LOCOS oxidation (selective oxidation by SiN); numerals 403a to 403c represent lead frames which have been patterned from a single metal sheet, of which numeral 403a denotes a die pad portion, 403b denotes an inner lead portion and 403c denotes an outer lead portion. Numeral 404 denotes an adhesive layer for die bonding, e.g. silver paste; numeral 405a denotes a bonding wire core; numeral 405b denotes a coating thereof; numeral 406 denotes a low-stress resin material such as that referred to in the previous embodiments; numeral 407 denotes a spot plating portion of the lead inner end; and numeral 408 denotes a chamfered portion of a chip end.

Table 5 (at the end of the specification) is a list of examples of components materials of these resin-sealed devices, which examples correspond to Tables 3 and 4.

(5) Embodiment 5

Figure 56A:
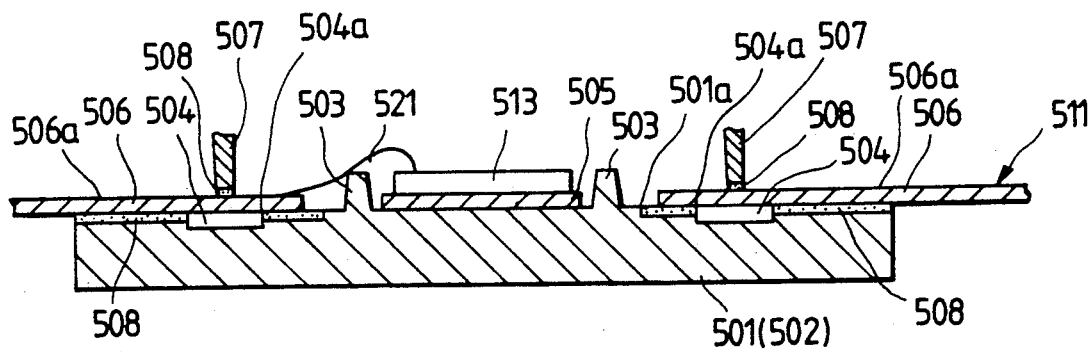
FIG. 56(a) is an explanatory view showing an arranged state of a heat block, press plates, a lead frame, etc. in a wire bonding process according to an embodiment-5 of the present invention.
Figure 56B:
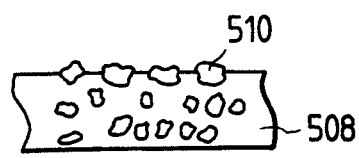
FIG. 56(b) is an enlarged explanatory view showing the state or the surface of an electrodeposited diamond layer.
Figure 58:
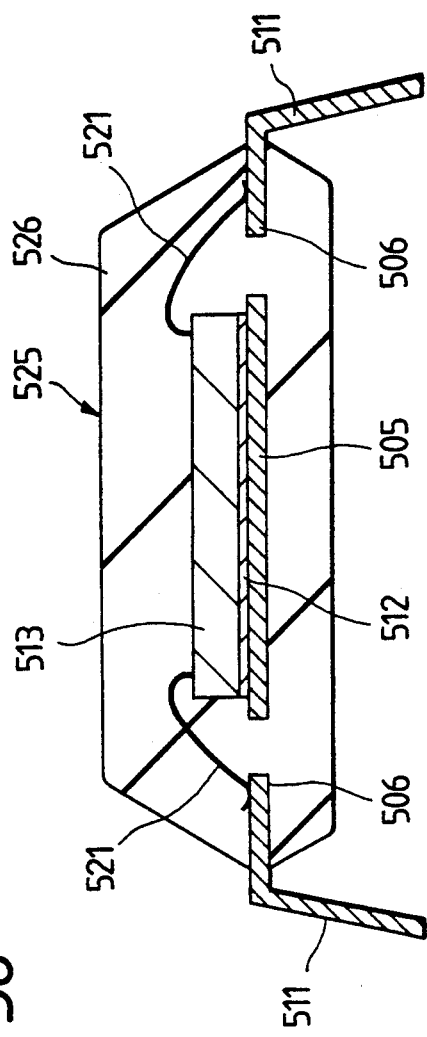
FIG. 58 is a sectional view showing a semiconductor device according to this embodiment.
Figure 59:
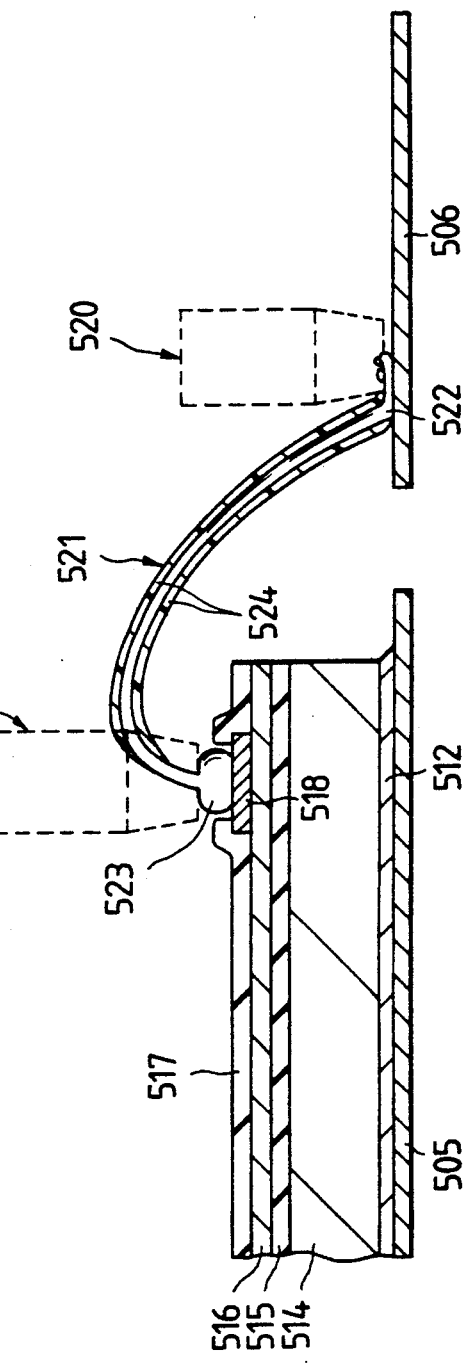
FIG. 59 is a sectional view showing a wire bonding state.

FIG. 56(a) is an explanatory view showing an arranged state of a heat block, press plates, a lead frame, etc. in a wire bonding process according to an embodiment-5 of the present invention; FIG. 56(b) is an enlarged explanatory view showing the state of the surface of an electrodeposited diamond layer; FIG. 57 is an explanatory view making comparison between this embodiment and the prior art with respect to effects; FIG. 58 is a sectional view showing a semiconductor device obtained according to this embodiment; FIG. 59 is a sectional view showing a wire bonding state; and Table 6 (at the end of the specification) is a comparison table making comparison between a semiconductor device obtained according to the prior art and that according to this embodiment with respect to the results of heat cycle tests.

A bonding stage 501 used in a wire bonding apparatus of this embodiment has such features as shown in FIG. 56(a). The upper surface of the bonding stage 501 is constituted by a heat block 502, and on the surface of the heat block 502 are formed bank portions 503 and position fixing grooves 504. The bank portions 503 is provided for fixing the position of a tab 505 and positioning a wire loop at a predetermined certain height.

The position fixing grooves 504 are each formed slightly outwards with respect to the front end of each inner lead 506, which inner lead is sandwiched between edges 504a of the groove 504 and a press plate 507 from above to thereby ensure the parallelism between an inner lead surface 506a and a bonding stage surface 501a.

On the surface of the heat block 502 and that of the press plate 507 is formed an electrodeposited diamond layer 506, which is in such a surface condition as shown in FIG. 56(b). The diamond layer 506 is formed in the following manner. First, fine diamond grains 510 which are 16 to 20 μm in diameter, preferably as acute in angle as possible, are coated with nickel (Ni) and then adsorbed onto the surface of a stainless steel substrate serving as the bonding stage 501 (heat block 502) by electrophoresis.

Then, the stainless steel substrate with the fine diamond grains 510 adhered thereto is heated to melt the nickel coating, thereby fixing the fine diamond grains 510 to the surface of the stainless steel substrate.

As to the diameter of the fine diamond grains 510, even those outside the foregoing numerical range may be adopted, but too large diameters may result in tilting of the inner lead 506 in a fixed state due to a scatter in diameter, while too small diameters may result in that the frictional coefficient becomes lower and the inner lead 506 cannot be fixed firmly.

In addition to forming the electrodeposited diamond layer 508, the surface of the bonding stage 501 (heat block 502) may be roughened, for example by flawing the said surface directly. Actually, however, such surface roughening by flawing could not afford a satisfactory fixing effect.

A lead frame 511, which is fed onto the bonding stage surface 501a, is centrally provided with a tab 505, and around the tab 505 there extend inner leads 506 from the frame without contact with the tab.

The lead frame 511 is obtained by pressing or etching a plate member about 0.15 mm thick formed of, for example, Kovar, 42 alloy or a nickel alloy.

Onto the tab 505 is fixed a semiconductor chip 513 through a bonding material about 30 μm thick such as, for example, silver paste, silicon paste or gold foil, as shown in FIG. 59.

On the upper surface of the semiconductor chip 513 is formed a microprocessor, or a logic circuit or a memory circuit through an oxidation and diffusion process using the photoresist technique. A schematic construction of each layer in the interior of the semiconductor chip 513 will now be described briefly. Silicon oxide film 515 about 0.45 μm thick is formed on a chip substrate 514 about 400 μm thick formed of silicon (Si), and on the silicon oxide film 515 is formed a PSG film 516 as an interlayer insulating film about 0.3 μm thick. Further, as the top layer there is formed a passivation film 517 about 0.3 μm thick which serves as a protective film. The passivation film 517 is partially opened, to which is exposed an underlying, partially provided, aluminum (Al) bonding pad 518 about 0.8 μm.

A wire bonding process carried out on the bonding stage 501 will be described below.

When the lead frame 511 with the semiconductor chip 513 mounted thereon is fed onto the stage surface 501a of the bonding stage 501, the bonding tool 520 is positioned so as to be just above a predetermined bonding pad 518.

Next, with a discharge torch, arc is generated between the torch and the front end of a coated wire 521 (a wire 522) projecting from a bonding tool 520, whereby the front end of the wire 522 is heat-melted to form a spherical bonding ball 523. With this heating, the resin of a coating 524 near the front end of the coated wire 521 melted gradually upwards, allowing the wire 522 portion around the bonding ball 523 to be exposed.

Then, the bonding tool 520 goes down toward the bonding pad 518 and the bonding ball 523 projecting from the bonding tool 520 comes into contact with the surface of the bonding pad 518.

Subsequently, a predetermined load is imposed on the front end of the bonding tool 520 and at the same time an ultrasonic vibration of a predetermined frequency is applied to the front end of the bonding tool 520.

By virtue of a synergistic effect of such ultrasonic oscillation power, heating and load, the bonding ball 523 is bonded to the surface of the bonding pad 518, and thus a first bonding is completed.

Subsequently, as the bonding tool 520 moves upwards and horizontally, the intermediate portion of the coated wire 521 extends in the form of a loop while being drawn out from the front end of the bonding tool 520 and reaches the position just above a predetermined inner lead 506.

Next, the front end of the bonding tool 520 with the coated wire 521 drawn out comes into contact with the inner lead 506 in a predetermined position. At this time, an ultrasonic vibration is applied again to the bonding tool 520, whereby the underside of the coated wire 521 drawn out from the front end of the bonding tool 520 is rubbed against the surface of the inner lead 506, so that the portion of the coating 524 of the coated wire 521 which is in contact with the inner lead 506 is peeled off.

After peeling of the coating 524, the application of the ultrasonic vibration is continued, whereby the core (wire 522) thus exposed is bonded to the surface of the inner lead 506. In addition to the application of the ultrasonic vibration, a heat source such as a heater may be disposed within the bonding stage 501 to heat the second bonding part. Further, the application of the ultrasonic vibration may be continued during the period after completion of the first bonding until movement of the bonding tool 520 up to the second bonding position. By thus continuing the application of the ultrasonic vibration also during the movement of the bonding tool 520 it is possible to prevent the coated wire 521 from being bent within the bonding tool 520 and so clogging can be prevented.

In this embodiment, during the application of the ultrasonic vibration in the second bonding, the inner lead 506 is fixed firmly by the electrode deposited diamond layer 508 formed on the surface of the press plate 507 and that on the surface of the retainer. Consequently, resonance of the inner lead 506 can be prevented and it is possible to peel off the coating 524 positively.

In this embodiment, moreover, since the surface of the inner lead 506 is fixed so as to be kept parallel to the surface of the bonding stage 501 by both the edges 504a of the position fixing groove 504 and the press plate 507, it is possible to prevent defective bonding caused by, for example, tilting of the inner lead 506.

When the bonding of the coated wire 521 has been completed in the above manner, the coated wire 521 is in a gripped state by means of a clamper or the like in a position above the bonding tool 520. Then, as the bonding tool 520 is moved a predetermined distance upwards in the direction of Z, the unnecessary portion of the coated wire 521 is cut from the above bonded portion and thus the second bonding is completed.

The bonding cycle described above is repeated by a predetermined number of times for all the bonding pads 51 and inner leads 506, whereby electric conduction between the semiconductor chip 513 and the inner lead 506 is realized.

After the above wire bonding process, the lead frame 511 is placed in a mold and a synthetic resin in a molten condition is injected at a high pressure into the mold to form a package body 526 of a semiconductor device 525.

Now, concrete effects attained by this embodiment will be described below on the basis of the results of experiments conducted by the present inventors.

Figure 57A:
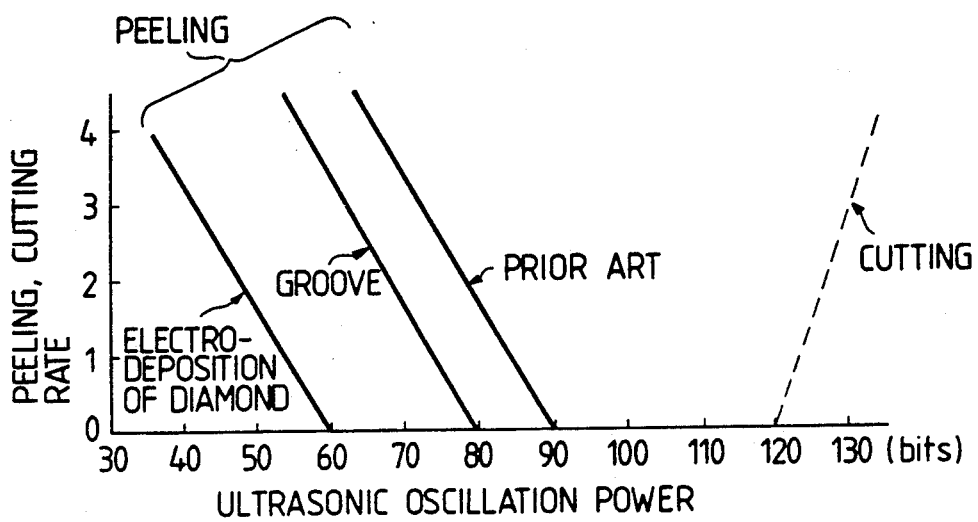
FIGS. 57(a) to 57(c) are explanatory views making comparison between this embodiment and the prior art with respect to effects.

FIG. 57(a) makes comparison between this embodiment and the prior art. Using the following three kinds of bonding stages, the present inventors checked the relation between the percentage peeling and cutting of the coated wire 521 on the second bonding side and the ultrasonic oscillation power: ① a bonding stage of a conventional structure, ② a bonding stage having the position fixing grooves 504, ③ a bonding stage 501 having the position fixing grooves 504 and the electrodeposited diamond layer 508.

Figure 57B:
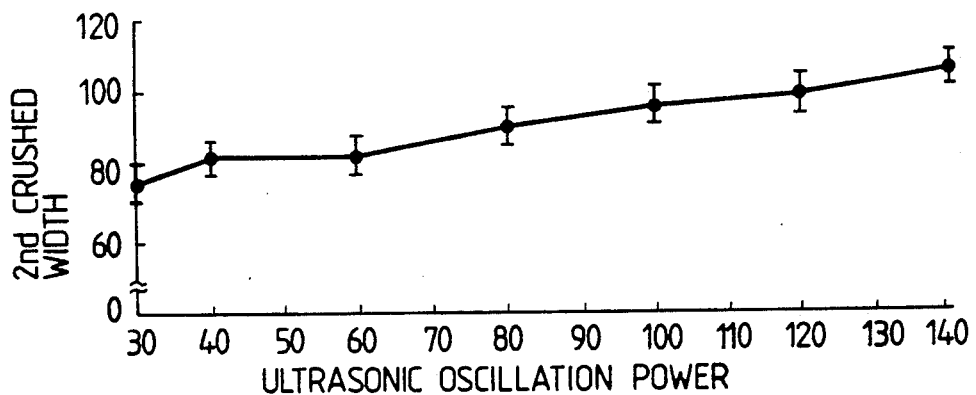
Figure 57C:
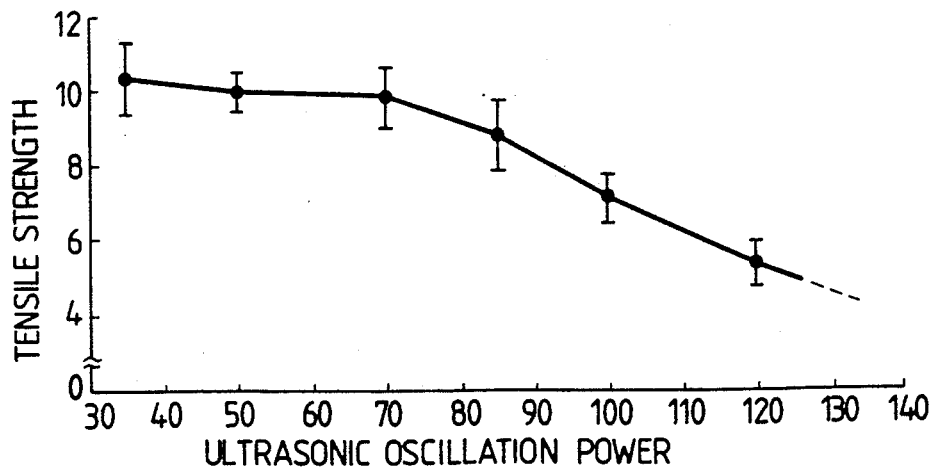

FIG. 57(b) shows the relation between the crushed width of the second bonding-side wire and the ultrasonic oscillation power, and FIG. 57(c) shows the relation between the wire pulling strength and the ultrasonic oscillation power.

As is apparent from FIG. 57(b), with increase of the ultrasonic oscillation power, the crushed width of the second bonding-side wire becomes larger and the wire thickness smaller, so the tensile strength is deteriorated as shown in FIG. 57(c). Further, cutting of the second bonding part is apt to occur at the time of wire bonding.

Therefore, it is desirable that the ultrasonic oscillation power be set as small as possible to make the crushed width of the second bonding-side wire small. But if the ultrasonic oscillation power is lowered to the extreme degree, the destroying force for the coating will be deteriorated as shown in FIG. 57(a) and the percentage peeling after bonding increases, so it is necessary to set the ultrasonic oscillation power at a limit value not causing peeling or a slightly higher value.

In this regard, according to the conventional bonding stage structure (①), the ultrasonic oscillation power does not effectively function for the removal of the coating 524 due to resonance of the inner lead 506, so it is impossible to prevent peeling unless the ultrasonic oscillation power is raised up to 90 bits. Therefore, the bondable region is narrow, which is from 90 bits to 120 bits, a value just before the occurrence of cutting. In this region, the tensile strength is low as shown in FIG. 57(c).

On the other hand, according to the structure (②) having the position fixing grooves 504 formed in the bonding stage, the fixed state of the inner lead 506 is relatively stable and the peeling limit value of the ultrasonic oscillation power can be lowered to 80 bits.

Further, according to the structure (③) of the bonding stage 501 having both the position fixing grooves 504 and the electrodeposited diamond layer 508, the fixed state of the inner lead 506 becomes still stabler, permitting the ultrasonic oscillation power to be lowered to 60 bits.

Thus, in this embodiment, first the fixed state of the inner lead 506 can be stabilized by adopting the structure (②) having the position fixing grooves 504, and then it is further stabilized by the formation of the electrodeposited diamond layer 508. As a result, the wire bondable region is expanded to 60–120 bits, whereby stable wire bonding is realized and it is possible to provide a semiconductor device of a high bonding reliability.

FIG. 58 is a sectional view showing a completed state of the semiconductor device 525 obtained by this embodiment, in which the semiconductor chip 513 and the lead frame 511 connected together by the above wire bonding process are sealed with an epoxy resin by a resin molding method. In the resin molding process, the epoxy resin is injected in a molten condition into a mold at a high pressure, so there may occur drifting or breaking of the coated wire 521. This is prevented in this embodiment because the wire bonding operation of this embodiment affords a high bonding strength as set forth above.

Besides, since the wire bonding operation is carried out using the coated wire 521, even in the event coated wires come into contact with each other, this contact is between their coatings 524 formed over the respective wires 522, thus preventing electrical short-circuit.

Table 6 shows the results of heat cycle tests for the semiconductor device 525 thus obtained and the semiconductor device according to the prior art. Testing conditions are as set out in the same table.

Reference to the same table shows that where wire bonding is performed under the bonding stage structure of the prior art not using the electrodeposited diamond layer 508, there occurs a wire breaking phenomenon on the second bonding side at 500 cycles or more. This is because according to the prior art the crushed width in the second bonding is too large so the bonding strength is gradually deteriorated with repetition of the heat cycle, finally leading to disconnection due to that stress.

On the other hand, according to the structure of the bonding stage 501 in this embodiment having the electrodeposited diamond layer 508, disconnection did not occur even when 1,000 cycles have been completed.

Although the invention accomplished by the present inventors has been described concretely on the basis of the above embodiment, it goes without saying that the present invention is not limited to the above embodiment and that various modifications may be made within the scope not departing from the gist of the invention. For example, although as the method for forming a rough surface there was adopted electrophoresis to let fine diamond particles adhere to the contact surface, there may be used hard grains in place of fine diamond grains.

Further, although electrophoresis was adopted in the above embodiment for the adhesion of fine diamond grains, an adhesive tape with fine diamond grains adhered thereto may be stuck onto the stage surface.

Although the above description refers mainly to the application of the present invention to the wire bonding technique using coated wires which is a utilization field of the invention, the present invention is not limited thereto and may also be applied, for example, to a wire bonding technique using uncoated wires. In the use of uncoated wires, it is not necessary to peel off the coating in the second bonding, but the necessity of preventing the resonance of inner leads to enhance the bonding strength is high and so the application of the present invention is very effective.

The following is a brief description of effects obtained by typical inventions out of those disclosed in this embodiment.

Since each inner lead is fixed by a roughened contact surface (e.g. the bonding stage surface), resonance of the inner lead caused by the application of ultrasonic vibration from the bonding tool is prevented and so the coating of the coated wire particularly in the second bonding can be surely removed.

Consequently, the bonding reliability in the wire bonding using coated wires can be greatly improved.

TABLE 1

| No. | P-1 | P-2 | P-3 |
|---|---|---|---|
| Terephthalic acid [(mole) g] | (2.0) 332 | (1.66) 276 | (1.54) 255 |
| *1 Imic acid | — | — | (0.08) 28.6 |
| Ethylene glycol | (2.35) 146 | (1.95) 121 | (1.90) 118 |
| Trimethylolpropane | — | (0.58) 78 | (0.57) 76 |
| Glycerin | (0.7) 64.4 | — | — |

TABLE 1-continued

| No. | P-1 | P-2 | P-3 |
|---|---|---|---|
| Total | 542.4 | 475 | 477.6 |
| OH/COOH | 1.7 | 1.7 | 1.7 |
| Theoretical reaction water (g) | 36.0 | 29.9 | 29.2 |
| Reaction temperature (°C.) | 170-240 | 170-240 | 170-240 |
| Reaction time (hr) | 6 | 6 | 7 |
| *2 OH value | 250 | 258 | 240 |
| Acid value | 4.0 | 3.2 | 4.5 |
| OH Equivalent | 224 | 217 | 234 |

*1 Structural formula of imic acid

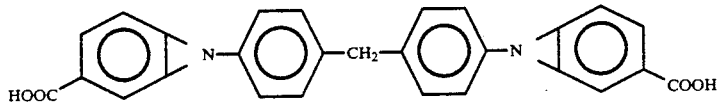

Mwt = 354
*2 OH value: According to acetylation as defined by JIS.

TABLE 2

| | Bonding wire No. | #1 | #2 | #3 | #4 | #5 | #6 | (Reference) General-purpose poly-urethane | Uncoated wire |
|---|---|---|---|---|---|---|---|---|---|
| Composition | [Blocked isocyanate resin] | | | | | | | | |
| (Solids ratio) | Millionate MS-50 [part] | 250 | 250 | 250 | | | | 250 | |
| | Desmodur CT-St | | | | 260 | 260 | 260 | | |
| | [Polyol resin] | | | | | | | | |
| | P-1 | 224 | | | 224 | | | | |
| | P-2 | | 217 | | | 217 | | | |
| | P-3 | | | 234 | | | 234 | | |
| | Nippollan 2006 *1 | | | | | | | 147 | |
| | Zinc octenoic acid (metal content portion) | 0.95 | 0.93 | 0.97 | 0.97 | 0.95 | 0.99 | 0.79 | |
| Wire | [Coating characteristics] | | | | | | | | |
| Character-istics | Coating thickness [μm] | 1.1 | 1.1 | 1.0 | 1.0 | 1.0 | 1.0 | 1.0 | — |
| | Pin hole (one side) | 2 | 1 | 1 | 2 | 3 | 2 | 2 | — |
| | Dielectric strength (V) | 1070 | 1000 | 1050 | 1060 | 1035 | 1020 | 1010 | — |
| Film Character-istics | Heat resistance (rate of residue) *2 | 80 | 85 | 93 | 97 | 101 | 105 | 15 | — |
| | Decomposition temperature (°C.) *3 | 343 | 355 | 345 | 355 | 355 | 343 | 327 | |

*1 An orthopthalic acid-based polyol, a product of Nippon Polyurethane. (trademark)
*2 1.5 g of film prepared under hardening conditions of 170° C. 2H was placed in a glass schale and subjected to weight loss on heating at 200° C. for 168 hours to determine the rate of reside.
*3 Micro-decomposition was observed using a 10× magnifier.

TABLE 3

| # | Type of Wire | Wire purity | Wire dia. | Breaking strength (wire) | Elongation percentage (wire) | Chip temperature | Lead Temperature |
|---|---|---|---|---|---|---|---|
| 1 | Au (uncoated) | 4N | 25-30 μm | 10-12 g | 3-8% | 200° C. | 160° C. |
| 2 | Cu (uncoated) | 6N | 25-30 μm | 12-16 g | 5-30% | 300° C. | 160° C. |
| 3 | Al (uncoated) | 4N | 25-30 μm | 8-10 g | 3-8% | 300° C. | 160° C. |
| 4 | Au (coated) | 4N | 25-30 μm | 10-12 g | 3-8% | 300° C. | 200° C. |
| 5 | Cu (coated) | 6N | 25-30 μm | 12-16 g | 5-30% | 300° C. | 200° C. |
| 6 | Al (coated) | 4N | 25-30 μm | 8-10 g | 3-8% | 300° C. | 200° C. |

Bonding Conditions I

[Note 1] Thermosonic bonding on the chip side, while on the lead side, wedge bonding using a capillary or the combination thereof with ultrasonic bonding.
[Note 2] 4N and 6N represent 99.99% and 99.9999% purities, respecitvely.

TABLE 4

Bonding Conditions II

| # | Ball forming atmosphere Gas | Temperature | Coating melt-up preventing gas Gas | Temperature | Lead atmosphere Gas | Temperature | Discharge form |
|---|---|---|---|---|---|---|---|
| 1 | Air | Room temperature | — | — | $N_2$ | Room temperature | Positive on wire side Spaced arc discharge |

TABLE 4-continued

| | Ball forming atmosphere | | Bonding Conditions II Coating melt-up preventing gas | | Lead atmosphere | | |
|---|---|---|---|---|---|---|---|
| # | Gas | Temperature | Gas | Temperature | Gas | Temperature | Discharge form |
| 2 | Ar + 7% H₂ | 175° C. | — | — | N₂ +7% H₂ | ↑ | ↑ |
| 3 | ↑ | Room temperature | — | — | ↑ | ↑ | ↑ |
| 4 | Air or N₂ | ↑ | Air or N₂ | Room temperature | N₂ | ↑ | ↑ |
| 5 | Ar + 7% H₂ | 175° C. | N₂ or N₂ + 7% H₂ | ↑ | N₂ +7% H₂ | ↑ | ↑ |
| 6 | ↑ | Room temperature | ↑ | ↑ | ↑ | ↑ | ↑ |

[Note 1] The same consecutive numbers (#1–6) as in Table 5 indicate using the same wires and following the same conditions.

TABLE 5

| | | Inner Lead Structure | |
|---|---|---|---|
| # | Wire | Lead matrix | Plating and other structures of 2nd bonding portion |
| 1 | Au | 42 alloy | spot silver plating |
| 2/5 | Cu | Copper or copper alloy | Platingless or pure copper spot plating |
| 3/6 | Al | 42 alloy | Al sputtered film |

[Note 1] The same consecutive numbers (+1–6) as in Table 5 indicate using the same wires and following the same conditions.

TABLE 6

| Sample | Bonding conditions | T ∞ test | 100 ∞ | 300 ∞ | 500 ∞ | 700 ∞ | 1000 ∞ |
|---|---|---|---|---|---|---|---|
| Prior art | Ultrasonic power = 95 bits | T ∞ (−55/150° C. 30′—30′) Number of samples: 300 | 0 | 0 | 3* | 5* | 20* |
| Electro-deposition of diamond | Ultrasonic power = 65 bits | T ∞ (−55/150° C. 30′—30′) Number of samples: 300 | 0 | 0 | 0 | 0 | 0 |

*Contents of defect: Neck breaking on 2nd side.

What is claimed is:

1. A method for assembling a semiconductor device, which method comprises, in making interelectrode connection using a coated wire comprising an electroconductive wire and an insulating resin coating formed around the wire:
   destroying and removing part of said coating at one end of said coated wire drawn out from the lower end of a bonding capillary to expose the wire;
   applying an ultrasonic vibration to the bonding capillary to bond one end of the wire to one bonding pad on a major surface of a semiconductor chip on which the semiconductor device is provided;
   thereafter, delivering said coated wire from the lower end of the bonding capillary, and extending the coated wire in the form of a loop;
   destroying and removing the coating on a second part of the coated wire, under the lower end of the bonding capillary, by lowering the bonding capillary while applying ultrasonic vibration therethrough and pressing the wire down to a bonding portion of a conductive lead beyond a periphery of the semiconductor chip; and
   bonding the thus-exposed wire portion to the bonding portion of the conductive lead.

2. A method for assembling a semiconductor device according to claim 1, wherein said coated wire comprises an electroconductive wire and a polyurethane resin as an insulator formed on the surface of said electroconductive wire.

3. A method for assembling a semiconductor device according to claim 1, wherein said ultrasonic vibration is continuously applied from the time when bonding the one end of the wire to one bonding pad, through extending the coated wire in the form of a loop, and including the bonding the thus-exposed wire portion to the bonding portion of the conductive lead.

4. A method for assembling a semiconductor device according to claim 1, wherein, in destroying and removing the coating on the second part of the coated wire, only a portion of the coating in contact with the bonding portion of the conductive lead is removed.

5. A method of assembling a semiconductor device, characterized in that, in making interelectrode connection using a coated wire, the surface of the coated wire is subjected to deelectrification at least once in a certain position in a path thereof from a coated wire-wound wire spool to a bonding capillary by applying an ionized gas flow to the coated wire at said certain position.

6. A method for assembling a semiconductor device according to claim 5, including wherein a portion of the coating of the coated wire is removed at one end of the coated wire, with a cooling fluid being directed at the coated wire adjacent said end so as to limit removal of the coating adjacent said end, and wherein the cooling fluid is an ionized gas deelectrifying the coated wire.

7. A method for assembling a semiconductor device, characterized in that, in making interelectrode connection in the semiconductor device, a deelectrifying fluid is blown to a coated wire fed from a wire spool to effect both the application of tension to the coated wire and deelectrification of the coated wire surface, and thereafter the coated wire is inserted into a bonding capillary, said deelectrifying fluid being an ionized gas.

8. A method for assembling a semiconductor device according to claim 7, wherein the bonding capillary includes an electroconductive portion adjacent the coated wire.

9. A method for assembling a semiconductor device according to claim 8, wherein said electroconductive portion is connected to ground.

10. A method for assembling a semiconductor device, characterized in that, in making interelectrode connection in the semiconductor device, a deelectrifying fluid is blown to a clamper chip surface of a clamper which is for holding a coated wire sideways, to effect deelectrification of the clamper, the deelectrifying fluid being an ionized gas.

11. A method for assembling a semiconductor device, which method comprises, in making connection between a pad on a semiconductor chip with a microprocessor or a logical circuit formed thereon and an internal electrode of a package;
   inserting a coated wire fed from a wire spool into a bonding capillary while deelectrifying the coated wire by applying an ionized gas flow thereto;
   bonding, by said bonding capillary, one end of said coated wire, at the one end of which coated wire the wire has been exposed by a coating removing means, to said pad under the application thereto of an ultrasonic vibration;
   thereafter, drawing out the coated wire from the bonding capillary and extending it in the form of a loop;
   bringing the bonding capillary into contact with said internal electrode through the wire, outside a periphery of the semiconductor chip, causing the wire, at a second part of the coated wire, to be exposed by said ultrasonic vibration, and bonding the wire to the surface of the internal electrode; and
   thereafter, sealing said coated wire with a resin over the coated wire extending area.

12. A method for assembling a semiconductor device, which method comprises, in making interelectrode connection in a semiconductor assembling process using a coated wire comprising an electroconductive wire and an insulating resin coating formed around the electroconductive wire;
   removing by heating a part of the coating at one end thereof drawn out from a lower end of a bonding capillary to exposed the wire;
   applying a first ultrasonic vibration to the bonding capillary to bond the exposed one end of the wire to a first electrode on a major surface of a semiconductor chip on which the semiconductor device is provided;
   then, delivering the coated wire from the lower end of said bonding capillary and extending the coated wire in the form of a loop;
   thereafter, destroying and removing a part of the coating at a second part of the coated wire, intermediate the ends of the coated wire, by the application of a second ultrasonic vibration on the surface of a second electrode beyond a periphery of the semiconductor chip, while lowering the bonding capillary to the second electrode; and
   thereafter, bonding the second part of the wire thus exposed to the second electrode by the application of a third ultrasonic vibration.

13. A method for assembling a semiconductor device according to claim 12, wherein the second ultrasonic vibration is of a lower level than that of ultrasonic energies in the first and third ultrasonic vibrations.

14. A method for assembling a semiconductor device which method comprises, in making connection between a first electrode and a second electrode of the semiconductor device using a coated wire;
   forming a concave-convex surface near the first or the second electrode;
   destroying and removing a part of the coating of the coated wire by the application thereto of an ultrasonic vibration on said concave-convex surface, so as to form an exposed part of the wire;
   moving the exposed part of the wire to the first or second electrode, where the wire is to be bonded; and
   thereafter, bonding the exposed part of the wire to the first or the second electrode.

15. A method for assembling a semiconductor device according to claim 14, wherein in said bonding ultrasonic vibration is applied, and wherein the output of ultrasonic energy in the application of the ultrasonic vibration for destroying and removing the coating of the coated wire on said concave-convex surface is at a lower level than that of the output of ultrasonic energy in the application of the ultrasonic vibration for bonding the exposed part of the wire to the first or the second electrode.

16. A method for assembling a semiconductor device, wherein, in making interelectrode connections in the semiconductor device, a coated wire used in making the interelectrode connections is subjected to deelectrification at least once, prior to being bonded to an electrode in forming the connection.

17. A method for assembling a semiconductor device according to claim 16, wherein the deelectrification is performed by blowing a deelectrification fluid against the coated wire.

18. A method for assembling a semiconductor device according to claim 17, wherein said deelectrification fluid is nitrogen gas.

19. A method for assembling a semiconductor device according to claim 17, wherein said deelectrification fluid is water.

* * * * *